United States Patent
Chiu et al.

(10) Patent No.: US 12,131,998 B2
(45) Date of Patent: Oct. 29, 2024

(54) INTEGRATED CIRCUIT, SYSTEM AND METHOD OF FORMING SAME

(71) Applicant: TAIWAN SEMICONDUCTOR MANUFACTURING COMPANY, LTD., Hsinchu (TW)

(72) Inventors: Te-Hsin Chiu, Hsinchu (TW); Kam-Tou Sio, Hsinchu (TW); Shih-Wei Peng, Hsinchu (TW); Wei-Cheng Lin, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/298,172

(22) Filed: Apr. 10, 2023

(65) Prior Publication Data
US 2023/0245970 A1 Aug. 3, 2023

Related U.S. Application Data

(62) Division of application No. 17/237,530, filed on Apr. 22, 2021, now Pat. No. 11,626,369.
(Continued)

(51) Int. Cl.
*H01L 23/528* (2006.01)
*H01L 21/8238* (2006.01)
*H01L 27/092* (2006.01)

(52) U.S. Cl.
CPC .. *H01L 23/5286* (2013.01); *H01L 21/823871* (2013.01); *H01L 27/092* (2013.01)

(58) Field of Classification Search
CPC ....... H01L 21/82; H01L 21/84; H01L 21/768; H01L 21/76897; H01L 21/76898; H01L 21/8234; H01L 21/8238; H01L 21/823475; H01L 21/823871; H01L 23/48; H01L 23/50; H01L 23/481; H01L 23/522; H01L 23/525; H01L 23/528; H01L 23/5286;
(Continued)

(56) References Cited

U.S. PATENT DOCUMENTS 7,260,442 B2 8/2007 Hwang et al.
9,256,709 B2 2/2016 Yu et al.
(Continued)

OTHER PUBLICATIONS

Office Action dated Mar. 31, 2022 from corresponding application No. TW 11120317670 (pp. 1-5).

*Primary Examiner* — Chuong A Luu
(74) *Attorney, Agent, or Firm* — Hauptman Ham, LLP

(57) ABSTRACT

A method of fabricating an integrated circuit includes fabricating a set of transistors in a front-side of a substrate, fabricating a first set of vias in a back-side of the substrate, depositing a first set of conductive structures on the back-side on a first level, depositing a second set of conductive structures on the back-side on a second level thereby forming a set of power rails, fabricating a second set of vias in the back-side, and depositing a third set of conductive structures on the back-side on a third level. The first set of vias is electrically coupled to the set of transistors. The second set of vias is electrically coupled to the first and third set of conductive structures. A first structure of the first set of conductive structures is electrically coupled to a first via of the first set of vias.

20 Claims, 23 Drawing Sheets

Related U.S. Application Data

(60) Provisional application No. 63/091,664, filed on Oct. 14, 2020.

(58) Field of Classification Search
CPC ... H01L 27/02; H01L 27/092; H01L 27/0207; H01L 27/118; H01L 27/11807; H01L 27/12; H01L 27/088; H01L 27/1203; H01L 23/485; H01L 23/5226; H01L 23/5283; H01L 21/76808
USPC .................................................. 438/199, 129
See application file for complete search history.

(56) References Cited

U.S. PATENT DOCUMENTS

| | | |
|---|---|---|
| 2013/0328069 A1 | 12/2013 | Yang et al. |
| 2014/0040838 A1 | 2/2014 | Liu et al. |
| 2015/0278429 A1 | 10/2015 | Chang |
| 2015/0325580 A1* | 11/2015 | Lee ..................... H01L 29/4975 257/319 |
| 2018/0219057 A1 | 8/2018 | Han |
| 2020/0035560 A1 | 1/2020 | Block et al. |
| 2020/0303551 A1 | 9/2020 | Chen et al. |
| 2021/0057329 A1* | 2/2021 | Marzaki ................. H01L 28/92 |
| 2021/0082815 A1 | 3/2021 | Doombos |

* cited by examiner

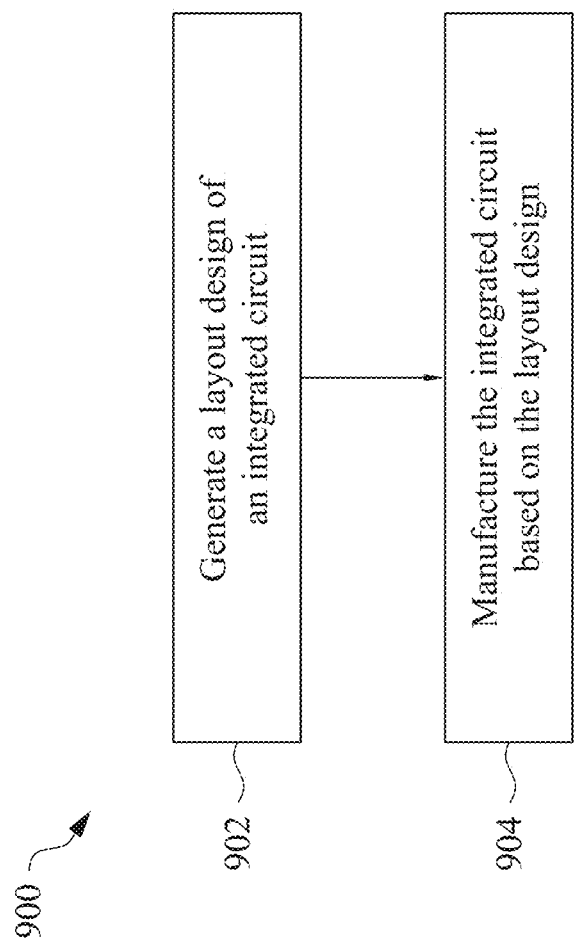

INTEGRATED CIRCUIT, SYSTEM AND METHOD OF FORMING SAME

PRIORITY CLAIM

The present application is a divisional of U.S. application Ser. No. 17/237,530, filed Apr. 22, 2021, now U.S. Pat. No. 11,626,369, issued Apr. 11, 2023, which claims the benefit of U.S. Provisional Application No. 63/091,664, filed Oct. 14, 2020, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flow chart of a method of manufacturing an IC device, in accordance with some embodiments.

DETAILED DESCRIPTION

Figure 1A:
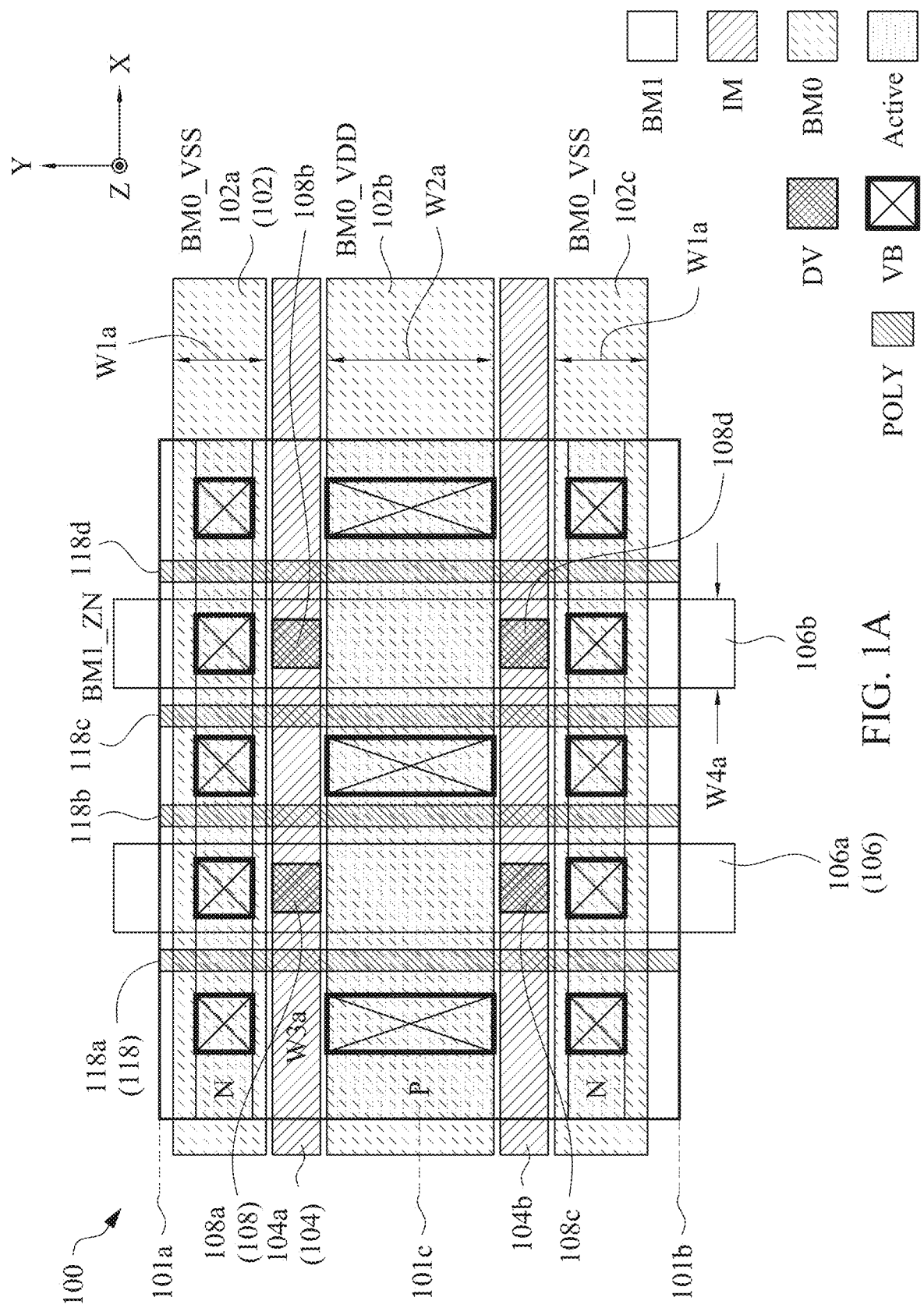
FIGS. 1A-1B are diagrams of a layout design of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes first, second, and third active regions, and first, second, and third conductive lines.

In some embodiments, the first active region, the second active region and the third active region extend in a first direction, and are on a front-side of a substrate or wafer. In some embodiments, the second active region is between the first active region and the third active region.

In some embodiments, the first conductive line and the second conductive line extend in the first direction, and are on a back-side of the substrate opposite from the front-side. In some embodiments, the first conductive line is between the first active region and the second active region. In some embodiments, the second conductive line is between the second active region and the third active region.

In some embodiments, the third conductive line extends in the second direction, and is on the back-side of the substrate. In some embodiments, the third conductive line is above the first conductive line and the second conductive line. In some embodiments, the third conductive line overlaps the first conductive line and the second conductive line.

In some embodiments, the third conductive line electrically couples the first active region to the third active region. In some embodiments, by electrically coupling the first active region and the third active region by the third conductive line, the integrated circuit of the present disclosure offers more routing flexibility and more via landing spots, thus increasing routing resources compared to other approaches.

Figure 1B:
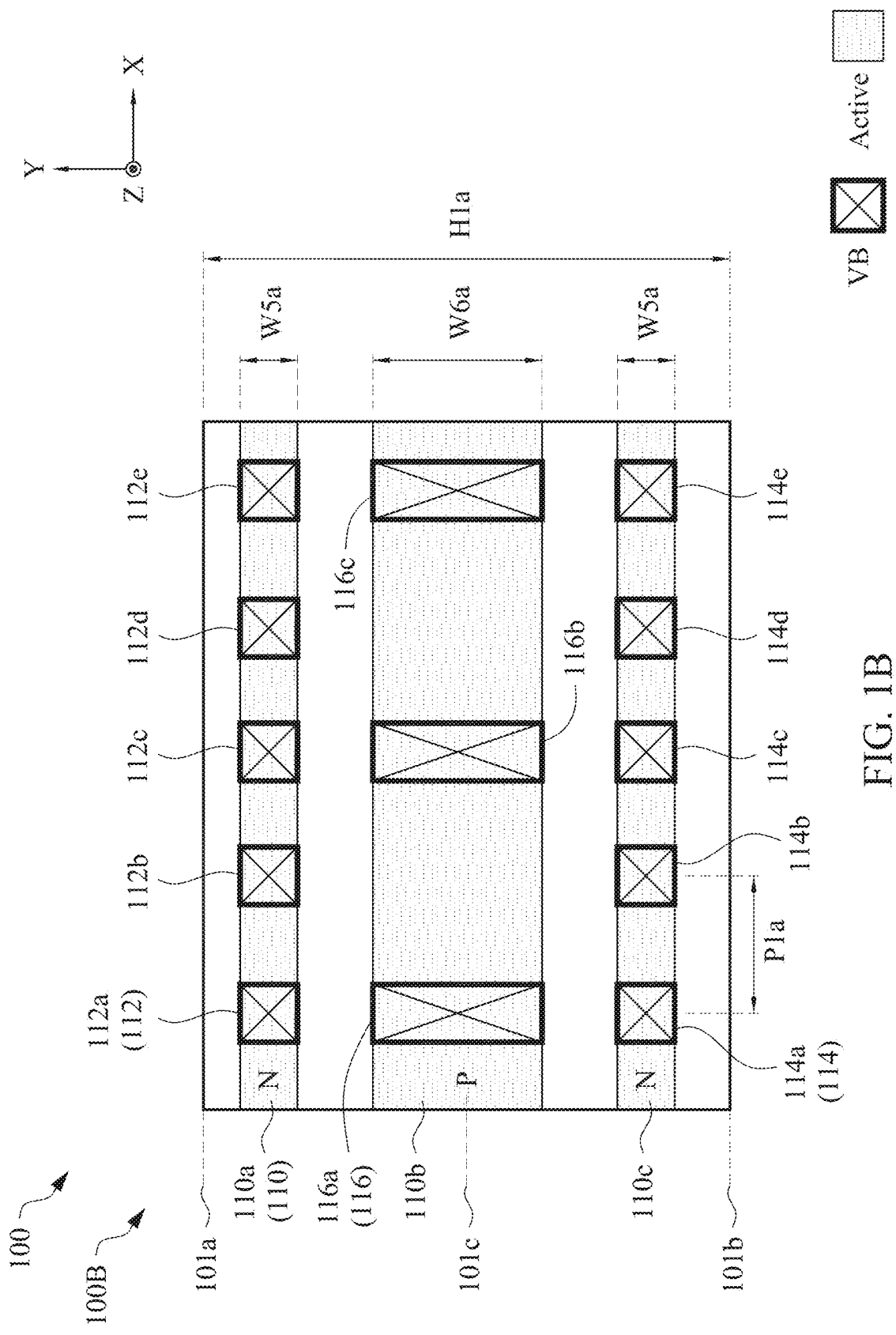

FIGS. 1A-1B are diagrams of a layout design 100 of an integrated circuit, in accordance with some embodiments. Layout design 100 is a layout diagram of integrated circuit 200 of FIGS. 2A-2C.

FIG. 1B is a diagram of a corresponding portion 100B of layout design 100 of FIG. 1A, simplified for ease of illustration. FIG. 1A is a diagram of layout design 100 and includes portion 100B, simplified for ease of illustration.

For ease of illustration, some of the labeled elements of FIGS. 1A-1B are not labelled in FIGS. 1A-1B. In some embodiments, layout design 100 includes additional elements not shown in FIGS. 1A-1B.

Portion 100B includes one or more features of layout design 100 of FIG. 1A of the oxide diffusion (OD) level, and via backside (VB) level of layout design 100.

Layout design 100 includes one or more features of the OD level, the gate (POLY) level, the inner metal (IM), the backside metal 0 (BM0), the backside metal 1 (BM1), the VB level, and the deep via level (DVO).

Figure 2A:
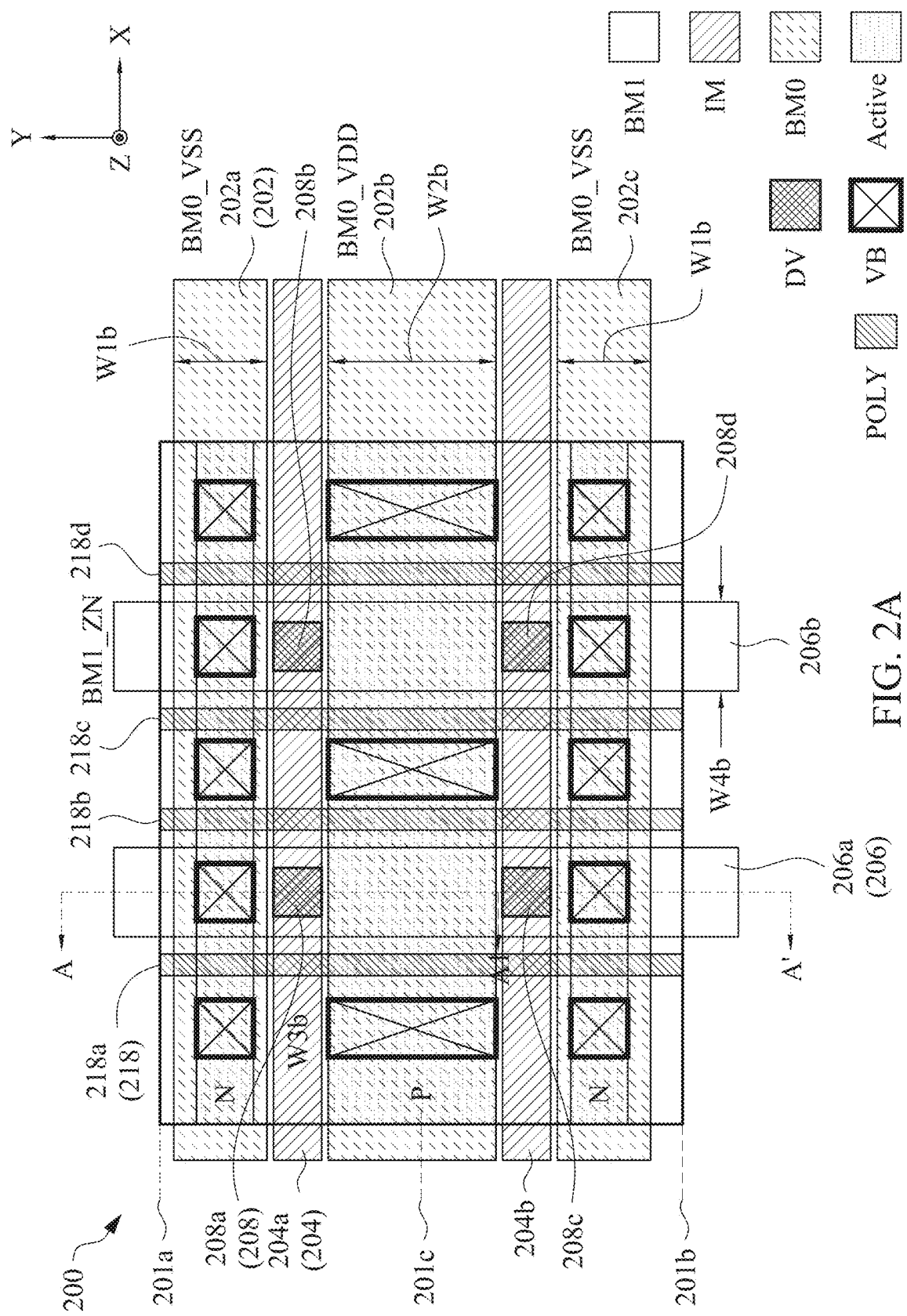
FIGS. 2A-2C are diagrams of an integrated circuit, in accordance with some embodiments.
Figure 2B:
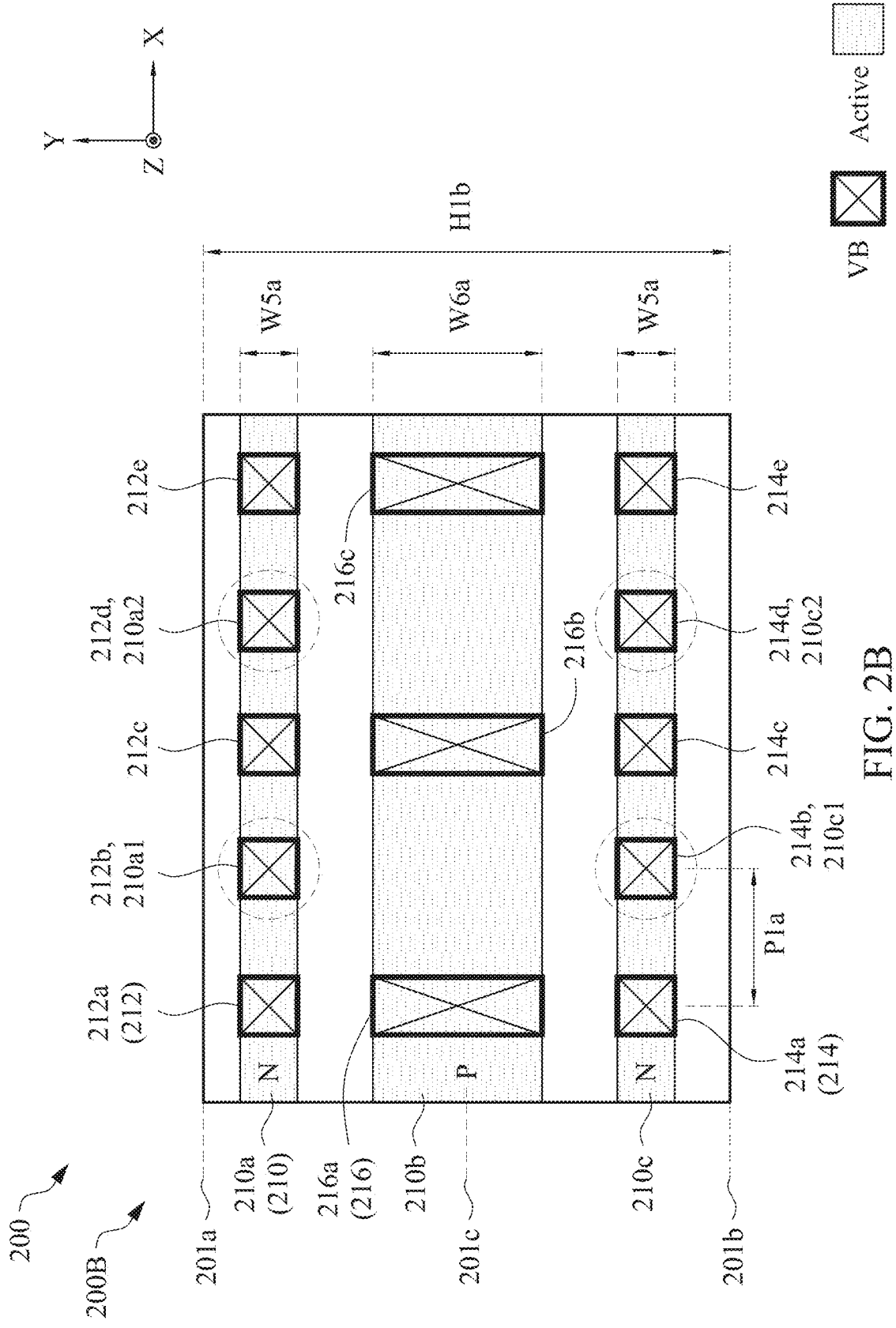
Figure 2C:
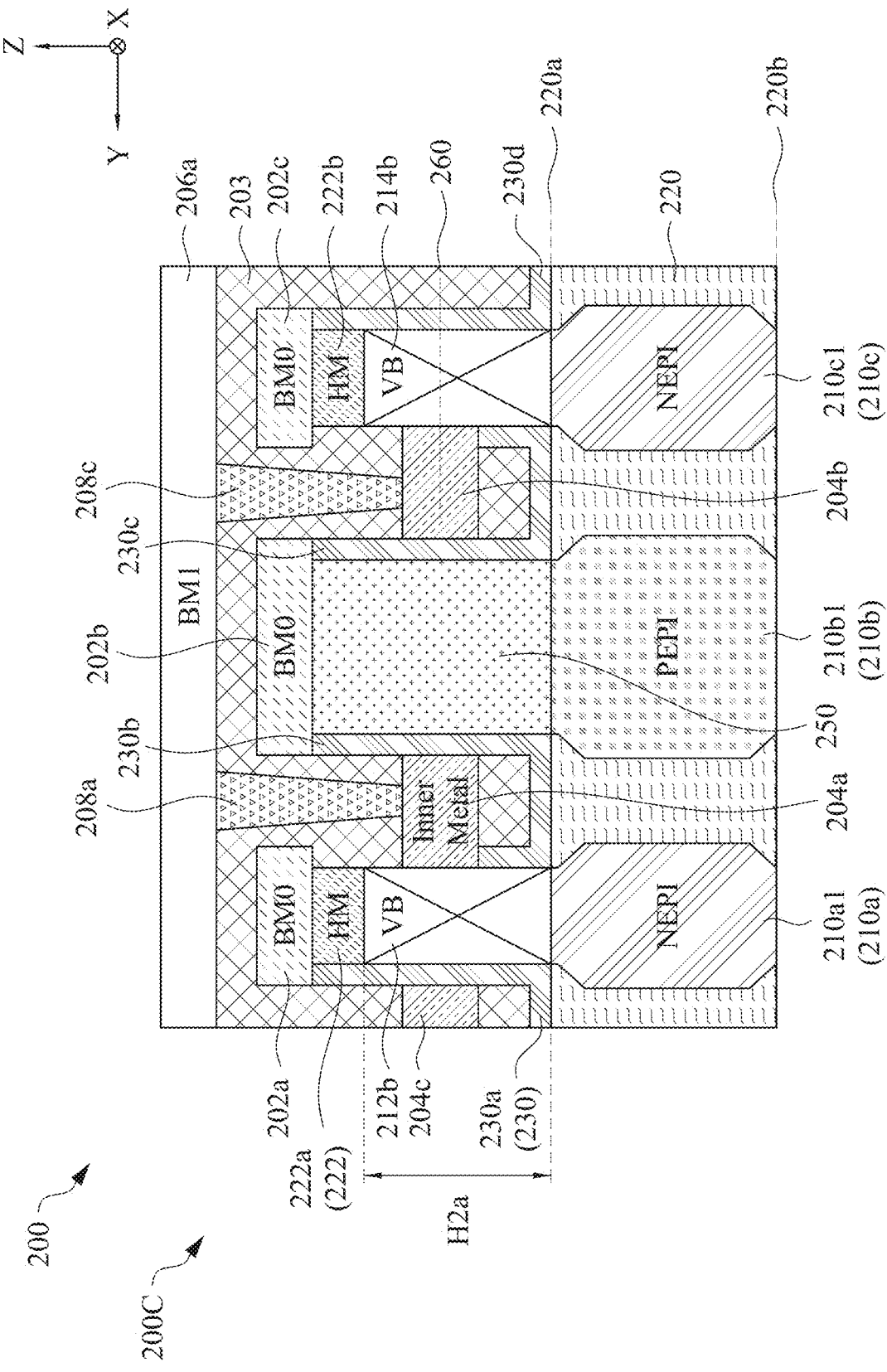

Layout design 100 is usable to manufacture integrated circuit 200 of FIGS. 2A-2C.

Layout design 100 has a cell boundary 101a, a cell boundary 101b and a mid-point 101c that extend in a first direction X. Mid-point 101c is equidistant from cell boundary 101a and a cell boundary 101b. Layout design 100 has a height H1a in a second direction Y from cell boundary 101b to cell boundary 101a. In some embodiments, the second direction Y is different from the first direction X. In some embodiments, layout design 100 abuts other cell layout designs (not shown) along cell boundaries 101a and 101b, and along cell boundaries (not labelled) that extend in the second direction Y. In some embodiments, layout design 100 is a double height standard cell. In some embodiments, mid-point 101c corresponds to another cell boundary of layout design 100, and layout design 100 corresponds to two single height standard cells.

In some embodiments, at least layout design 100, 300 (FIGS. 3A-3B) or 500 (FIGS. 5A-5B) is a standard cell layout design. In some embodiments, one or more of layout design 100, 300 (FIGS. 3A-3B) or 500 (FIGS. 5A-5B) is a layout design of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, one or more of layout design 100, 300 (FIGS. 3A-3B) or 500 (FIGS. 5A-5B) is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more of layout design 100, 300 (FIGS. 3A-3B) or 500 (FIGS. 5A-5B) includes layout designs of one or more active or passive elements. Examples of active elements include, but are not limited to, transistors and diodes. Examples of transistors include, but are not limited to, metal oxide semiconductor field effect transistors (MOS-FET), complementary metal oxide semiconductor (CMOS) transistors, bipolar junction transistors (BJT), high voltage transistors, high frequency transistors, p-channel and/or n-channel field effect transistors (PFETs/NFETs), etc.), Fin-FETs, nanosheet transistors, nanowire transistors, complementary FETs (CFETs) and planar MOS transistors with raised source/drain. Examples of passive elements include, but are not limited to, capacitors, inductors, fuses, and resistors.

Layout design 100 includes one or more power rail layout patterns 102a, 102b or 102c extending in the first direction X, and being located on a first layout level. Embodiments of the present disclosure use the term "layout patterns" which is hereinafter also referred to as "patterns" in the remainder of the present disclosure for brevity.

The one or more power rail patterns 102a, 102b or 102c are collectively referred to as a "set of power rail patterns 102." In some embodiments, the first layout level corresponds to a backside metal (BM0) level of one or more of layout designs 100, 300 or 500 (FIG. 1A-1B, 3A-3B or 5A-5B), integrated circuit 200, 400 or 600 (FIG. 2A-2C, 4A-4C or 6A-6C), or integrated circuit 800 (FIGS. 8A-8E).

The set of power rail patterns 102 is usable to manufacture a corresponding set of power rails 202 of integrated circuit 200 (FIGS. 2A-2C). In some embodiments, the set of power rails 202 are located on a back-side 220a of integrated circuit 200. In some embodiments, power rail patterns 102a, 102b, 102c of the set of power rail patterns 102 are usable to manufacture corresponding power rails 202a, 202b, 202c of the set of power rails 202 (FIGS. 2A-2C) of integrated circuit 200.

Power rail patterns 102a, 102b and 102c of the set of power rail patterns 102 are separated from each other in the second direction Y. In some embodiments, power rail patterns 102a and 102c of the set of power rail patterns 102 are located along corresponding cell boundaries 101a and 101b of layout design 100.

In some embodiments, power rail pattern 102b of the set of power rail patterns 102 overlaps mid-point 101c of layout design 100.

At least power rail pattern 102a or 102c of the set of power rail patterns 102 has a width W1a in the second direction Y. At least power rail pattern 102b of the set of power rail patterns 102 has a width W2a in the second direction Y. In some embodiments, width W2a is different from width W1a. In some embodiments, a value of width W2a is equal to 2 times a value of width W1a.

Other widths for the set of power rail patterns 102 or other numbers of power rail patterns in the set of power rail patterns 102 are within the scope of the present disclosure. In some embodiments, at least power rail pattern 102a has a width different from power rail pattern 102c.

Other configurations, arrangements on other layout levels or quantities of patterns in the set of power rail patterns 102 are within the scope of the present disclosure.

Layout design 100 further includes one or more conductive patterns 104a or 104b (collectively referred to as a "set of conductive patterns 104") extending in the first direction X, and being located on a second layout level. In some embodiments, the second layout level is different from the first layout level.

In some embodiments, the second layout level corresponds to an inner metal (IM) level of one or more of layout designs 100, 300 or 500 (FIG. 1A-1B, 3A-3B or 5A-5B), integrated circuit 200, 400 or 600 (FIG. 2A-2C, 4A-4C or 6A-6C), or integrated circuit 800 (FIGS. 8A-8E). In some embodiments, the IM level is between the BM0 level and the OD level. In some embodiments, the IM level is within the VB level. In some embodiments, the BM0 or BM1 level is above the IM level.

Conductive patterns 104a and 104b of the set of conductive patterns 104 are separated from each other in the second direction Y. The set of conductive patterns 104 is usable to manufacture a corresponding set of conductors 204 of integrated circuit 200 (FIGS. 2A-2C). In some embodiments, conductive pattern 104a or 104b is usable to manufacture corresponding conductor 204a or 204b of the set of conductors 204 (FIGS. 2A-2C) of integrated circuit 200. In some embodiments, the set of conductors 204 are located on the back-side 220a of integrated circuit 200.

In some embodiments, conductive pattern 104a is located between power rail patterns 102a and 102b. In some embodiments, conductive pattern 104b is located between power rail patterns 102b and 102c. In some embodiments, conductive pattern 104a of the set of conductive patterns 104 is equidistant in the second direction Y from cell boundary 101a and mid-point 101c. In some embodiments, conductive pattern 104b of the set of conductive patterns 104 is equidistant in the second direction Y from cell boundary 101b and mid-point 101c.

At least conductive pattern 104a or 104b of the set of conductive patterns 104 has a width W3a in the second direction Y. In some embodiments, at least width W1a or W2a is different from width W3a. In some embodiments, at least width W1a or W2a is equal to width W3a.

Other widths for the set of conductive patterns 104 or other numbers of conductive patterns in the set of conductive patterns 104 are within the scope of the present disclosure. In some embodiments, at least conductive pattern 104a has a width different from conductive pattern 104b.

Other configurations, arrangements on other layout levels or quantities of patterns in the set of conductive patterns 104 are within the scope of the present disclosure.

Layout design 100 further includes one or more conductive patterns 106a or 106b (collectively referred to as a "set of conductive patterns 106") extending in the second direction Y, and being located on a third layout level. In some embodiments, the third layout level is different from the first layout level and the second layout level.

In some embodiments, the third layout level corresponds to a backside metal 1 (BM1) level of one or more of layout designs 100, 300 or 500 (FIG. 1A-1B, 3A-3B or 5A-5B), integrated circuit 200, 400 or 600 (FIG. 2A-2C, 4A-4C or 6A-6C), or integrated circuit 800 (FIGS. 8A-8E). In some embodiments, the BM1 level is above the BM0 level, the IM level, and the OD level.

The set of conductive patterns 106 is usable to manufacture a corresponding set of conductors 206 of integrated circuit 200 (FIGS. 2A-2C). In some embodiments, conductive pattern 106a or 106b is usable to manufacture corresponding conductor 206a or 206b of the set of conductors 206 (FIGS. 2A-2C) of integrated circuit 200. In some embodiments, the set of conductors 206 are located on the back-side 220a of integrated circuit 200. The set of conductive patterns 106 overlaps the set of conductive patterns 104 and the set of power rail patterns 102. Conductive patterns 106a and 106b of the set of conductive patterns 106 are separated from each another in the first direction X.

At least conductive pattern 106a or 106b of the set of conductive patterns 106 has a width W4a in the first direction X. In some embodiments, at least width W1a, W2a or W3a is different from width W4a. In some embodiments, at least width W1a, W2a or W3a is equal to width W4a.

Other widths for the set of conductive patterns 106 or other numbers of conductive patterns in the set of conductive patterns 106 are within the scope of the present disclosure. In some embodiments, at least conductive pattern 106a has a width different from conductive pattern 106b.

Other configurations, arrangements on other layout levels or quantities of patterns in the set of conductive patterns 106 are within the scope of the present disclosure.

Layout design 100 further includes one or more via patterns 108a, 108b, 108c or 108d (collectively referred to as a "set of via patterns 108"). The set of via patterns 108 is usable to manufacture a corresponding set of vias 208 (FIGS. 2A-2C). In some embodiments, via patterns 108a, 108b, 108c, 108d of the set of via patterns 108 are usable to manufacture corresponding vias 208a, 208b, 208c, 208d of the set of vias 208 (FIGS. 2A-2C) of integrated circuit 200.

In some embodiments, the set of via patterns 108 are between the set of conductive patterns 106 and the set of conductive patterns 104. Set of via patterns 108 are positioned at a deep via (DV) level of one or more of layout designs 100, 300 or 500 (FIG. 1A-1B, 3A-3B or 5A-5B), integrated circuit 200, 400 or 600 (FIG. 2A-2C, 4A-4C or 6A-6C), or integrated circuit 800 (FIGS. 8A-8E).

In some embodiments, the DV level is between the BM1 level and the IM level. In some embodiments, the DV level is between the third layout level and the second layout level. Other layout levels are within the scope of the present disclosure.

Via pattern 108a is between conductive pattern 106a and conductive pattern 104a. Via pattern 108b is between conductive pattern 106b and conductive pattern 104a. Via pattern 108c is between conductive pattern 106a and conductive pattern 104b. Via pattern 108d is between conductive pattern 106b and conductive pattern 104b.

Via pattern 108a is located where conductive pattern 106a overlaps conductive pattern 104a. Via pattern 108b is located where conductive pattern 106b overlaps conductive pattern 104a. Via pattern 108c is located where conductive pattern 106a overlaps conductive pattern 104b. Via pattern 108d is located where conductive pattern 106b overlaps conductive pattern 104b.

Other configurations, arrangements on other layout levels or quantities of patterns in the set of via patterns 108 are within the scope of the present disclosure.

Layout design 100 further includes one or more active region patterns 110a, 110b or 110c (collectively referred to as a "set of active region patterns 110") extending in the first direction X. Active region patterns 110a, 110b of the set of active region patterns 110 are separated from one another in the second direction Y. The set of active region patterns 110 is usable to manufacture a corresponding set of active regions 210 (FIG. 2A-2C, 4A-4C or 6A-6C) of integrated circuit 200, 400 or 600 or integrated circuit 800 (FIGS. 8A-8E).

In some embodiments, the set of active regions 210 are located on the front-side 220b of integrated circuit 200, 400 or 600 (FIG. 2A-2C, 4A-4C or 6A-6C). In some embodiments, active region patterns 110a, 110b, 110c of the set of active region patterns 110 are usable to manufacture corresponding active regions 210a, 210b, 210c of the set of active regions 210 of integrated circuit 200, 400 or 600 or integrated circuit 800 (FIGS. 8A-8E).

In some embodiments, the set of active region patterns 110 is referred to as an oxide diffusion (OD) region which defines the source or drain diffusion regions of at least integrated circuit 200, 400 or 600 (FIG. 2A-2C, 4A-4C or 6A-6C) or layout design 100, 300 or 500 (FIG. 1A-1B, 3A-3B or 5A-5B) or integrated circuit 800 (FIGS. 8A-8E).

In some embodiments, active region pattern 110a or 110c of the set of active region patterns 110 is usable to manufacture source and drain regions of n-type metal oxide semiconductor (NMOS) transistors of integrated circuits 200, 400, 600 or 800, and active region pattern 110b of the set of active region patterns 110 is usable to manufacture source and drain regions of p-type metal oxide semiconductor (PMOS) transistors of integrated circuits 200, 400, 600 or 800.

In some embodiments, active region pattern 110a or 110c of the set of active region patterns 110 is usable to manufacture source and drain regions of PMOS transistors of integrated circuits 200, 400, 600 or 800, and active region pattern 110b of the set of active region patterns 110 is usable to manufacture source and drain regions of NMOS transistors of integrated circuits 200, 400, 600 or 800.

In some embodiments, the set of active region patterns 110 is located on a fourth layout level. In some embodiments, the fourth layout level is different from the first layout level, the second layout level and the third layout level.

In some embodiments, the fourth layout level is below the first layout level. In some embodiments, the fourth layout level corresponds to an active level or an OD level of one or more of layout designs 100, 300 or 500 (FIG. 1A-1B, 3A-3B or 5A-5B), integrated circuit 200, 400 or 600 (FIG. 2A-2C, 4A-4C or 6A-6C), or integrated circuit 800 (FIGS. 8A-8E).

In some embodiments, the OD level is below the BM1 level, the BM0 level and the IM level.

At least active region pattern 110a, 110b or 110c of the set of active region patterns 110 is overlapped by corresponding power rail pattern 102a, 102b or 102c of the set of power rail patterns 102.

At least active region pattern 110a or 110c of the set of active region patterns 110 has a width W5a in the second direction Y. Active region pattern 110b of the set of active region patterns 110 has a width W6a in the second direction Y. In some embodiments, width W5a is different from width W6a. In some embodiments, width W6a is equal to 2 times width W5a. In some embodiments, at least width W5a or W6a is different from at least width W1a, W2a, W3a or W4a. In some embodiments, at least width W5a or W6a is equal to at least width W1a, W2a, W3a or W4a.

In some embodiments, the widths W5a and W6a of the set of active region patterns 110 is related to the number of conducting devices (e.g., transistors) manufactured by layout design 100, 300, 500 and the corresponding speed and driving strength of the conducting devices (e.g., transistors).

In some embodiments, an increase in the width W5a of active region patterns 110a and 110c causes the number of conducting devices (e.g., transistors) manufactured by active region patterns 110a and 110c to increase, and the corresponding speed and driving strength of the conducting devices (e.g., transistors) increases. In some embodiments, a decrease in the width W5a of active region patterns 110a and 110c causes the number of conducting devices (e.g., transistors) manufactured by active region patterns 110a and 110c to decrease, and the corresponding speed and driving strength of the conducting devices (e.g., transistors) decreases.

In some embodiments, an increase in the width W6a of active region pattern 110b causes the number of conducting devices (e.g., transistors) manufactured by active region pattern 110b to increase, and the corresponding speed and driving strength of the conducting devices (e.g., transistors) increases. In some embodiments, a decrease in the width W6a of active region pattern 110b causes the number of conducting devices (e.g., transistors) manufactured by active region pattern 110b to decrease, and the corresponding speed and driving strength of the conducting devices (e.g., transistors) decreases.

In some embodiments, active region pattern 110a is usable to manufacture source and drain regions of one or more n-type finFET transistors, n-type nanosheet transistors or n-type nanowire transistors, active region pattern 110b is usable to manufacture source and drain regions of one or more p-type finFET transistors, p-type nanosheet transistors or p-type nanowire transistors, and active region pattern 110c is usable to manufacture source and drain regions of one or more n-type finFET transistors, n-type nanosheet transistors or n-type nanowire transistors.

In some embodiments, active region pattern 110a is usable to manufacture source and drain regions of one or more p-type finFET transistors, p-type nanosheet transistors or p-type nanowire transistors, active region pattern 110b is usable to manufacture source and drain regions of one or more n-type finFET transistors, p-type nanosheet transistors or p-type nanowire transistors, and active region pattern 110c is usable to manufacture source and drain regions of one or more p-type finFET transistors, n-type nanosheet transistors or n-type nanowire transistors.

In some embodiments, by active region pattern 110b having width W6a that is greater than width W5a of active region patterns 110a and 110c, at least layout design 100, 300 or 500 are useable to manufacture corresponding integrated circuit 200, 400 or 600 with higher driving strength, higher speed and higher gate density than other approaches and is useable in high performance computing (HPC) applications.

Other widths for the set of active region patterns 110 or other numbers of active region patterns in the set of active region patterns 110 are within the scope of the present disclosure. In some embodiments, at least active region pattern 110a has a width different from active region pattern 110b.

Other configurations, arrangements on other layout levels or quantities of patterns in the set of active region patterns 110 are within the scope of the present disclosure.

Layout design 100 further includes one or more via patterns 112a, 112b, 112c, 112d or 112e (collectively referred to as a "set of via patterns 112"), one or more via patterns 114a, 114b, 114c. 114d or 114e (collectively referred to as a "set of via patterns 114") or one or more via patterns 116a, 116b or 116c (collectively referred to as a "set of via patterns 116").

The set of via patterns 112 is usable to manufacture a corresponding set of vias 212 (FIGS. 2A-2C). In some embodiments, via patterns 112a, 112b, 112c. 112d, 112e of the set of via patterns 112 are usable to manufacture corresponding vias 212a, 212b, 212c, 212d, 212e of the set of vias 212 (FIGS. 2A-2C) of integrated circuit 200.

The set of via patterns 114 is usable to manufacture a corresponding set of vias 214 (FIGS. 2A-2C). In some embodiments, via patterns 114a, 114b, 114c. 114d, 114e of the set of via patterns 114 are usable to manufacture corresponding vias 214a. 214b, 214c, 214d, 214e of the set of vias 214 (FIGS. 2A-2C) of integrated circuit 200

The set of via patterns 116 is usable to manufacture a corresponding set of vias 216 (FIGS. 2A-2C). In some embodiments, via patterns 116a, 116b, 116c of the set of via patterns 116 are usable to manufacture corresponding vias 216a, 216b, 216c of the set of vias 216 (FIGS. 2A-2C) of integrated circuit 200.

In some embodiments, the set of via patterns 112 are between the set of power rail patterns 102 and active region pattern 110a. In some embodiments, the set of via patterns 114 are between the set of power rail patterns 102 and active region pattern 110c. In some embodiments, the set of via patterns 116 are between the set of power rail patterns 102 and active region pattern 110b.

At least set of via patterns 112, set of via patterns 114 or set of via patterns 116 is positioned at a via backside (VB) level of one or more of layout designs 100, 300 or 500 (FIG. 1A-1B, 3A-3B or 5A-5B), integrated circuit 200, 400 or 600 (FIG. 2A-2C, 4A-4C or 6A-6C), or integrated circuit 800 (FIGS. 8A-8E).

In some embodiments, the VB level is between the BM0 level and the OD level. In some embodiments, the VB level is between the first layout level and the fourth layout level. Other layout levels are within the scope of the present disclosure.

At least via pattern 112a, 112b, 112c, 112d or 112e is between power rail pattern 102a and active region pattern 110a. In some embodiments, each via pattern of the set of via patterns 112 is positioned where a corresponding source or drain region of an NMOS or PMOS transistor manufactured by layout design 100 is positioned.

At least via pattern 114a, 114b, 114c, 114d or 114e is between power rail pattern 102c and active region pattern 110c. In some embodiments, each via pattern of the set of via patterns 114 is positioned where a corresponding source or drain region of an NMOS or PMOS transistor manufactured by layout design 100 is positioned.

At least via pattern 116a. 116b or 116c is between power rail pattern 102b and active region pattern 110b. In some embodiments, each via pattern of the set of via patterns 116 is positioned where a corresponding source or drain region of an NMOS or PMOS transistor manufactured by layout design 100 is positioned.

In some embodiments, at least via pattern 112b or 114b is overlapped by conductive pattern 106a. In some embodiments, at least via pattern 112d or 114d is overlapped by conductive pattern 106a. In some embodiments, at least via pattern 116a, 116b or 116c of the set of via patterns 116 is not overlapped by conductive pattern 106a or 106b of the set of conductive patterns 106.

In some embodiments, each via pattern of the set of via patterns 112 is separated from an adjacent via pattern of the set of via patterns 112 in the first direction X by a pitch Pla. In some embodiments, each via pattern of the set of via patterns 114 is separated from an adjacent via pattern of the set of via patterns 114 in the first direction X by pitch Pla. In some embodiments, each via pattern of the set of via patterns 116 is separated from an adjacent via pattern of the set of via patterns 116 in the first direction X by 2 times pitch Pla. Other pitches for pitch Pla are within the scope of the present disclosure.

Other configurations, arrangements on other layout levels or quantities of patterns in at least set of via patterns 112, 114 or 116 are within the scope of the present disclosure.

Layout design 100 further includes one or more gate patterns 118a, 118b, 118c or 118d (collectively referred to as a "set of gate patterns 118") extending in the second direction Y. Each of the gate patterns of the set of gate patterns 118 is separated from an adjacent gate pattern of the set of gate patterns 118 in the first direction X by a pitch (not shown).

The set of gate patterns 118 is usable to manufacture a corresponding set of gates 218 (FIG. 2A-2C, 4A-4C or 6A-6C) of integrated circuit 200, 400 or 600 or integrated circuit 800 (FIGS. 8A-8E).

In some embodiments, gate patterns 118a, 118b, 118c, 118d of the set of gate patterns 118 is usable to manufacture corresponding gates 218a, 218b, 218c, 218d of the set of gates 218 (FIG. 2A-2C, 4A-4C or 6A-6C) of integrated circuit 200, 400 or 600 or integrated circuit 800 (FIGS. 8A-8E).

In some embodiments, at least a portion of gate pattern 118a, 118b, 118c or 118d of the set of gate patterns 118 is usable to manufacture gates of NMOS transistors of integrated circuit 200, 400 or 600 or integrated circuit 800 (FIGS. 8a-8E), and at least a portion of gate pattern 118a, 118b, 118c or 118d of the set of gate patterns 118 is usable to manufacture gates of PMOS transistors of integrated circuit 200, 400 or 600 or integrated circuit 800 (FIGS. 8A-8E).

In some embodiments, the set of gate patterns 118 are located on the front-side 220b of integrated circuit 200, 400 or 600 (FIG. 2A-2C, 4A-4C or 6A-6C). The set of gate patterns 118 is positioned on a fifth layout level. In some embodiments, the fifth layout level is different from the first layout level, the second layout level, the third layout level and the fourth layout level. In some embodiments, the fifth layout level is below the first layout level. In some embodiments, the fifth layout level is below the fourth layout level. In some embodiments, the fifth layout level corresponds to a gate level or a POLY level of one or more of layout designs 100, 300 or 500 (FIG. 1A-1B, 3A-3B or 5A-5B), integrated circuit 200, 400 or 600 (FIG. 2A-2C, 4A-4C or 6A-6C), or integrated circuit 800 (FIGS. 8A-8E).

In some embodiments, the POLY level is below the BM1 level, the BM0 level, the IM level, and the OD level.

Other configurations, arrangements on other layout levels or quantities of patterns in the set of gate patterns 118 are within the scope of the present disclosure.

In some embodiments, the set of conductive feature patterns is an upper metal layer track located on the M0 level, metal 1 (M1) level, or the like of the front-side of layout design 100 or 300. In some embodiments, when compared with other approaches, the set of power rail patterns 102 and the set of signal line patterns 103 are moved from the front-side of layout design 100 or 300 to the back-side of layout design 100 or 300. In some embodiments, moving the set of power rail patterns 102 and the set of signal line patterns 103 from the front-side of layout design 100 or 300 to the back-side of layout design 100 or 300, results in layout design 100 or 300 using at least one less upper metal layer track in the set of conductive feature patterns, resulting in a layout design with a smaller height and smaller area compared with other approaches.

In some embodiments, since at least one upper metal layer track in the set of conductive feature patterns is reduced, the width of one or more conductive feature patterns in the set of conductive feature patterns is increased, yielding a layout design 100 or 300 with better current resistance (IR), electromigration (EM) and resistance capacitance (RC) metal performance compared with other approaches. In some embodiments, by utilizing the set of power rail patterns 102 or the set of signal line patterns 103 of the present disclosure, the gate density of the set of gate patterns 116 or 316 of layout design 100 or 300 is increased compared with other approaches. In some embodiments, by utilizing at least the set of power rail patterns 102 or the set of signal line patterns 103 of the present disclosure, layout design 100 or 300 offers more routing flexibility and increases routing resources compared to other approaches.

FIGS. 2A-2C are diagrams of an integrated circuit 200, in accordance with some embodiments.

FIG. 2A is a top view of integrated circuit 200, in accordance with some embodiments. FIG. 2B is a diagram of a corresponding portion 200B of integrated circuit 200 of FIG. 2A, simplified for case of illustration. FIG. 2A is a diagram of integrated circuit 200 and includes portion 200B, simplified for case of illustration.

FIG. 2C is a cross-sectional view of integrated circuit 200, in accordance with some embodiments. FIG. 2C is a cross-sectional view of integrated circuit 200 as intersected by plane A-A', in accordance with some embodiments. Components that are the same or similar to those in one or more of FIGS. 2A-2C and 4A-4B (shown below), 6A-6B are given the same reference numbers, and detailed description thereof is thus omitted.

Integrated circuit 200 is manufactured by layout design 100. Structural relationships including alignment, lengths and widths, as well as configurations and layers of integrated circuit 200 are similar to the structural relationships and configurations and layers of layout design 100 of FIGS. 1A-1B, and similar detailed description will not be described in at least FIGS. 2A-2C, for brevity. For example, in some embodiments, at least width W1a, W2a, W3a, W4a, W5a or W6a, pitch P1a, or height H1a of layout design 100 is similar to corresponding width W1b, W2b. W3b. W4b, W5b or W6b, pitch P1b, or height H1b of integrated circuit 200, and similar detailed description is omitted for brevity. For example, in some embodiments, at least cell boundary 101a or 101b or mid-point 101c of layout design 100 is similar to at least corresponding cell boundary 201a or 201b or mid-point 201c of integrated circuit 200, and similar detailed description is omitted for brevity.

Integrated circuit 200 includes at least the set of power rails 202, an insulating region 203, the set of conductors 204, the set of conductors 206, the set of vias 208, the set of active regions 210, the set of vias 212, the set of vias 214, the set of vias 216, the set of gates 218, a set of hard masks 222, and a conformal insulating layer 230.

The set of power rails 202 include one or more of power rails 202a, 202b or 202c. At least power rail 202a or 202c has a width W1b in the second direction Y, and power rail 202b has a width W2b in the second direction Y. In some embodiments, the set of power rails 202 corresponds to a set of conductive structures. The set of power rails 202 is embedded in insulating region 203.

In some embodiments, the set of power rails 202 is configured to provide a first supply voltage of a voltage supply VDD or a second supply voltage of a reference voltage supply VSS to the integrated circuit, such as integrated circuit 200. In some embodiments, the first supply voltage is different from the second supply voltage.

In some embodiments, at least power rail 202a or 202c is configured to provide the second supply voltage of reference voltage supply VSS to corresponding active region 210a or 210c, and power rail 202b is configured to provide the first supply voltage of voltage supply VDD to active region 210b. In some embodiments, at least power rail 202a or 202c is configured to provide the first supply voltage of voltage supply VDD to corresponding active region 210a or 210c, and power rail 202b is configured to provide the second supply voltage of reference voltage supply VSS to active region 210b. In some embodiments, the set of power rails 202 are configured to provide power to the set of active regions 210.

The set of conductors 204 includes at least conductor 204a. 204b or 204c. The set of conductors 204 has a width W3b in the second direction Y. The set of conductors 204 is embedded in insulating region 203.

The set of conductors 204 is configured to provide routing of signals from upper layers or between lower layers. For example, in some embodiments, the set of conductors 204 are configured to provide signal routing between active regions of the set of active regions 210.

In some embodiments, at least conductor 204a or 204b is configured to electrically couple a drain or source of a PMOS or NMOS transistor and a drain or source of another PMOS or NMOS transistors. In some embodiments, conductors 204a and 204b are configured to electrically couple a drain or source 210a1 of a transistor in active region 210a and a drain or source 210c1 of a transistor in active region 210c together.

In some embodiments, the set of conductors 204 is configured to electrically couple the set of active regions 210 of integrated circuit 200, resulting in additional routing resources compared to other approaches. In some embodiments, the set of conductors 204 is configured to electrically couple a set of gates (not shown) of integrated circuit 200, resulting in additional routing resources compared to other approaches. In some embodiments, the set of conductors 204 is configured to electrically couple the set of active regions 210 and the set of gates (not shown) to each other, resulting in additional routing resources compared to other approaches.

In some embodiments, the set of conductors 204 corresponds to a set of conductive structures. In some embodiments, the set of conductors 204 is located above at least a set of gates (not shown), the OD level, the M0 level and the MD level of integrated circuit 200, and below the BM1 level of integrated circuit 200.

The set of conductors 204 is between the set of active regions 210 or between the set of power rails 202.

In some embodiments, a top surface of at least conductor 204a, 204b or 204c is below a bottom surface of at least the set of power rails 202, the set of conductors 206 or a set of hard masks 222.

In some embodiments, a top surface of at least conductor 204a, 204b or 204c is below a top surface of at least the set of vias 212. In some embodiments, a bottom surface of at least conductor 204a, 204b or 204c is above a bottom surface of at least the set of vias 212.

In some embodiments, a bottom surface of at least conductor 204a, 204b or 204c is above the set of active regions 210.

In some embodiments, at least via 212b or 214b have a height H2a in a third direction Z. In some embodiments, at least via 212b or 214b and conductor 204a. 204b or 204c of the set of conductors 204 share a common central axis 260 in the second direction Y. Stated differently, at least via 212b or 214b and conductor 204a, 204b or 204c of the set of conductors 204 have a same mid-point/central region in the third direction Z. In some embodiments, a mid-point/center region of at least via 212b or 214b and conductor 204a, 204b or 204c of the set of conductors 204 is separated from the back-side 220a by a distance DI that is equal to H2a/2.

In some embodiments, the set of power rails 202, the set of conductors 204, the set of conductors 206, the set of vias 208, 212, 214 and 216 are located on the back-side 220a of a substrate 220 of integrated circuit 200.

In some embodiments, the set of active regions 210 are located on a front-side 220b of the substrate 220 of integrated circuit 200, 400 or 600. The front-side 220b of integrated circuit 200 is opposite from the back-side 220a of integrated circuit 200, 400 or 600 in the second direction Y. In some embodiments, by positioning the set of power rails 202, the set of conductors 204, the set of conductors 206, the set of vias 208, 212, 214 and 216 on the back-side 220a of integrated circuit 200, 400 or 600, results in integrated circuit 200, 400 or 600 occupying less area than other approaches.

Other configurations, arrangements on other layout levels or quantities of structures in the set of power rails 202 or set of conductors 204 are within the scope of the present disclosure.

The set of conductors 206 includes at least conductor 206a or 206b. The set of conductors 206 has a width W4b in the first direction X. In some embodiments, the set of conductors 206 is a set of output pins.

The set of conductors 206 is configured to provide routing of signals from upper layers or between lower layers. For example, in some embodiments, the set of conductors 206 is configured to provide signal routing between conductors of the set of conductors 204 thereby providing signal routing between active regions of the set of active regions 210. The set of conductors 206 is on a top surface of insulating region 203. In some embodiments, the set of conductors 206 is embedded in insulating region 203.

In some embodiments, at least conductor 206a or 206b is configured to electrically couple a drain or source of a PMOS or NMOS transistor and a drain or source of another PMOS or NMOS transistors. In some embodiments, conductors 206a and 206b are configured to electrically couple a drain or source 210a1 of a transistor in active region 210a and a drain or source 210c1 of a transistor in active region 210c together.

In some embodiments, the set of conductors 206 is configured to electrically couple conductors of the set of conductors 204 thereby coupling the set of active regions 210 of integrated circuit 200, resulting in additional routing resources compared to other approaches.

In some embodiments, the set of conductors 206 is configured to electrically couple conductors of the set of conductors 204 thereby coupling a set of gates (not shown) of integrated circuit 200, resulting in additional routing resources compared to other approaches. In some embodiments, the set of conductors 206 is configured to electrically couple conductors of the set of conductors 204 thereby coupling the set of active regions 210 and the set of gates (not shown) to each other, resulting in additional routing resources compared to other approaches.

In some embodiments, the set of conductors 206 corresponds to a set of conductive structures. In some embodiments, the set of conductors 206 is located above at least a set of gates (not shown), the OD level, the M0 level, the MD level, the BM0 level and the VB level of integrated circuit 200.

The set of vias 208 includes at least via 208a, 208b, 208c or 208d. The set of vias 208 is embedded in insulating region 203.

In some embodiments, the set of vias 208 are between the set of conductors 206 and the set of conductors 204.

Via 208a is between conductor 206a and conductor 204a, and electrically couples conductors 206a and 204a together. Via 208b is between conductor 206b and conductor 204a, and electrically couples conductors 206b and 204a together. Via 208c is between conductor 206a and conductor 204b, and electrically couples conductors 206a and 204b together. Via 208d is between conductor 206b and conductor 204b, and electrically couples conductors 206b and 204b together.

Via 208a is located where conductor 206a overlaps conductor 204a. Via 208b is located where conductor 206b overlaps conductor 204a. Via 208c is located where conductor 206a overlaps conductor 204b. Via 208d is located where conductor 206b overlaps conductor 204b.

In some embodiments, relative to a plane corresponding to the X-axis and the Y-axis, at least a via in the set of vias 208 has a square shape. In some embodiments, at least a via of the set of vias 208 has a width in the first direction X that ranges from about 10 nm to about 30 nm, and a length in the second direction Y that ranges from about 10 nm to about 30 nm. Other lengths, widths and shapes are in the scope of the present disclosure.

In some embodiments, the set of vias 208 is referred to as a set of deep vias. In some embodiments, one or more vias of the set of vias 208 is referred to as one or more corresponding deep vias of a set of deep vias. In terms of height along the Z-axis, at least via 208a, 208b, 208c or 208d is substantially taller than at least a via of the set of vias 212, 214 or 216. Accordingly, at least a via of the set of vias 212, 214 or 216 is a "shallow via structure" (referred to as a "SV") in comparison to a "deep via structure" (e.g., at least via 208a, 208b, 208c or 208d).

In some embodiments, a deep via is a via that has a height in the Z-axis significantly taller than other vias. In some embodiments, a deep via is a via that spans different levels. For example, in some embodiments, a deep via spans between the BM1 level and the IM level, and extends beyond the BM0 level.

In some embodiments, the set of vias 208 has a first aspect ratio AR1, and each of the set of vias 212, 214 and 216 are vias having a second aspect ratio AR2. In some embodiments, the aspect ratio of a structure is defined as the height (along the Z-axis) divided by the width (along the X-axis). The first aspect ratio AR1 is substantially greater than the second aspect ratio AR2. In some embodiments, a quotient Q is $Q \approx AR1/AR2$.

In some embodiments, the first aspect ratio AR1 ranges from about 3 to about 10. In some embodiments, if the first aspect ratio AR1 is less than 3, then a distance between at least a via in the set of vias 208 and at least a power rail in the set of power rails 202 is too small resulting in insufficient physical and electrical isolation between each other thereby increasing the likelihood of a short circuit. In some embodiments, if the first aspect ratio AR1 is greater than 10, a height (along the z-axis) of one or more vias in the set of vias 208 may be too large thus causing voids to form in one or more vias in the set of vias 208 thereby increasing electrical resistance and lowering manufacturing yield.

In some embodiments, the second aspect ratio AR2 ranges from about 0.75 to about 3. In some embodiments, if the second aspect ratio AR2 is less than 0.75, then a distance between at least a via in the set of vias 212, 214 and 216 and at least a power rail in the set of power rails 202 is too small resulting in insufficient physical and electrical isolation between each other thereby increasing the likelihood of a short circuit. In some embodiments, if the second aspect ratio AR2 is greater than 3, a height (along the z-axis) of one or more vias in the set of vias 210, 212 or 214 may be too large thus causing an increase in an occupied area of the IC or chip, thereby resulting in a lower production yield.

Set of vias 208 are positioned at the DV level of integrated circuit 200, 400 or 600.

Other configurations, arrangements on other levels or quantities of vias in the set of vias 208 are within the scope of the present disclosure.

The set of active regions 210 include one or more of active regions 210a, 210b or 210c in substrate 220. At least active region 210a or 210c has a width W5b in the second direction Y. and active region 210b has a width W6b in the second direction Y. In some embodiments, the widths W5b and W6b of the set of active regions 210 is related to the number of conducting devices (e.g., transistors) of integrated circuits 200, 400, 600 or 800, and the corresponding speed and driving strength of the conducting devices (e.g., transistors) of integrated circuits 200, 400, 600 or 800, and is similar to layout design 100, and similar detailed description is omitted.

In some embodiments, the set of active regions 210 corresponds to planar structures (not shown) of planar transistors. In some embodiments, the set of active regions 210 corresponds to fin structures (not shown) of finFETs. In some embodiments, the set of active regions 210 corresponds to nanosheet structures (not shown) of nanosheet transistors. In some embodiments, the set of active regions 210 corresponds to nanowire structures (not shown) of nanowire transistors. In some embodiments, the set of active regions 210 include drain regions and source regions grown by an epitaxial growth process. In some embodiments, the set of active regions 210 include drain regions and source regions that are grown with an epitaxial material at the corresponding drain regions and source regions.

In some embodiments, active region 210a or 210c of the set of active regions 210 corresponds to source and drain regions of NMOS transistors of integrated circuits 200, 400, 600 or 800, and active region 210b of the set of active regions 210 corresponds to source and drain regions of PMOS transistors of integrated circuits 200, 400, 600 or 800.

In some embodiments, active region 210a or 210c of the set of active regions 210 corresponds to source and drain regions of PMOS transistors of integrated circuits 200, 400, 600 or 800, and active region 210b of the set of active regions 210 corresponds to source and drain regions of NMOS transistors of integrated circuits 200, 400, 600 or 800.

At least active region 210a, 210b or 210c of the set of active regions 210 is overlapped by corresponding power rail 202a, 202b or 202c of the set of power rails 202.

Active region 210a includes active region 210a1. Active region 210b includes active region 210b1. Active region 210c includes active region 210c1.

In some embodiments, at least active region 210a1 or 210c1 is an N-type doped S/D region, and active region 210b1a is a P-type doped S/D region 104A embedded in a dielectric material of substrate 220. In some embodiments, at least active region 210a1 or 210c1 is a P-type doped S/D region, and active region 210b1a is an N-type doped S/D region 104A embedded in a dielectric material of substrate 220.

Other configurations, arrangements on other layout levels or quantities of structures in the set of active regions 210 are within the scope of the present disclosure.

In some embodiments, at least a portion of gate 218a, 218b, 218c or 218d of the set of gates 218 is a gate of NMOS transistors of integrated circuit 200, 400 or 600 or integrated circuit 800 (FIGS. 8A-8E), and at least a portion of gate 218a, 218b, 218c or 218d of the set of gates 218 is a gate of PMOS transistors of integrated circuit 200, 400 or 600 or integrated circuit 800 (FIGS. 8A-8E). In some embodiments, the set of gates 218 are located on the front-side 220b of integrated circuit 200, 400 or 600 (FIG. 2A-2C, 4A-4C or 6A-6C).

In some embodiments, at least one gate region of the set of gates 218 is formed using a doped or non-doped polycrystalline silicon (or polysilicon). In some embodiments, at least one gate region of the set of gates 218 includes a metal, such as Al, Cu, W, Ti, Ta, TiN, TaN, NiSi, CoSi, other suitable conductive materials, or combinations thereof.

Figure 7A:
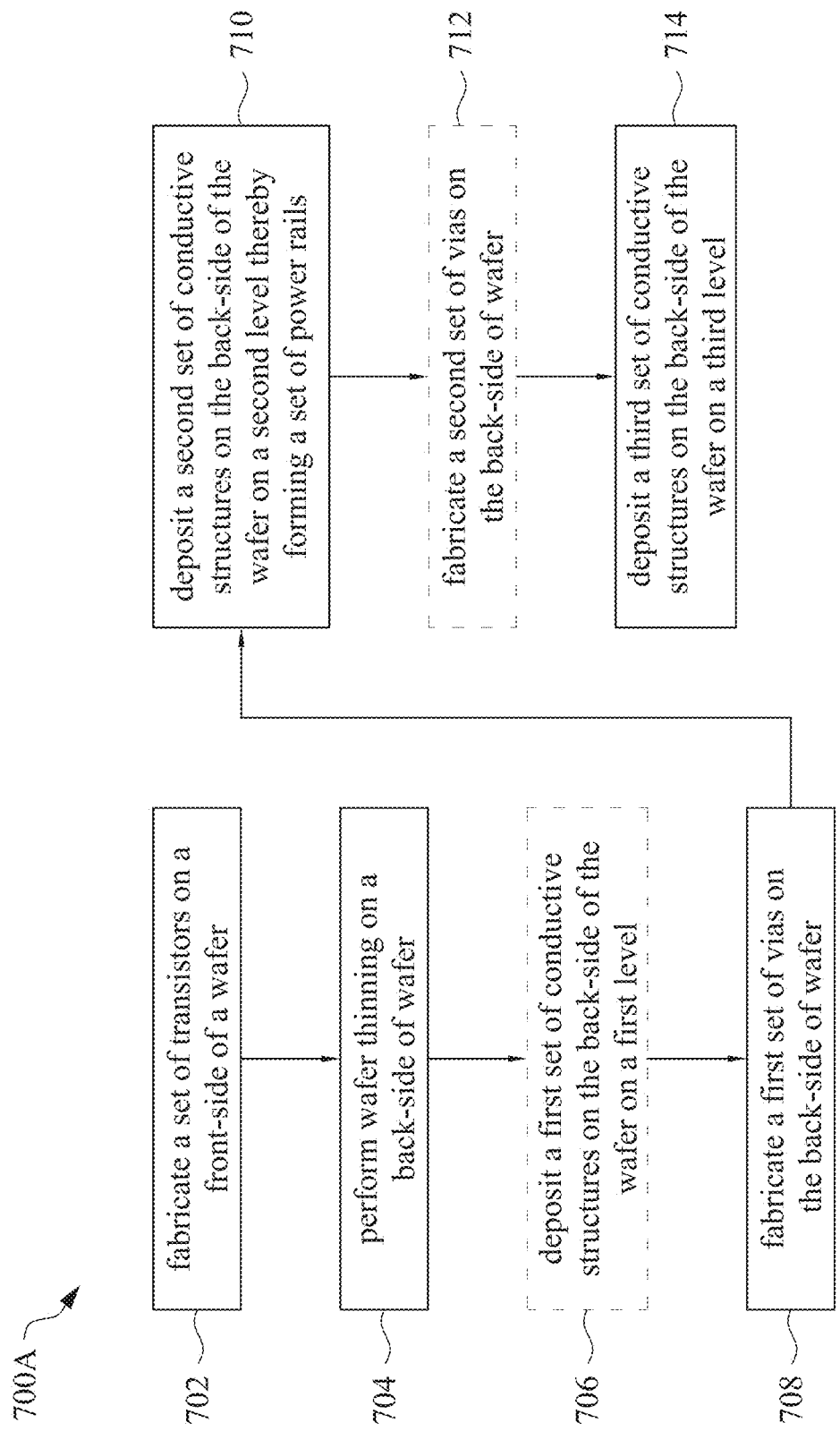
FIG. 7A is a flow chart of a method of forming or manufacturing an integrated circuit in accordance with some embodiments.
Figure 7B:
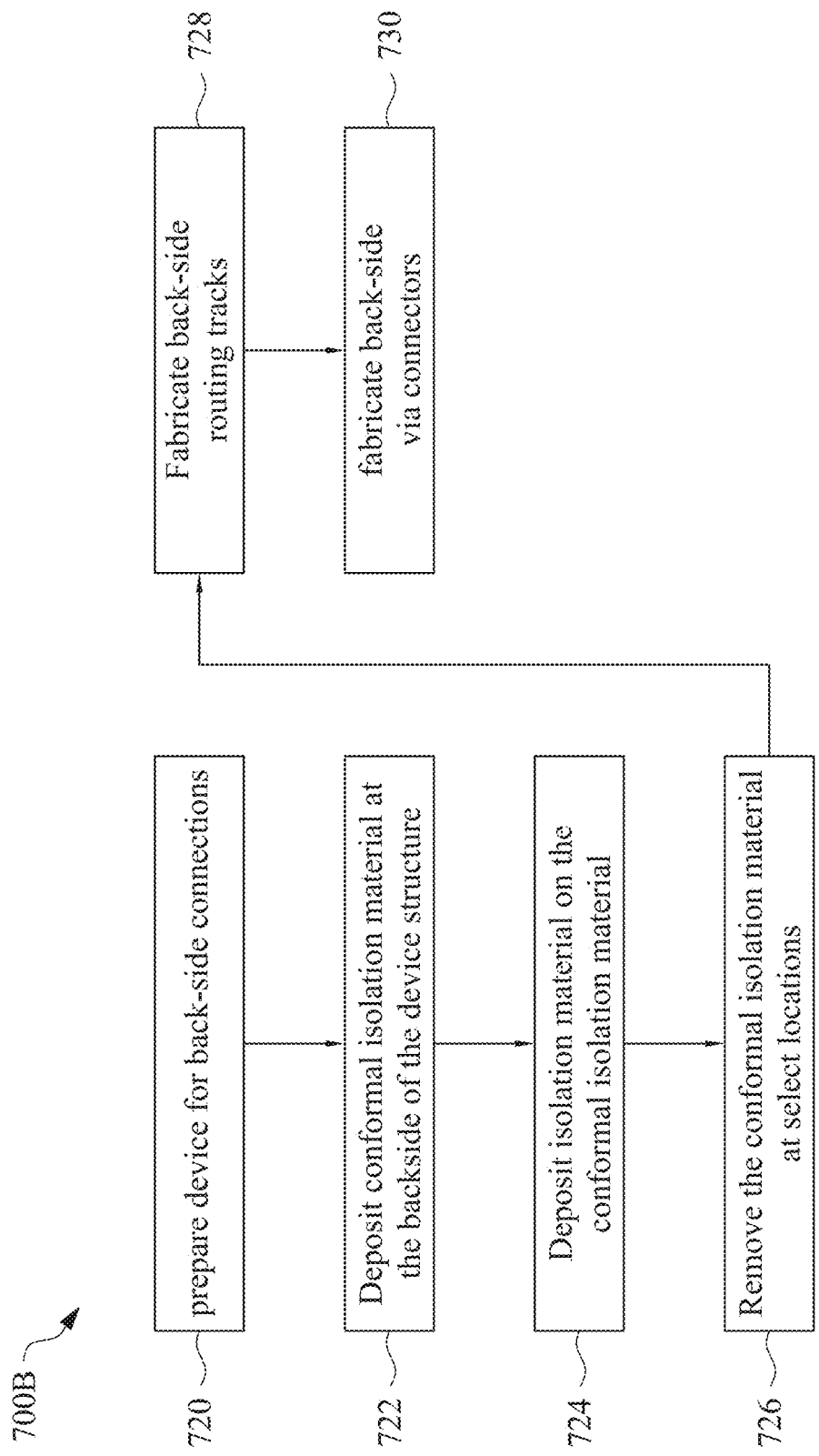
FIG. 7B is a flow chart of a method of fabricating the backside routing tracks and backside via connectors, in accordance with some embodiments.

Insulating region 203 is configured to electrically isolate one or more elements of the set of power rails, 202, the set of conductors 204, the set of conductors 206, the set of vias 208, the set of active regions 210, the set of vias 212, the set of vias 214 or the set of vias 216 from one another. In some embodiments, insulating region 203 includes multiple insulating regions deposited at different times from each other during methods 700A-700B (FIGS. 7A-7B). In some embodiments, insulating region is a dielectric material. In some embodiments, the dielectric material includes silicon dioxide, silicon oxy-nitride, or the like.

Other configurations, arrangements on other layout levels or other numbers of portions in insulating region 203 are within the scope of the present disclosure.

Set of vias 212 include one or more of vias 212a, 212b, 212c, 212d or 212e. In some embodiments, each via of the set of vias 212 is positioned where a corresponding source or drain region of an NMOS or PMOS transistor of integrated circuit 200 is positioned. In some embodiments, at least the set of vias 212, 214 or 216 is embedded in insulating region 203.

Set of vias 214 include one or more of vias 214a, 214b, 214c, 214d or 214e. In some embodiments, each via of the set of vias 214 is positioned where a corresponding source or drain region of an NMOS or PMOS transistor of integrated circuit 200 is positioned.

Set of vias 216 include one or more of vias 216a, 216b or 216c. In some embodiments, each via of the set of vias 216 is positioned where a corresponding source or drain region of an NMOS or PMOS transistor of integrated circuit 200 is positioned.

In some embodiments, each of the set of vias 212, set of vias 214 and set of vias 216 are a corresponding sets of contacts.

At least via 212a, 212b, 212c, 212d or 212e is between power rail 202a and active region 210a. At least via 212a, 212b, 212c. 212d or 212e is electrically coupled to active region 210a. In some embodiments, at least via 212a, 212c or 212e is electrically coupled to active region 210a and power rail 202a, and power rail 202a is configured to provide the second voltage of reference voltage supply VSS to the sources or drains of active region 210a. In some embodiments, at least via 212b or 212d and active region 210a are electrically insulated from power rail 202a by corresponding hard mask 222a or 222b.

At least via 214a, 214b, 214c. 214d or 214e is between power rail 202c and active region 210c. At least via 214a, 214b, 214c. 214d or 214e is electrically coupled to active region 210c. In some embodiments, at least via 214a, 214c or 214e is electrically coupled to active region 210c and power rail 202c, and power rail 202c is configured to provide the second voltage of reference voltage supply VSS to the sources or drains of active region 210c. In some embodiments, at least via 214b or 214d and active region 210c are electrically insulated from power rail 202c by corresponding hard mask 222c or 222d (not labelled).

At least via 216a, 216b or 216c is between power rail 202b and active region 210b. At least via 216a, 216b or 216c is electrically coupled to active region 210b. In some embodiments, at least via 216a, 216b or 216c is electrically coupled to active region 210b and power rail 202b, and power rail 202b is configured to provide the first voltage of voltage supply VDD to the sources or drains of active region 210b.

In some embodiments, at least via 212b or 214b is overlapped by and electrically insulated from conductor 206a. In some embodiments, at least via 212d or 214d is overlapped by and electrically insulated from conductor 206a. In some embodiments, at least via 216a, 216b or 216c of the set of vias 216 is not overlapped by conductor 206a or 206b of the set of conductors 206.

In some embodiments, each via of the set of vias 212 is separated from an adjacent via of the set of vias 212 in the first direction X by a pitch P1b. In some embodiments, each via of the set of vias 214 is separated from an adjacent via of the set of vias 214 in the first direction X by pitch P1b. In some embodiments, each via of the set of vias 216 is separated from an adjacent via of the set of vias 216 in the first direction X by 2 times pitch P1b. Other pitches for pitch P1b are within the scope of the present disclosure.

In some embodiments, at least the set of vias 212, set of vias 214 or set of vias 216 are positioned between the set of active regions and the set of hard masks 222. In some embodiments, at least the set of vias 212, set of vias 214 or set of vias 216 are positioned between the set of active regions and the set of power rails 202.

At least set of vias 212, set of vias 214 or set of vias 216 is positioned at the VB level of integrated circuit 200, 400 or 600.

Other configurations, arrangements on other layout levels or quantities of vias in at least set of vias 212, 214 or 216 are within the scope of the present disclosure.

The set of hard masks 222 includes one or more of hard masks 222a or 222b. In some embodiments, the set of hard masks 222 are on a top surface of one or more vias of the set vias 212 or 214. In some embodiments, the set of hard masks 222 corresponds to a set of isolation plugs. In some embodiments, the set of hard masks 222 includes one or more deposited hard mask materials including silicon carbide, silicon nitride, silicon oxy-nitride, or the like.

In some embodiments, the set of hard masks 222 are between a bottom surface of one or more power rails of the set of power rails 202 and a top surface of one or more vias of the set vias 212 or 214. In some embodiments, the set of hard masks 222 are configured to electrically insulate one or more power rails of the set of power rails 202 and one or more vias of the set vias 212 or 214.

In some embodiments, hard mask 222a is between power rail 202a and via 212b, and electrically insulates power rail 202a and via 212b from each other. In some embodiments, hard mask 222b is between power rail 202c and via 214b, and electrically insulates power rail 202c and via 214b from each other.

In some embodiments, by electrically isolating power rail 202a from via 212b by hard mask 222a, and by electrically isolating power rail 202c from via 214b by hard mask 222b, active region 210a1 is electrically coupled to active region 210c1 by the set of conductors 204, the set of conductors 206 and set of vias 208 resulting in additional routing resources in a HPC application compared to other approaches.

In some embodiments, active region 210a1 is electrically coupled to active region 210c1 by via 212b, conductor 204a, via 208a, conductor 206a, via 208c, conductor 204b and via 214b. For example, active region 210a1 is electrically coupled to via 212b, via 212b is electrically coupled to conductor 204a, conductor 204a is electrically coupled to via 208a, via 208a is electrically coupled to conductor 206a, conductor 206a is electrically coupled to via 208c, via 208c is electrically coupled to conductor 204b, conductor 204b is electrically coupled to via 214b, and via 214b is electrically coupled to active region 210c1.

In some embodiments, active region 210a2 is electrically coupled to active region 210c2 by via 212d, conductor 204a, via 208b, conductor 206b, via 208d, conductor 204b and via 214d. For example, active region 210a2 is electrically coupled to via 212d, via 212d is electrically coupled to conductor 204a, conductor 204a is electrically coupled to via 208b, via 208b is electrically coupled to conductor 206b, conductor 206b is electrically coupled to via 208d, via 208d is electrically coupled to conductor 204b, conductor 204b is electrically coupled to via 214d, and via 214d is electrically coupled to active region 210c2.

In some embodiments, by active region 210b having width W6b that is greater than width W5a of active regions 210a and 210c, at least integrated circuit 200, 400 or 600 has higher driving strength, higher speed and higher gate density than other approaches and is useable in HPC applications. In some embodiments, by electrically isolating the set of power rails 202 from the set of vias 212 or 214 by the set of hard masks 222, at least a pair of active regions of the set of active regions 210 is electrically coupled together by the set of conductors 204, the set of conductors 206 and set of vias 208 resulting in more routing flexibility and increases routing resources in a HPC application compared to other approaches.

In some embodiments, at least active region 210a1 or 210c1 is electrically insulated from active region 210b1 by corresponding conformal insulating layer portion 230b or 230c.

Other configurations, arrangements on other layout levels or other numbers of portions in set of hard masks 222 are within the scope of the present disclosure.

Conformal insulating layer 230 includes conformal insulating layer portion 230a, conformal insulating layer portion 230b, conformal insulating layer portion 230c and conformal insulating layer portion 230d. In some embodiments, conformal insulating layer 230 is referred to as a "spacer." Outer surfaces of conformal insulating layer 230 are covered by insulating region 203.

Conformal insulating layer portion 230a is against the top surface of substrate 220, a first side surface of via 212b, a side surface of hard mask 222a and a bottom surface of power rail 202a. Conformal insulating layer portion 230a is also against a side surface of conductor 204c, and electrically insulates conductor 204c and via 212b from each other.

Conformal insulating layer portion 230b is against the top surface of substrate 220, a second side surface of via 212b opposite from the first side surface of via 212b, a bottom surface of power rail 202b, and a first side surface of region 250. Conformal insulating layer portion 230b is also against a side surface of conductor 204a and a bottom surface of conductor 204a, and electrically insulates conductor 204a and region 250 from each other. A top surface of conformal insulating layer portion 230b and a portion of insulating region 203 provide structural support for conductor 204a.

Conformal insulating layer portion 230c is against the top surface of substrate 220, a first side surface of via 214b, a bottom surface of power rail 202b, and a second side surface of region 250 opposite from the first side surface of region 250. Conformal insulating layer portion 230c is also against a side surface of conductor 204b and a bottom surface of conductor 204b, and electrically insulates conductor 204b and region 250 from each other. A top surface of conformal insulating layer portion 230c and a portion of insulating region 203 provide structural support for conductor 204b.

Conformal insulating layer portion 230d is against the top surface of substrate 220, a second side surface of via 214b opposite from the first side surface of via 214b, a side surface of hard mask 222b and a bottom surface of power rail 202c. Conformal insulating layer portion 230d is also against insulating region 203, and electrically insulates via 214b from other portions of integrated circuit 200.

In some embodiments, conformal insulating layer 230 is a spacer material that is a layer of silicon nitride or other spacer material. In some embodiments, the details of conformal insulating layer 230 are applicable to each via of set of vias 212, 214 or 216 similar to that described above for vias 212b and 214b, and similar detailed description is therefore omitted.

Other configurations, arrangements on other layout levels or other numbers of portions in conformal insulating layer 230 are within the scope of the present disclosure.

In some embodiments, at least one power rail of the set of power rails 202, at least one conductor of the set of conductors 204, at least one conductor of the set of conductors 206, at least one via of the set of vias 208, at least one via of the set of vias 212, 214 or 216 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co. W. Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Figure 3A:
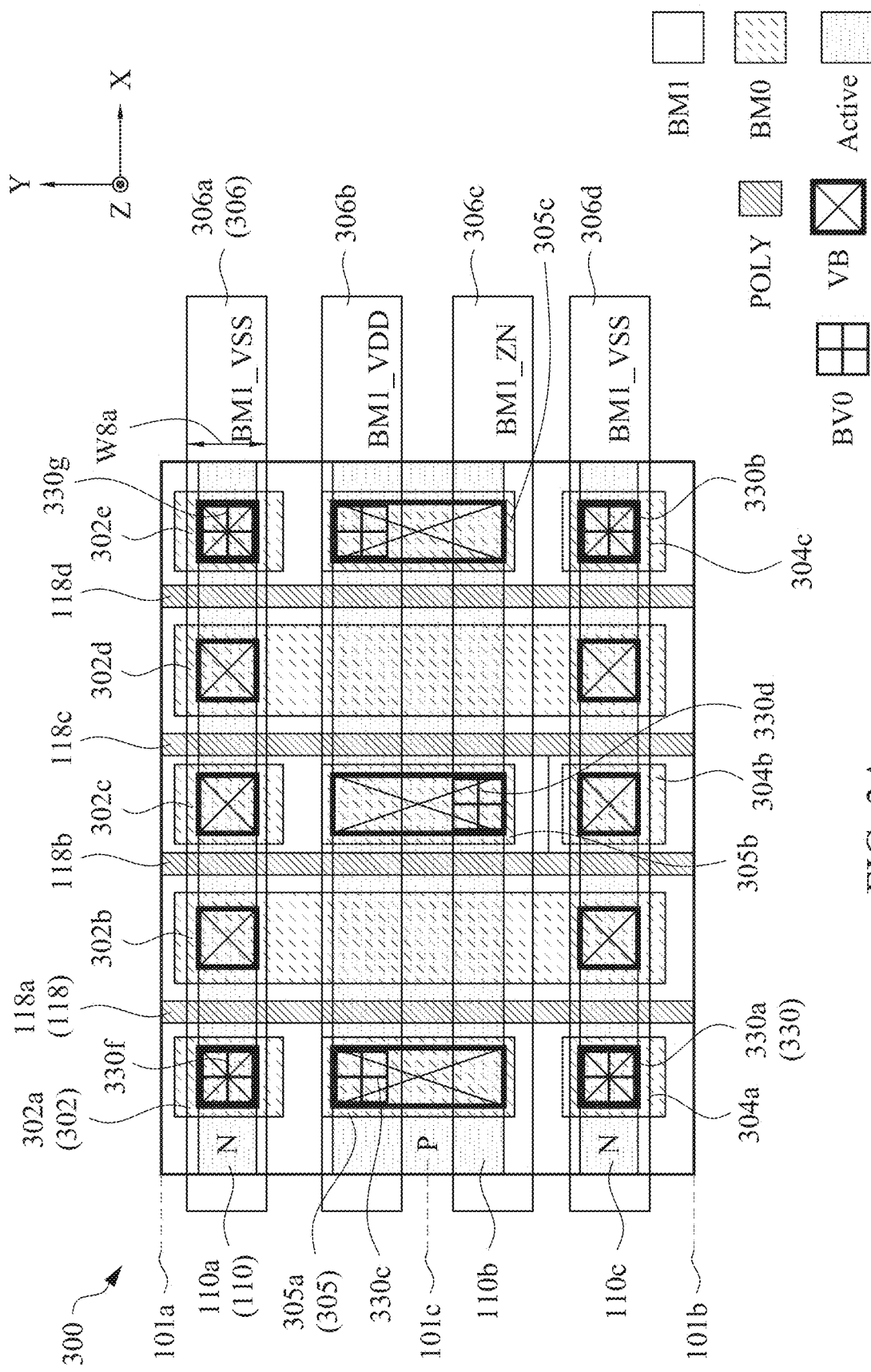
FIGS. 3A-3B are diagrams of a layout design of an integrated circuit, in accordance with some embodiments.
Figure 3B:
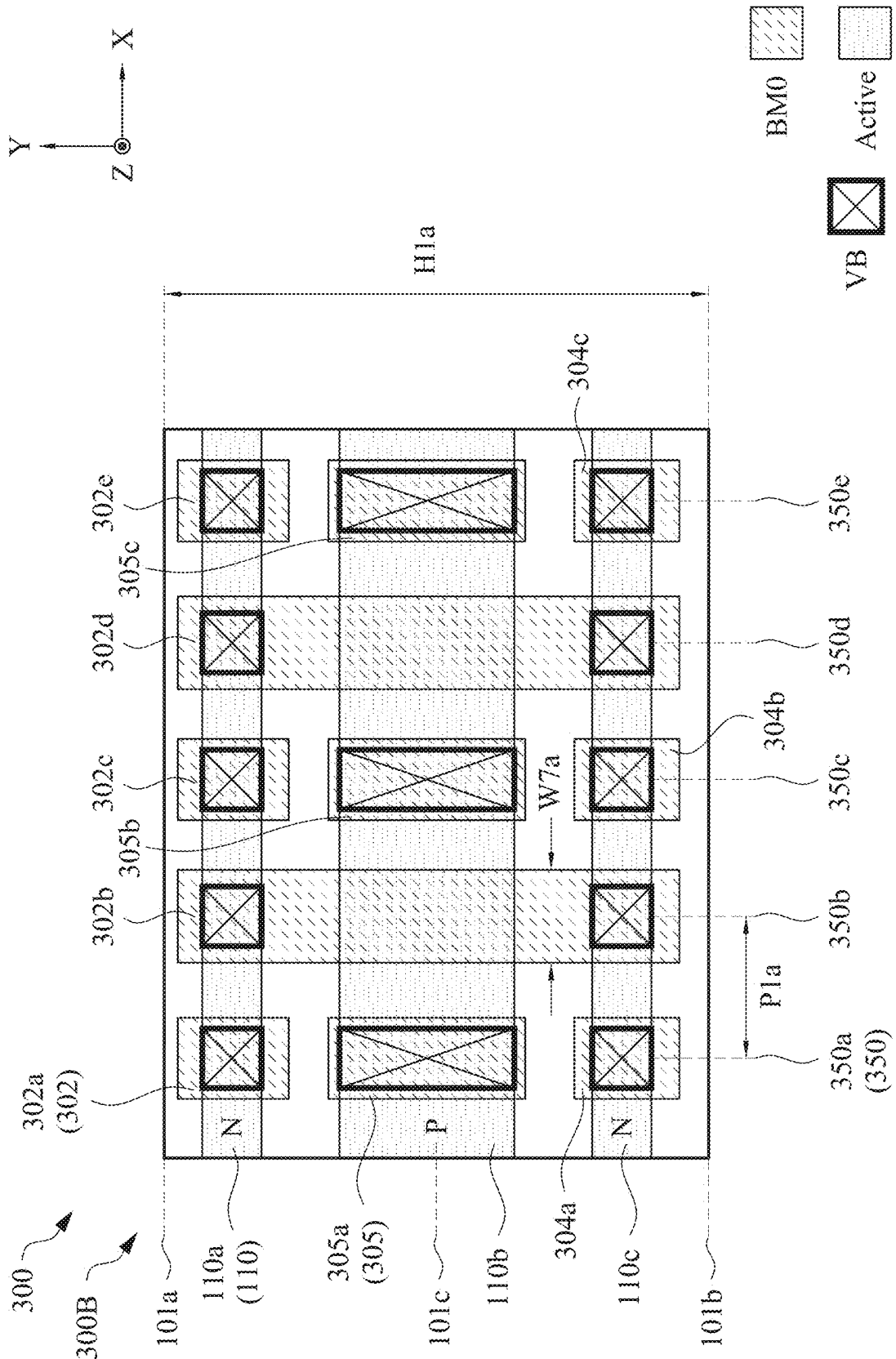

FIGS. 3A-3B are diagrams of a layout design 300 of an integrated circuit, in accordance with some embodiments. Layout design 300 is a layout diagram of integrated circuit 400 of FIGS. 4A-4C.

FIG. 3B is a diagram of a corresponding portion 300B of layout design 300 of FIG. 3A, simplified for ease of illustration. FIG. 3A is a diagram of layout design 300 and includes portion 300B, simplified for ease of illustration.

For ease of illustration, some of the labeled elements of FIGS. 3A-3B are not labelled in FIGS. 3A-3B. In some embodiments, layout design 300 includes additional elements not shown in FIGS. 3A-3B.

Portion 300B includes one or more features of layout design 300 of FIG. 3A of the OD level, the VB level and the BM0 level of layout design 100. Portion 300B is a variation of portion 100B of FIG. 1B, and similar detailed description is therefore omitted. For example, in comparison with portion 100B of FIG. 1B, portion 300B further includes a set of conductive patterns 302, 304 and 305.

Layout design 300 includes one or more features of the OD level, the gate (POLY) level, the BM0, the BM1, and the VB level.

Figure 4A:
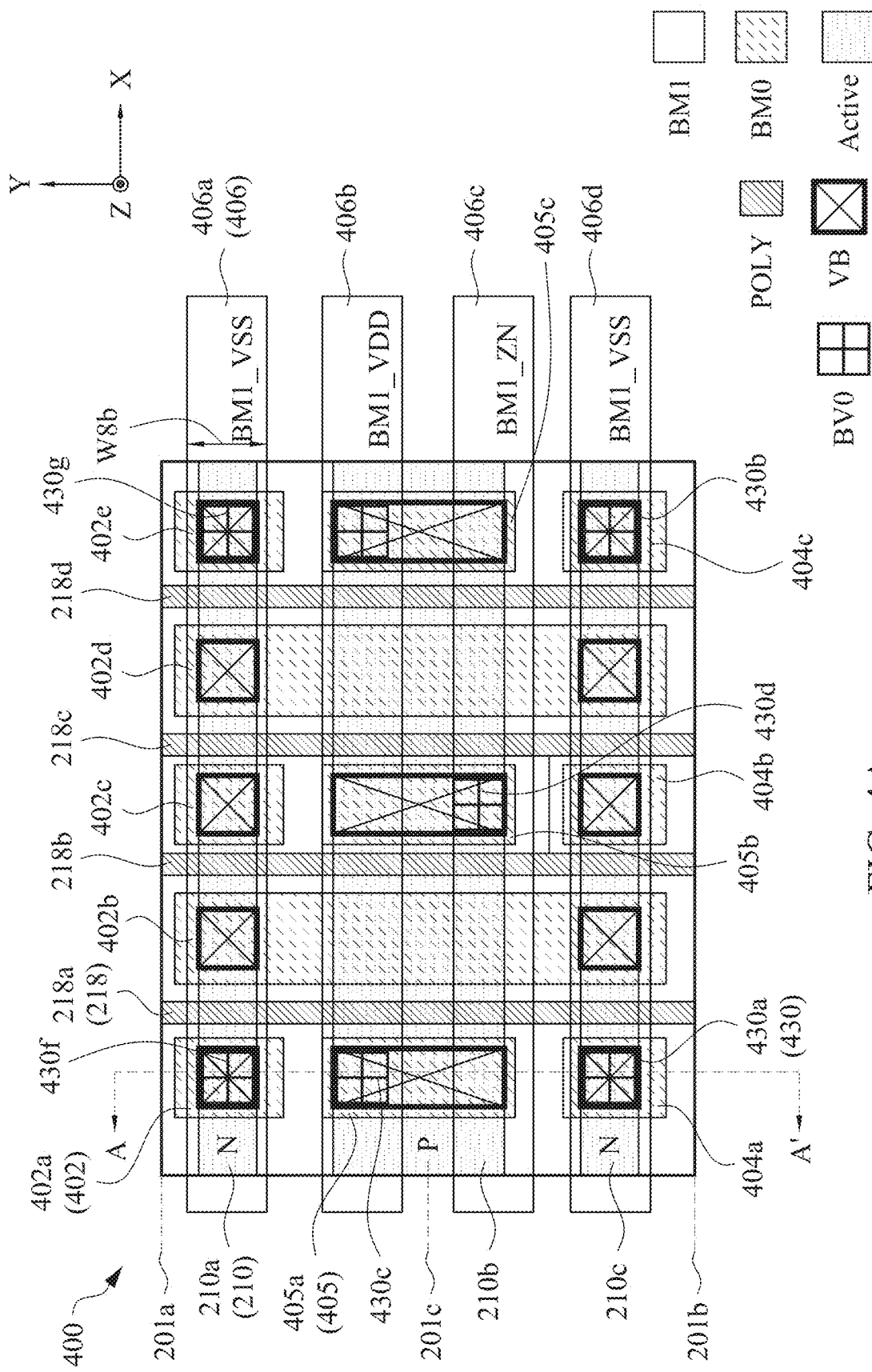
FIGS. 4A-4C are diagrams of an integrated circuit, in accordance with some embodiments.
Figure 4B:
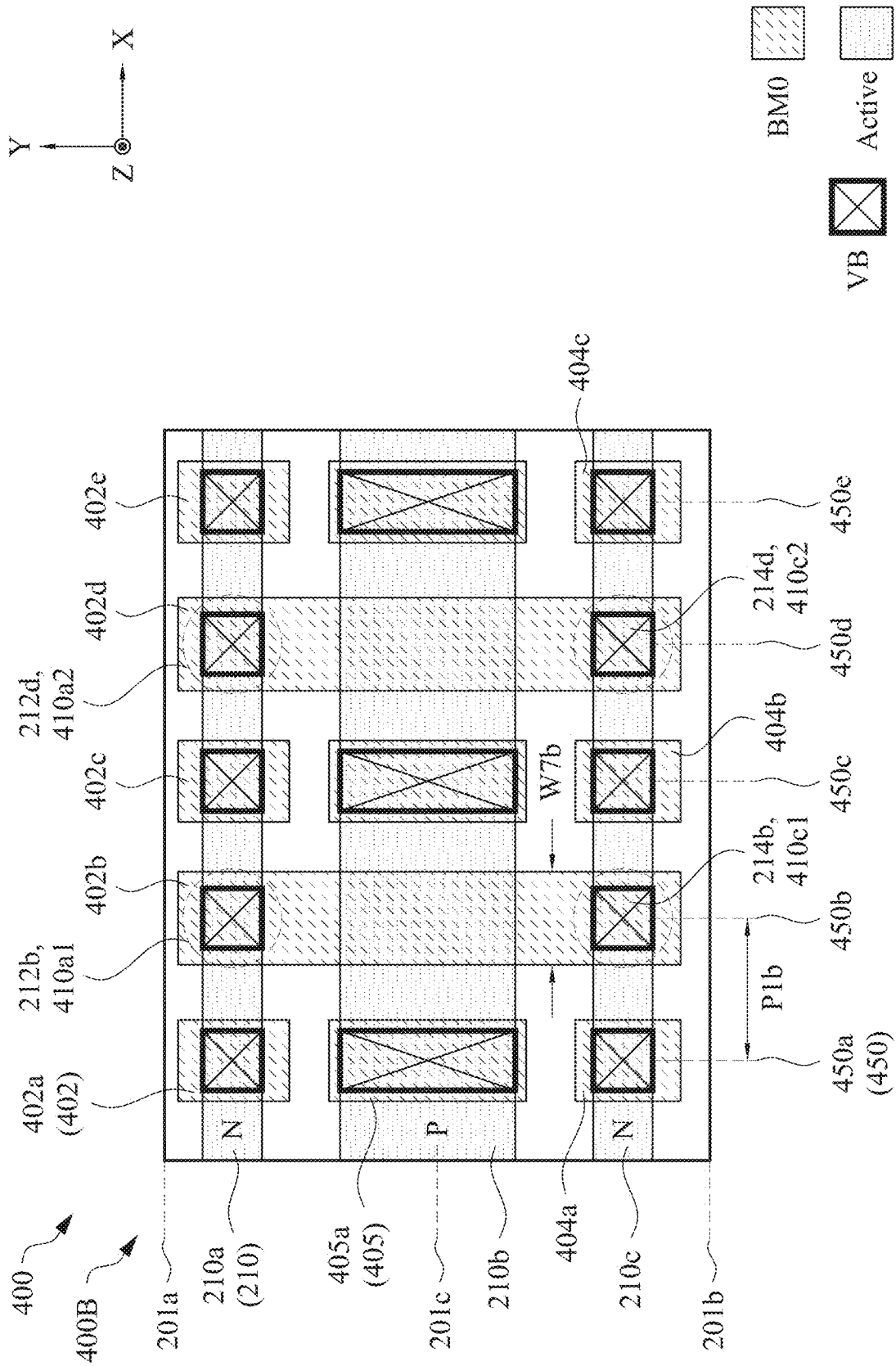
Figure 4C:
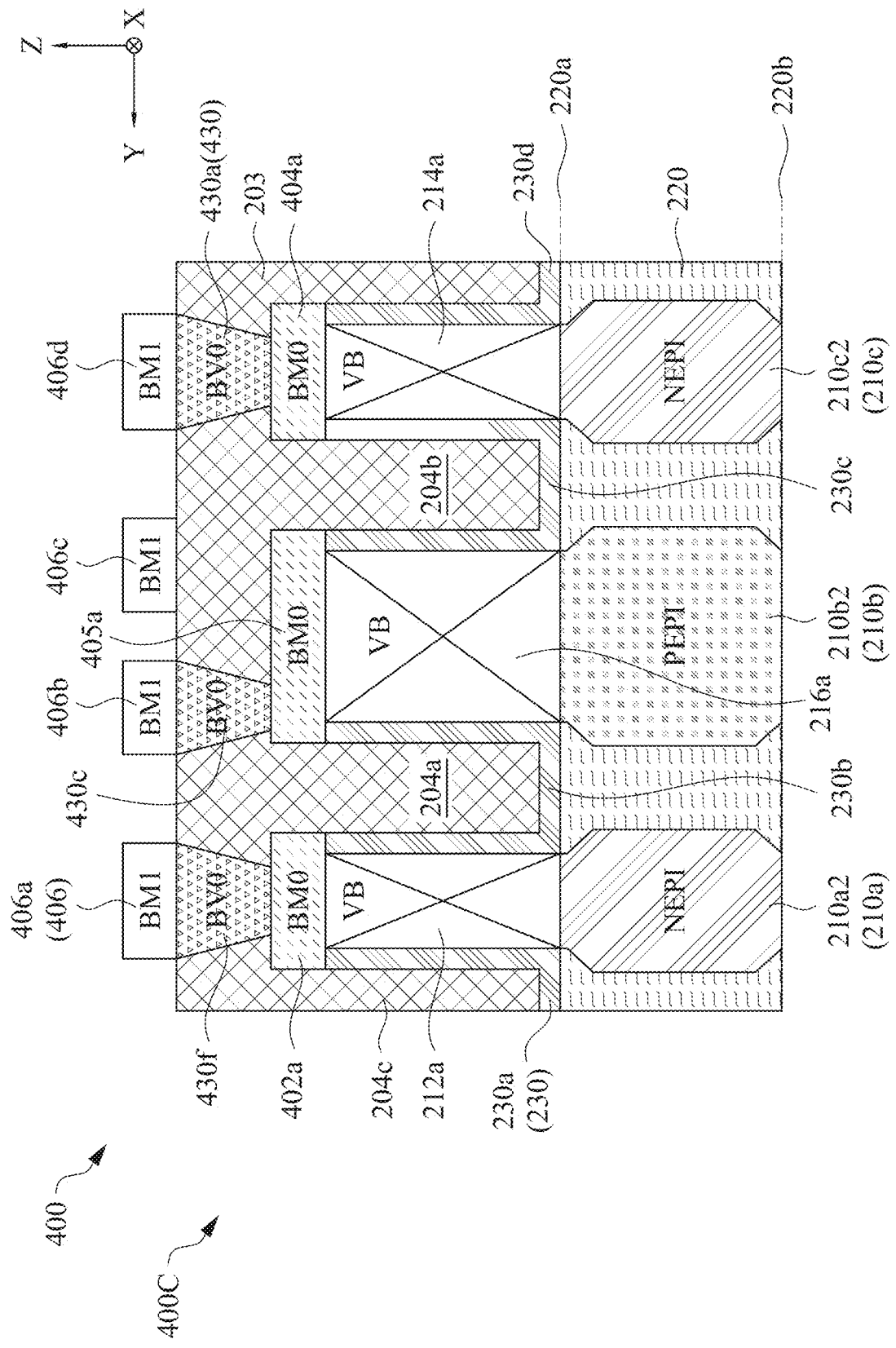

Layout design 300 is usable to manufacture integrated circuit 400 of FIGS. 4A-4C.

Layout design 300 is a variation of layout design 100 (FIGS. 1A-1B). For example, layout design 300 illustrates an example of where the set of conductive patterns 302, 304 and 305 and set of conductive patterns 306 are used for extra routing resources to electrically couple at least a pair of active regions manufactured by the set of active region patterns 110.

In comparison with layout design 100 of FIGS. 1A-1B, set of conductive patterns 302, 304 and 305 of layout design 300 replaces the set of conductive patterns 206, and a set of conductive patterns 306 of layout design 300 replaces the set of power rail patterns 102, and similar detailed description is therefore omitted.

In comparison with layout design 100 of FIGS. 1A-1B, layout design 300 does not include the set of conductive patterns 104.

Layout design 300 includes set of conductive patterns 302, set of conductive patterns 304, set of conductive patterns 305, set of conductive patterns 306, set of active region patterns 110, set of via patterns 112, set of via patterns 114, set of via patterns 116, set of gate patterns 118 and a set of via patterns 330.

The set of conductive patterns 302 includes one or more conductive patterns 302a, 302b, 302c, 302d or 302e extending in at least the first direction X or the second direction Y, and being located on the first layout level. In some embodiments, the first layout level is the BM0 level.

The one or more conductive patterns 302a, 302b, 302c, 302d or 302e are collectively referred to as a "set of conductive patterns 302."

The set of conductive patterns 302 is usable to manufacture a corresponding set of conductors 402 of integrated circuit 400 or 600 (FIGS. 4A-4C and 6A-6C). In some embodiments, conductive pattern 302a, 302b, 302c, 302d or 302e is usable to manufacture corresponding conductor 402a, 402b, 402c, 402d or 402e of the set of conductors 402 (FIGS. 2A-2C) of integrated circuit 400 or 600.

The set of conductive patterns 304 includes one or more conductive patterns 304a, 304b or 304c extending in at least the first direction X or the second direction Y, and being located on the first layout level.

The one or more conductive patterns 304a, 304b or 304c are collectively referred to as a "set of conductive patterns 304."

The set of conductive patterns 304 is usable to manufacture a corresponding set of conductors 404 of integrated circuit 400 or 600 (FIGS. 4A-4C and 6A-6C). In some embodiments, conductive pattern 304a, 304b or 304c is usable to manufacture corresponding conductor 404a, 404b or 404c of the set of conductors 404 (FIGS. 2A-2C) of integrated circuit 400 or 600.

The set of conductive patterns 305 includes one or more conductive patterns 305a, 305b or 305c extending in at least the first direction X or the second direction Y, and being located on the first layout level.

The one or more conductive patterns 305a, 305b or 305c are collectively referred to as a "set of conductive patterns 305."

The set of conductive patterns 305 is usable to manufacture a corresponding set of conductors 405 of integrated circuit 400 or 600 (FIGS. 4A-4C and 6A-6C). In some embodiments, conductive pattern 305a, 305b or 305c is usable to manufacture corresponding conductor 405a, 405b or 405c of the set of conductors 405 (FIGS. 2A-2C) of integrated circuit 400 or 600.

In some embodiments, at least the set of conductors 402, 404 or 405 are located on the back-side 220a of integrated circuit 400 or 600.

The set of conductive patterns 302 overlaps the set of via patterns 112, via pattern 114b, via pattern 114d and active region pattern 110a.

The set of conductive patterns 304 overlaps via pattern 114a, via pattern 114c, via pattern 114e, and active region pattern 110c.

The set of conductive patterns 305 overlaps the set of via patterns 116, and active region pattern 110b.

Each conductive pattern of the set of conductive patterns 302 is separated from each another in the first direction X. Each conductive pattern of the set of conductive patterns 304 is separated from each another in the first direction X. Each conductive pattern of the set of conductive patterns 305 is separated from each another in the first direction X.

At least two conductive patterns of conductive pattern 302a, 304a or 305a are separated from each another in the second direction Y. At least two conductive patterns of conductive pattern 302c, 304b or 305b are separated from each another in the second direction Y. At least two conductive patterns of conductive pattern 302e, 304c or 305c are separated from each another in the second direction Y.

In some embodiments, adjacent conductive patterns of the set of conductive patterns 302, 304 or 305 is separated from an adjacent conductive pattern of the set of conductive patterns 302, 304 or 305 in the first direction X by pitch P1a.

In some embodiments, each conductive pattern of the set of conductive patterns 305 is separated from an adjacent conductive pattern of the set of conductive patterns 305 in the first direction X by 2 times pitch P1a. Other pitches for pitch P1a are within the scope of the present disclosure.

In some embodiments, at least conductive pattern 302b or 302d of the set of conductive patterns 302 have a strap configuration, and at least conductive pattern 302a, 302c or 302e of the set of conductive patterns 302, at least conductive pattern 304a, 304b or 304c of the set of conductive patterns 304, or at least conductive pattern 305a, 305b or 305c of the set of conductive patterns 305 have a stub or island configuration.

In some embodiments, conductive pattern 302b overlaps via patterns 112b and 114b. In some embodiments, conductive pattern 302d overlaps via patterns 112d and 114d.

At least conductive pattern 302b or 302d of the set of conductive patterns 302 has a width W7a in the first direction X. In some embodiments, each conductive pattern of the set of conductive patterns 302, 304 or 305 has width W7a in the first direction X.

In some embodiments, at least width one of W5a, W6a, W7a or W8a (describe below) is different from another of width W5a, W6a, W7a or W8a. In some embodiments, at least one of width W5a, W6a, W7a or W8a is equal to another of width W5a, W6a, W7a or W8a.

Other widths or other numbers of conductive patterns in the set of conductive patterns 302, 304 or 305 are within the scope of the present disclosure. In some embodiments, at least conductive pattern 302a has a width different from conductive pattern 302b.

Other configurations, arrangements on other layout levels or quantities of patterns in the set of conductive patterns 302, 304 or 305 are within the scope of the present disclosure.

The set of conductive patterns 306 includes one or more conductive patterns 306a, 306b, 306c or 306d extending in the first direction X, and being located on the third layout level. In some embodiments, the third layout level corresponds to the BM1 level. In some embodiments, conductive patterns 306a, 306b and 306d are power rail patterns, and conductive pattern 306c is a signal line pattern.

The one or more conductive patterns 306a, 306b, 306c or 306d are collectively referred to as a "set of conductive patterns 306."

The set of conductive patterns 306 is usable to manufacture a corresponding set of conductors 406 of integrated circuit 400 or 600 (FIGS. 4A-4C and 6A-6C). In some embodiments, the set of conductors 406 are located on the back-side 220a of integrated circuit 400 or 600. In some embodiments, conductive patterns 306a, 306b, 306c, 306d of the set of conductive patterns 306 are usable to manufacture corresponding conductors 406a, 406b, 406c, 406d of the set of conductors 406 (FIGS. 4A-4C and 6A-6C) of integrated circuit 400 or 600.

Conductive patterns 306a, 306b, 306c and 306d of the set of conductive patterns 306 are separated from each other in the second direction Y.

In some embodiments, conductive pattern 306a of the set of conductive patterns 306 overlaps active region pattern 110a of layout design 300 or 500. In some embodiments, conductive patterns 306b and 306c of the set of conductive patterns 306 overlap active region pattern 110b of layout design 300 or 500. In some embodiments, conductive pattern 306d of the set of conductive patterns 306 overlaps active region pattern 110c of layout design 300 or 500.

In some embodiments, conductive patterns 306a and 306b of the set of conductive patterns 306 are located between cell boundary 101a and mid-point 101c of layout design 300 and 500. In some embodiments, conductive patterns 306c and 306d of the set of conductive patterns 306 are located between cell boundary 101b and mid-point 101c of layout design 300 and 500.

In some embodiments, the set of conductive patterns 306 overlaps the set of via patterns 112, 114 and 116. In some embodiments, conductive pattern 306a of the set of conductive patterns 306 overlaps the set of conductive patterns 302.

In some embodiments, conductive patterns 306b and 306c of the set of conductive patterns 306 overlaps conductive patterns 302b and 302d, and the set of conductive patterns 305. In some embodiments, conductive pattern 306d of the set of conductive patterns 306 overlaps conductive patterns 302b and 302d, and the set of conductive patterns 304.

In some embodiments, by including conductive pattern 306c of the set of conductive patterns 306 of the present disclosure, layout design 300 or 500 offers more routing flexibility and increases routing resources compared to other approaches.

At least conductive pattern 306a, 306b, 306c or 306d of the set of conductive patterns 306 has a width W8a in the second direction Y.

Other widths for the set of conductive patterns 306 or other numbers of conductive patterns in the set of conductive patterns 306 are within the scope of the present disclosure. In some embodiments, at least conductive pattern 306a. 306b, 306c or 306d has a width different from another of conductive pattern 306a, 306b, 306c or 306d.

Other configurations, arrangements on other layout levels or quantities of patterns in the set of conductive patterns 306 are within the scope of the present disclosure.

Layout design 300 further includes one or more via patterns 330a, 330b, 330c, 330d, 330, 330f or 330g (collectively referred to as a "set of via patterns 330").

The set of via patterns 330 is usable to manufacture a corresponding set of vias 430 (FIG. 4A-4C or 6A-6C). In some embodiments, via patterns 330a, 330b, 330c, 330d, 330e, 330f or 330g of the set of via patterns 330 are usable to manufacture corresponding vias 430a, 430b, 430c. 430d, 430e, 430f or 430g the set of vias 430 (FIG. 4A-4C or 6A-6C) of integrated circuit 400 or 600.

In some embodiments, the set of via patterns 330 are between the set of conductive patterns 306 and at least the set of conductive patterns 302, 304 or 305.

At least set of via patterns 330 is positioned at a backside via zero (BV0) level of one or more of layout designs 300 or 500 (FIG. 3A-3B or 5A-5B), integrated circuit 400 or 600 (FIG. 4A-4C or 6A-6C), or integrated circuit 800 (FIGS. 8A-8E).

In some embodiments, the BV0 level is between the BM0 level and the BM1 level. In some embodiments, the BV0 level is between the first layout level and the third layout level. Other layout levels are within the scope of the present disclosure.

At least via pattern 330a or 330b is between corresponding conductive pattern 304a or 304c and conductive pattern 306d. At least via pattern 330c or 330e is between corresponding conductive pattern 305a or 305c and conductive pattern 306b. At least via pattern 330d is between conductive pattern 305b and conductive pattern 306c. At least via pattern 330f or 330g is between corresponding conductive pattern 302a or 302e and conductive pattern 306a.

In some embodiments, each via pattern of the set of via patterns 330 is positioned where a corresponding source or drain region of an NMOS or PMOS transistor manufactured by layout design 300 is positioned.

In some embodiments, when viewed from the bottom/backside (e.g., in the positive Z-direction) of layout design 300, at least via pattern 330a or 330b is overlapped by conductive pattern 306d, at least via pattern 330c or 330e is overlapped by conductive pattern 306b, at least via pattern 330d is overlapped by conductive pattern 306c, and at least via pattern 330f or 330g is overlapped by conductive pattern 306a.

In some embodiments, each via pattern of the set of via patterns 330 is separated from an adjacent via pattern of the set of via patterns 330 in the first direction X by a pitch (not labelled). Other pitches are within the scope of the present disclosure.

Other configurations, arrangements on other layout levels or quantities of patterns in at least set of via patterns 330 are within the scope of the present disclosure.

Other configurations, arrangements on other layout levels or quantities of patterns for layout design 300 are within the scope of the present disclosure.

FIGS. 4A-4C are diagrams of an integrated circuit 400, in accordance with some embodiments.

FIG. 4A is a top view of integrated circuit 400, in accordance with some embodiments. FIG. 4B is a diagram of a corresponding portion 400B of integrated circuit 400 of FIG. 4A, simplified for case of illustration. FIG. 4A is a diagram of integrated circuit 400 and includes portion 400B, simplified for case of illustration.

FIG. 4C is a cross-sectional view of integrated circuit 400, in accordance with some embodiments. FIG. 4C is a cross-sectional view of integrated circuit 400 as intersected by plane B-B', in accordance with some embodiments.

Integrated circuit 400 is manufactured by layout design 300. Structural relationships including alignment, lengths and widths, as well as configurations and layers of integrated circuit 400 are similar to the structural relationships and configurations and layers of layout design 300 of FIGS. 3A-3B, and similar detailed description will not be described in at least FIGS. 4A-4C, for brevity. For example, in some embodiments, at least width W5a, W6a, W7a or W8a, pitch P1a, or height H1a of layout design 300 is similar to corresponding width W5b, W6b, W7b or W8b, pitch P1b, or height H1b of integrated circuit 400, and similar detailed description is omitted for brevity. For example, in some embodiments, at least cell boundary 101a or 101b or mid-point 101c of layout design 300 is similar to at least corresponding cell boundary 201a or 201b or mid-point 201c of integrated circuit 400 or 600, and similar detailed description is omitted for brevity.

Integrated circuit 400 includes at least the set of conductors 402, the set of conductors 404, the set of conductors 405, the set of conductors 406, the set of active regions 210, the set of vias 212, the set of vias 214, the set of vias 216, the set of gates 218 and the set of vias 430.

In some embodiments, the set of active regions 210, the set of vias 212, the set of vias 214 and the set of vias 216 in integrated circuit 400 are similar to integrated circuit 200, and similar detailed description is omitted for brevity.

In some embodiments, portion 400C of integrated circuit 400 is a variation of portion 200C of integrated circuit 200 of FIG. 2C, and similar detailed description is omitted for brevity.

In comparison with portion 200C of integrated circuit 200, region 250 of FIG. 2C is replaced with via 216a, via 212b is replaced with via 212a, via 214b is replaced with via 214a, active region 210a1 is replaced with active region 210a2, active region 210b1 is replaced with active region 210b2, active region 210c1 is replaced with active region 210c2, power rail 202a is replaced with conductor 402a, power rail 202b is replaced with conductor 405a, power rail 202c is replaced with conductor 404a, conductor 206a is replaced with conductors 406a, 406b, 406c and 406d, and similar detailed description is omitted for brevity.

In comparison with portion 200C of integrated circuit 200, conformal insulating layer portion 230b of FIG. 4C is against the top surface of substrate 220, a second side surface of via 212a opposite from the first side surface of via 212a, a bottom surface of conductor 402a, a bottom surface of conductor 405a, and a first side surface of via 216a, and similar detailed description is omitted for brevity.

In comparison with portion 200C of integrated circuit 200, conformal insulating layer portion 230 of FIG. 4C is against the top surface of substrate 220, a second side surface of via 214a opposite from the first side surface of via 214a, a bottom surface of conductor 404a, a bottom surface of conductor 405a, and a second side surface of via 216a, and similar detailed description is omitted for brevity.

The set of conductors 402 includes one or more conductors 402a, 402b, 402c, 402d or 402e extending in at least the first direction X or the second direction Y.

At least conductor 402b or 402d of the set of conductors 402 has a width W7a in the first direction X. In some embodiments, each conductor of the set of conductors 402, 404 or 405 has width W7a in the first direction X. The one or more conductors 402a, 402b, 402c, 402d or 402e are collectively referred to as a "set of conductors 402."

The set of conductors 404 includes one or more conductors 404a, 404b or 404c extending in at least the first direction X or the second direction Y. The one or more conductors 404a, 404b or 404c are collectively referred to as a "set of conductors 404."

The set of conductors 405 includes one or more conductors 405a, 405b or 405c extending in at least the first direction X or the second direction Y. The one or more conductors 405a, 405b or 405c are collectively referred to as a "set of conductors 405."

In some embodiments, at least the set of conductors 402, 404, 405 or 406 are located on the back-side 220a of integrated circuit 400 or 600.

The set of conductors 402, 404 and 405 are configured to provide routing of signals from upper layers or between lower layers. For example, in some embodiments, the set of conductors 402, 404 and 405 is configured to provide signal routing between active regions of the set of active regions 210.

In some embodiments, the set of conductors 402, 404 and 405 are configured to electrically couple a drain or source of a PMOS or NMOS transistor in an active region of the set of active regions 210 and a drain or source of another PMOS or NMOS transistors in another active region of the set of active regions 210, resulting in additional routing resources compared to other approaches.

In some embodiments, conductors 206a and 206b are configured to electrically couple a drain or source 210a1 of a transistor in active region 210a and a drain or source 210c1 of a transistor in active region 210c together, resulting in additional routing resources compared to other approaches.

In some embodiments, the set of conductors 402, 404 and 405 are configured to electrically couple a set of gates (not shown) of integrated circuit 400, resulting in additional routing resources compared to other approaches. In some embodiments, the set of conductors 402, 404 and 405 are configured to electrically couple the set of active regions 210 and the set of gates (not shown) to each other, resulting in additional routing resources compared to other approaches.

In some embodiments, the set of conductors 402, 404 and 405 corresponds to a set of conductive structures.

In some embodiments, the set of conductors 402, 404 and 405 is located above at least a set of gates (not shown), the OD level, the M0 level, the MD level and the VB level of integrated circuit 400, and below the BM1 level of integrated circuit 400.

The set of conductors 402 overlaps the set of vias 212, via 214b, via 214d and active region 210a. The set of conductors 404 overlaps via 214a, via 214c, via 214c, and active region 210c. The set of conductors 405 overlaps the set of vias 216, and active region 210b.

In some embodiments, at least conductor 402b or 402d of the set of conductors 402 have a strap configuration. In some embodiments, a strap is a conductive structure that overlaps and is electrically coupled to two or more underlying, structures.

In some embodiments, conductor 402b electrically couples active regions 410a1 and 410c1 together by corresponding vias 212b and 214b, resulting in additional routing resources compared to other approaches. In some embodiments, conductor 402b overlaps vias 212b and 214b. In some embodiments, active region 410a1 is a drain or source of an NMOS transistor, and active region 410c1 is a drain or source of another NMOS transistor.

In some embodiments, conductor 402d electrically couples active regions 410a2 and 410c2 together by corresponding vias 212d and 214d, resulting in additional routing resources compared to other approaches. In some embodiments, conductor 402d overlaps vias 212d and 214d. In some embodiments, active region 410a2 is a drain or source of an NMOS transistor, and active region 410c2 is a drain or source of another NMOS transistor.

In some embodiments, at least conductor 402a, 402c or 402e of the set of conductors 402, at least conductor 404a, 404b or 404c of the set of conductors 404, or at least conductor 405a, 405b or 405c of the set of conductors 405 have a stub or island configuration. In some embodiments, at least conductor 402a, 402c, 402c, 404a, 404b, 404c. 405a, 405b or 405c is electrically coupled to corresponding via 212a, 212c, 212e, 214a, 214c, 214c, 216a, 216b or 216c.

In some embodiments, adjacent conductors of the set of conductors 402, 404 or 405 is separated from an adjacent conductor of the set of conductors 402, 404 or 405 in the first direction X by pitch P1b. In some embodiments, each conductor of the set of conductors 405 is separated from an adjacent conductor of the set of conductors 405 in the first direction X by 2 times pitch P1b. Other pitches for pitch P1b are within the scope of the present disclosure.

Other configurations, arrangements on other levels or quantities of conductors in the set of conductors 402, 404 or 405 are within the scope of the present disclosure.

The set of conductors 406 includes one or more conductors 406a, 406b, 406c or 406d extending in the first direction X. At least conductor 406a, 406b, 406c or 406d of the set of conductors 406 has a width W8b in the second direction Y. At least conductor 406a, 406b, 406c or 406d of the set of conductors 406 has a width W8b in the second direction Y.

The one or more conductors 406a, 406b, 406c or 406d are collectively referred to as a "set of conductors 406."

In some embodiments, conductors 406a, 406b and 406d are power rails. In some embodiments, at least conductor 406a or 406d is configured to provide the second supply voltage of reference voltage supply VSS to corresponding active region 210a or 210c by at least corresponding via 212a or 214a, corresponding via 212c or 214b and corresponding via 212e or 214c, and conductor 406b is configured to provide the first supply voltage of voltage supply VDD to active region 210b by at least via 216a, 216b or 216c.

In some embodiments, at least conductor 406a or 406d is configured to provide the first supply voltage of voltage supply VDD to corresponding active region 210a or 210c by at least corresponding via 212a or 204a, corresponding via 212c or 214b and corresponding via 212e or 214c, and conductor 406b is configured to provide the second supply voltage of reference voltage supply VSS to active region 210b by at least via 216a, 216b or 216c.

In some embodiments, conductor 406a of the set of conductors 406 overlaps active region 210a, conductors 406b and 406c of the set of conductors 406 overlap active region 210b and conductor 406d of the set of conductors 406 overlaps active region 210c.

In some embodiments, the set of conductors 406 overlaps the set of vias 212, 214 and 216. In some embodiments, conductor 406a of the set of conductors 406 overlaps the set of conductors 402. In some embodiments, conductors 406b and 406c of the set of conductors 406 overlaps conductors 402b and 402d, and the set of conductors 405. In some embodiments, conductor 406d of the set of conductors 406 overlaps conductors 402b and 402d, and the set of conductors 404.

In some embodiments, the set of conductors 406 is located above at least a set of gates (not shown), the OD level, the M0 level, the MD level, the BM0 level and the VB level of integrated circuit 400.

In some embodiments, conductor 406c is a signal line or a signal pin. In some embodiments, conductor 406c is electrically coupled to active region 210b. In some embodiments, by including conductor 406c of the set of conductors 406 of the present disclosure, integrated circuit 400 offers more routing flexibility and increases routing resources in HPC applications compared to other approaches.

Other widths for the set of conductors 402, 404, 405 and 406 or other numbers of conductors in the set of conductors 402, 404, 405 and 406 are within the scope of the present disclosure. In some embodiments, at least conductor 406a, 406b, 406c or 406d has a width different from another of conductor 406a, 406b, 406c or 406d. In some embodiments, at least conductor 402a has a width different from conductor 402b.

Other configurations, arrangements on other layout levels or quantities of patterns in the set of conductors 406 are within the scope of the present disclosure.

Set of vias 430 includes one or more of vias 430a, 430b, 430c, 430d, 430e, 430f or 430g.

In some embodiments, the set of vias 430 are between the set of conductors 406 and at least the set of conductors 402, 404 or 405.

At least set of vias 430 is positioned at the BVO level of integrated circuit 400 or 600 (FIG. 4A-4C or 6A-6C), or integrated circuit 800 (FIGS. 8A-8E).

At least via 430a or 430b is between corresponding conductor 404a or 404c and conductor 406d, and electrically couples corresponding conductor 404a or 404c and conductor 406d together. At least via 430c or 430e is between corresponding conductor 405a or 405c and conductor 406b, and electrically couples corresponding conductor 405a or 405c and conductor 406b together. At least via 430d is between conductor 405b and conductor 406c, and electrically couples conductor 405b and conductor 406c together. At least via 430f or 430g is between corresponding conductor 402a or 402e and conductor 406a, and electrically couples corresponding conductor 402a or 402e and conductor 406a together.

In some embodiments, each via of the set of vias 430 is positioned where a corresponding source or drain region of an NMOS or PMOS transistor of integrated circuit 400 or 600 is positioned.

In some embodiments, when viewed from the bottom/backside 220a of integrated circuit 400 or 600, at least via 430a or 430b is overlapped by conductor 406d, at least via 430c or 430e is overlapped by conductor 406b, at least via 430d is overlapped by conductor 406c, and at least via 430f or 430g is overlapped by conductor 406a. In some embodiments, at least the set of vias 430 is embedded in an insulating region 203.

Other configurations, arrangements on other layout levels or quantities of vias in at least set of vias 430 are within the scope of the present disclosure.

Other configurations, arrangements on other layout levels or quantities of patterns for integrated circuit 400 are within the scope of the present disclosure.

Figure 5A:
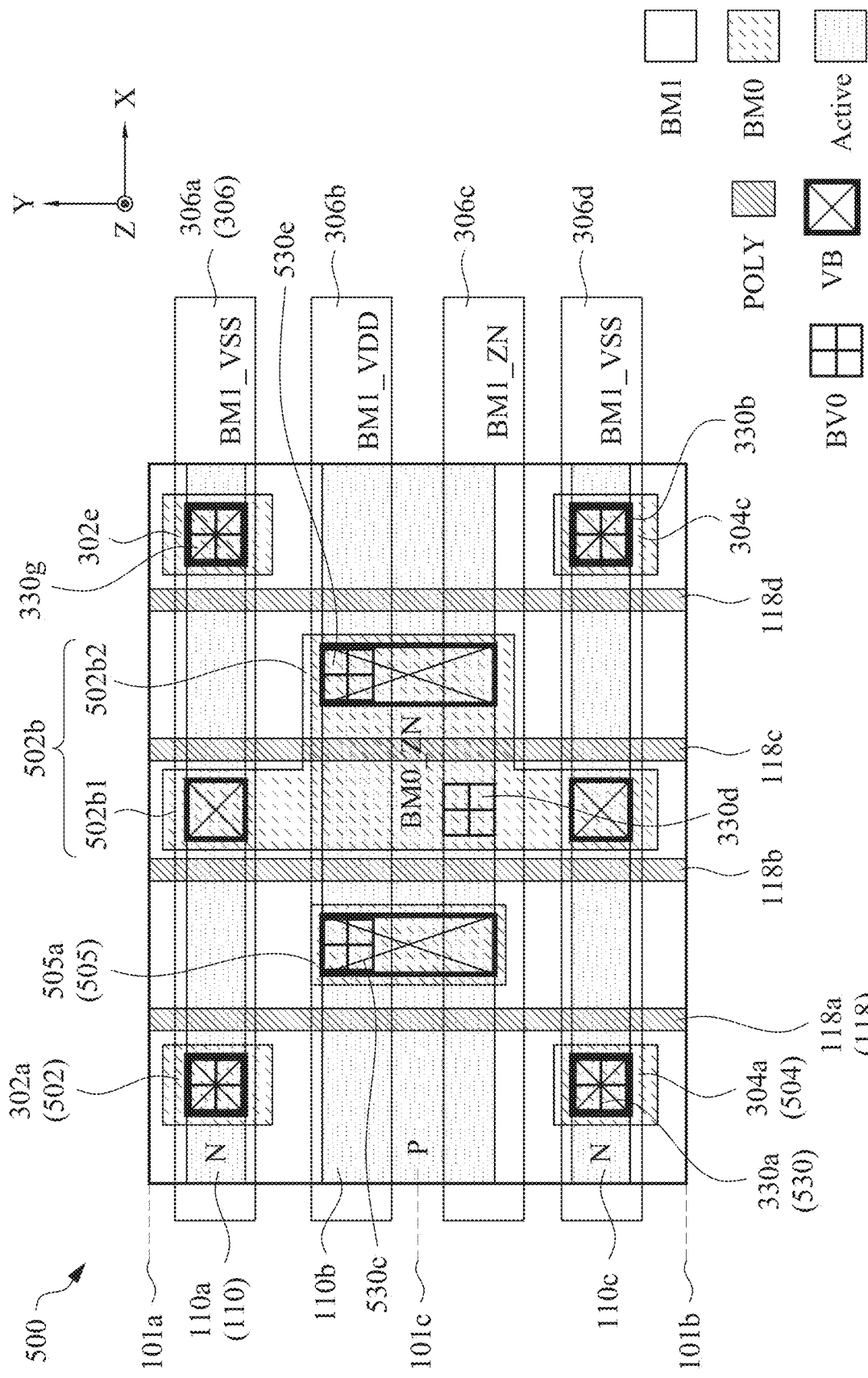
FIGS. 5A-5B are diagrams of a layout design of an integrated circuit, in accordance with some embodiments.
Figure 5B:
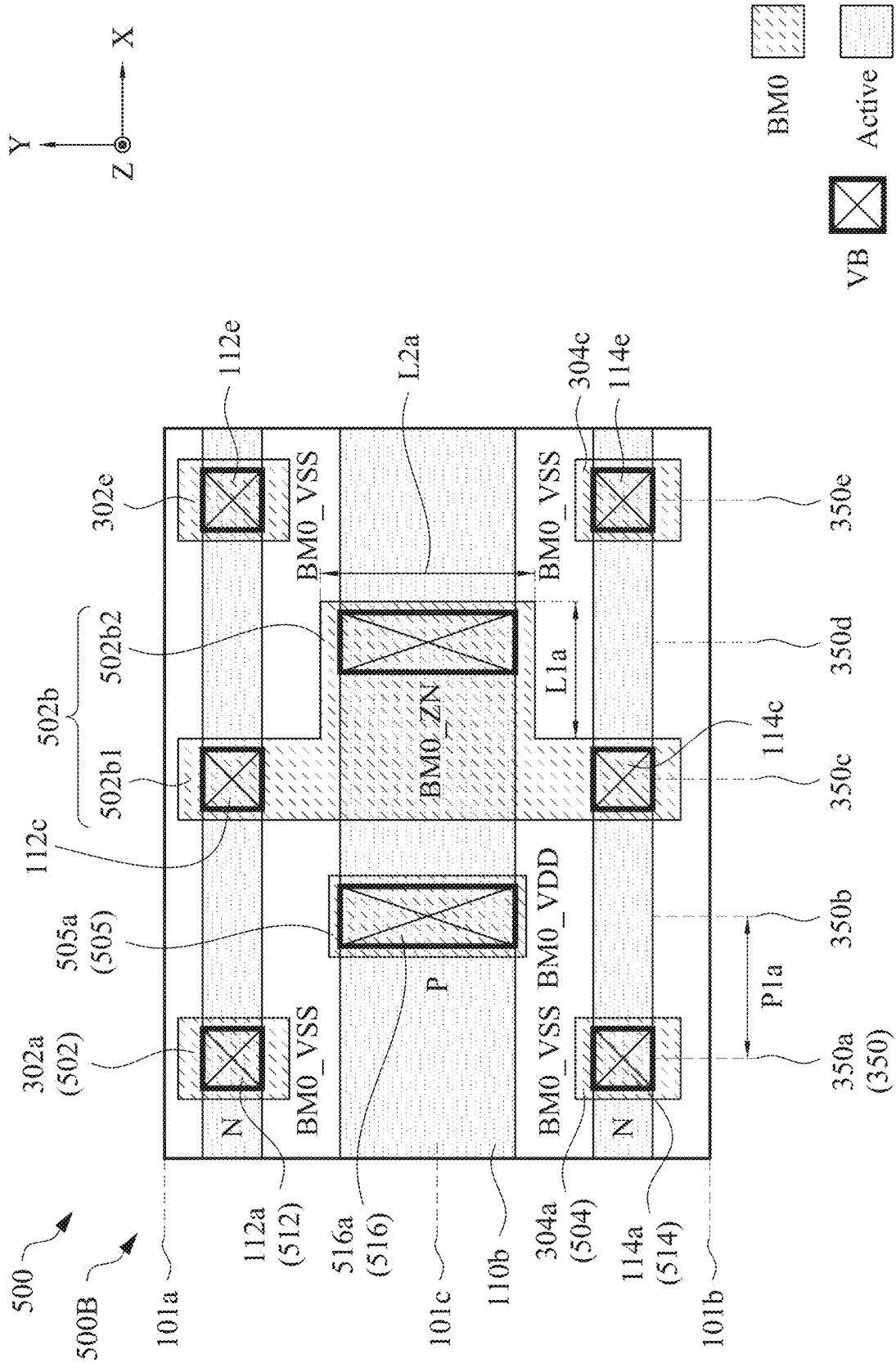

FIGS. 5A-5B are diagrams of a layout design 500 of an integrated circuit, in accordance with some embodiments. Layout design 500 is a layout diagram of integrated circuit 600 of FIGS. 6A-6C.

FIG. 5B is a diagram of a corresponding portion 500B of layout design 500 of FIG. 5A, simplified for ease of illustration. FIG. 5A is a diagram of layout design 500 and includes portion 500B, simplified for ease of illustration.

For ease of illustration, some of the labeled elements of FIGS. 5A-5B are not labelled in FIGS. 5A-5B. In some embodiments, layout design 500 includes additional elements not shown in FIGS. 5A-5B.

Portion 500B includes one or more features of layout design 500 of FIG. 5A of the OD level, the VB level and the BM0 level of layout design 100. Portion 500B is a variation of portion 100B of FIG. 1B or portion 300B of FIG. 3B, and similar detailed description is therefore omitted. For example, in comparison with portion 300B of FIG. 3B, set of conductive patterns 502, 504 and 505 of portion 500B replace set of conductive patterns 302, 304 and 305, and set of via patterns 512, 514 and 516 of portion 500B replace set of via patterns 112, 114 and 116, and similar detailed description is therefore omitted.

Layout design 500 includes one or more features of the OD level, the gate (POLY) level, the BM0, the BM1, and the VB level.

Figure 6A:
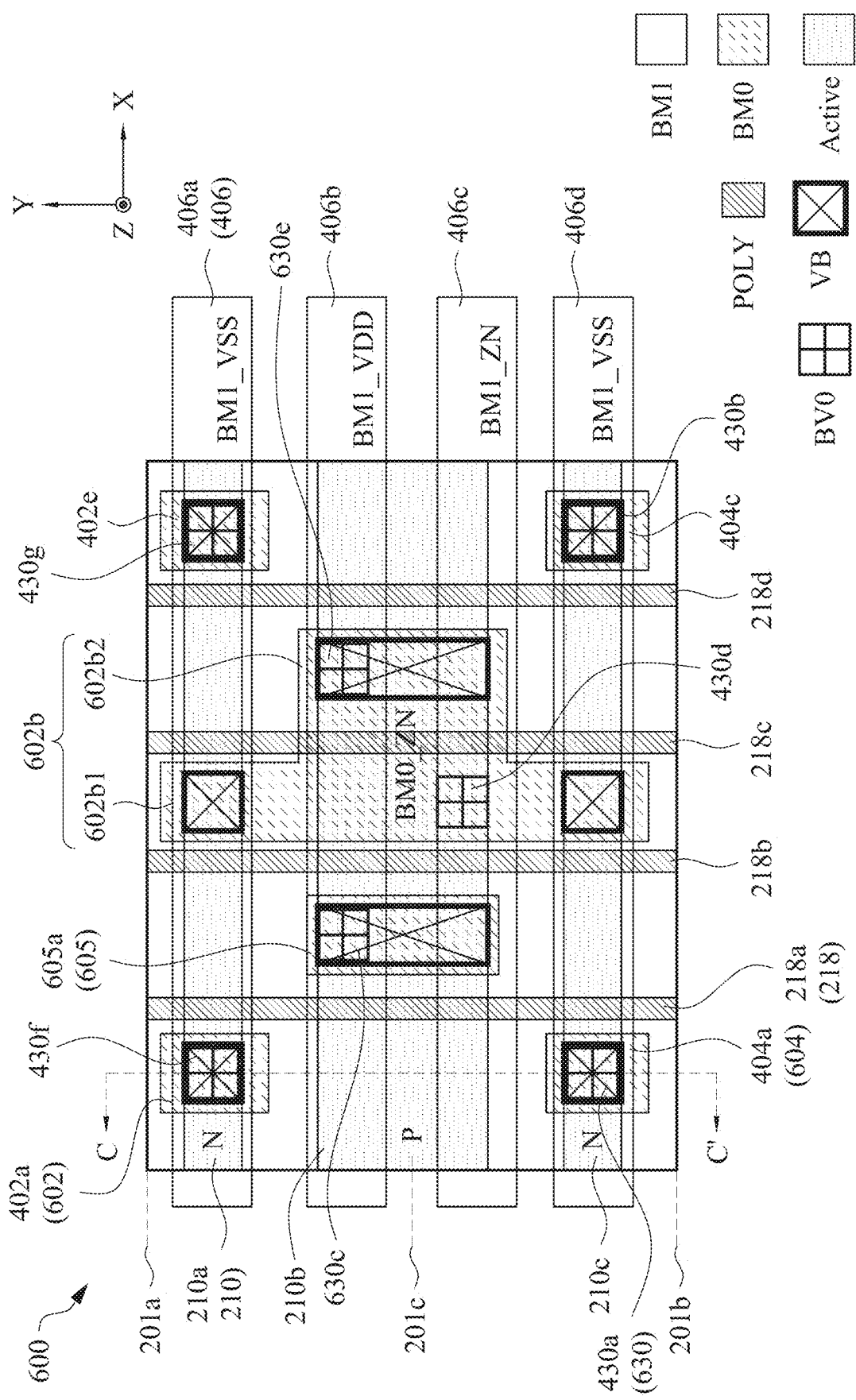
FIGS. 6A-6C are diagrams of an integrated circuit, in accordance with some embodiments.
Figure 6B:
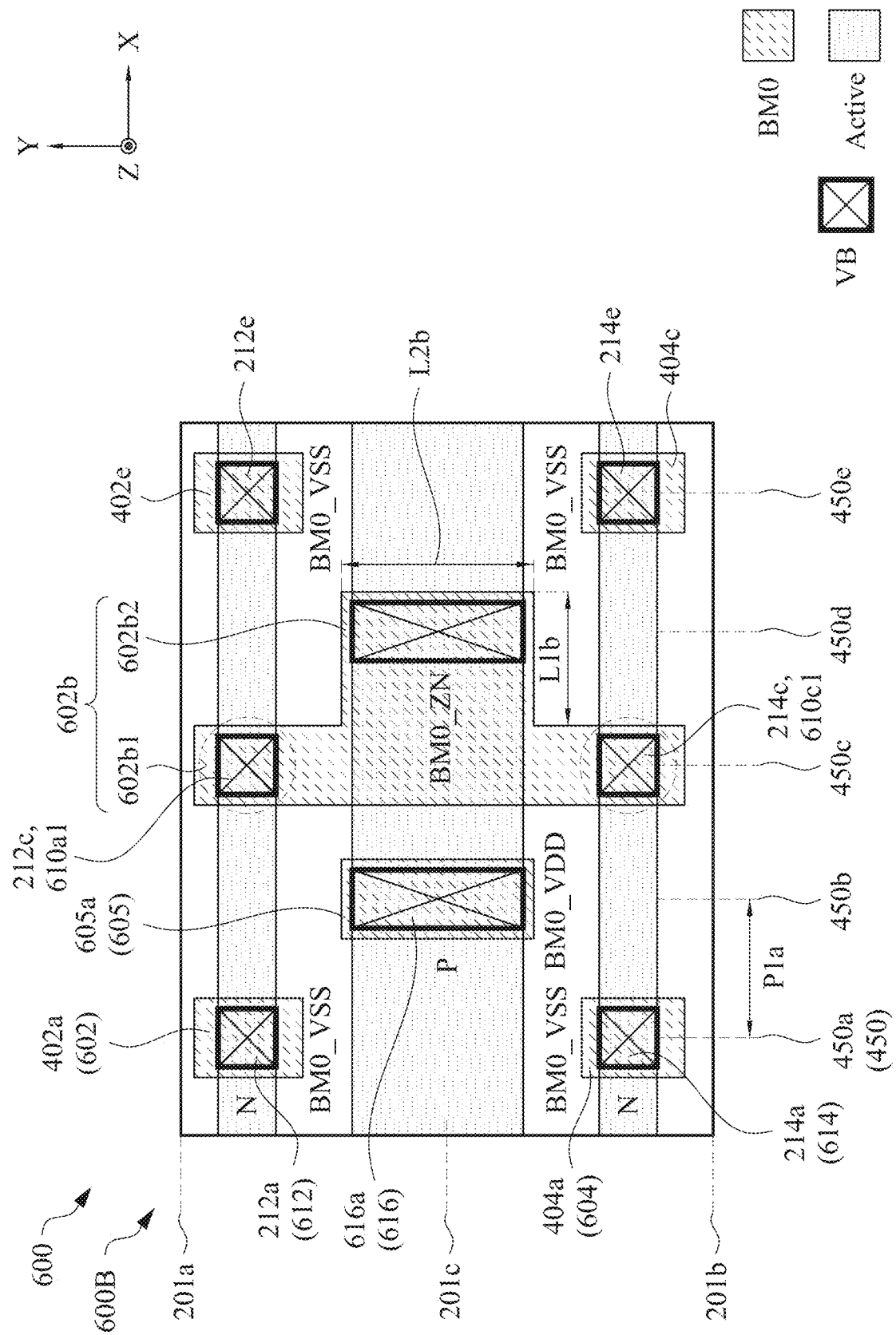
Figure 6C:
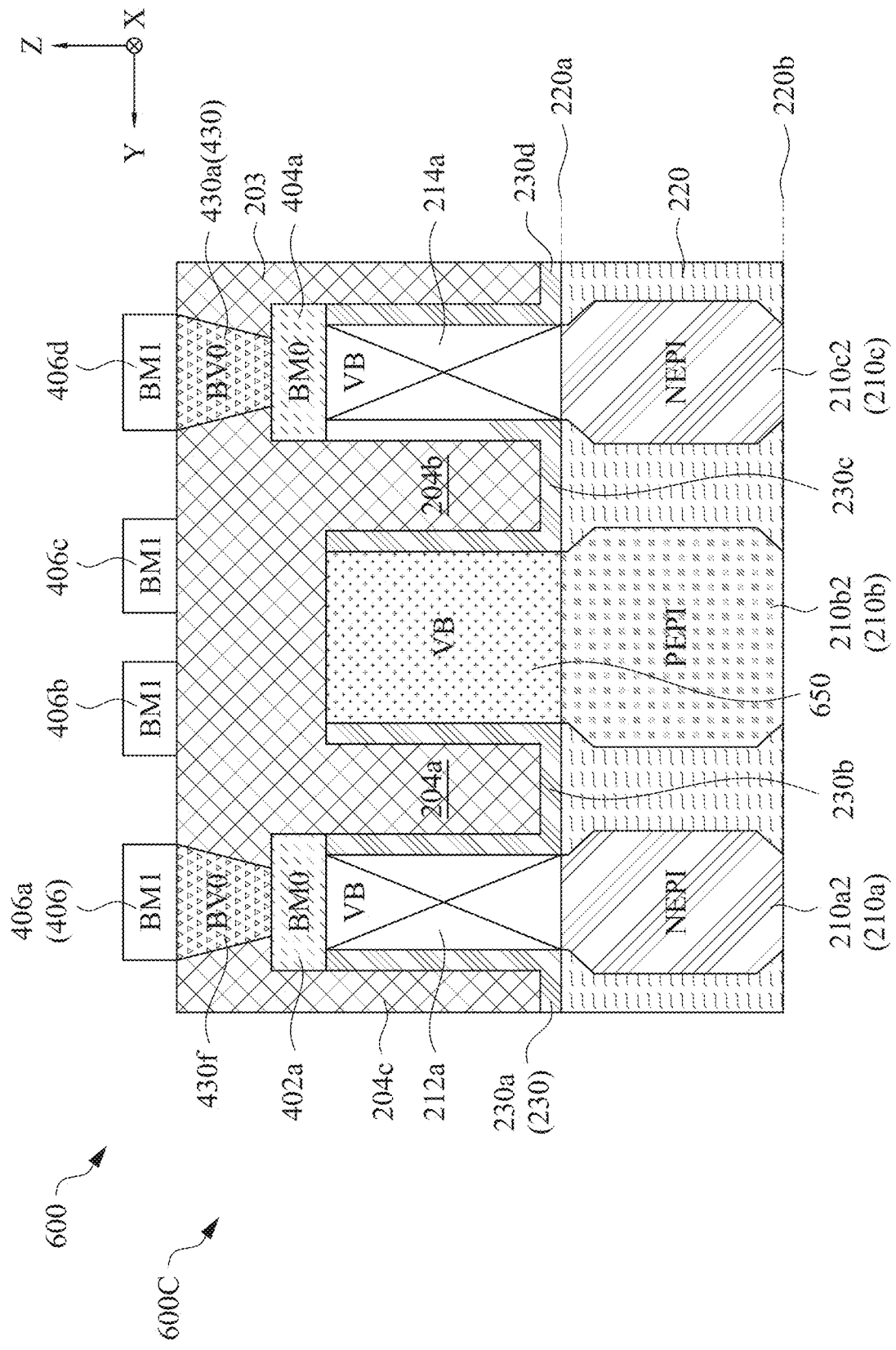

Layout design 500 is usable to manufacture integrated circuit 600 of FIGS. 6A-6C.

Layout design 500 is a variation of layout design 300 (FIGS. 3A-3B). For example, layout design 500 illustrates an example of where the set of conductive patterns 502, 504 and 505 and set of conductive patterns 306 are used for extra routing resources to electrically couple at least a pair of active regions manufactured by the set of active region patterns 110.

In comparison with layout design 300 of FIGS. 3A-3B, set of conductive patterns 502, 504 and 505 of layout design 500 replace corresponding set of conductive patterns 302, 304 and 305, and set of via patterns 512, 514 and 516 of layout design 300 replace corresponding set of via patterns 112, 114 and 116, and similar detailed description is therefore omitted.

Layout design includes set of conductive patterns 502, set of conductive patterns 504, set of conductive patterns 505, set of conductive patterns 506, set of active region pattern 210, set of via patterns 512, set of via patterns 514, set of via patterns 516, set of gate patterns 218 and a set of via patterns 530.

In comparison with set of conductive patterns 302 of FIGS. 3A-3B, set of conductive patterns 502 includes one or more of conductive patterns 302a, 502b or 302e, and similar detailed description is therefore omitted.

The set of conductive patterns 502 is usable to manufacture a corresponding set of conductors 602 of integrated circuit 600 (FIGS. 6A-6C). In some embodiments, conductive pattern 302a, 502b or 302e is usable to manufacture corresponding conductor 402a, 602b or 402e of the set of conductors 602 (FIGS. 6A-6C) of integrated circuit 600.

Conductive pattern 502b is similar to conductive pattern 302b or 302d, and similar detailed description is therefore omitted.

Conductive pattern 502b includes conductive pattern portion 502b1 and 502b2. Conductive pattern portion 502b1 is similar to conductive pattern 302b, but at a different position, and similar detailed description is therefore omitted. For example, in some embodiments, conductive pattern portion 502b1 is shifted by pitch P1a in the first direction X from conductive pattern 302b. Stated differently, conductive pattern portion 502b1 is where conductive pattern 305b of FIG. 3B overlapped active region pattern 210b.

Conductive pattern portion 502b1 overlaps via pattern 112c and via pattern 114c. Conductive pattern portion 502b1 overlaps the set of active region patterns 110.

Conductive pattern portion 502b2 overlaps via pattern 516b. Conductive pattern portion 502b2 overlaps active region pattern 110b.

In some embodiments, conductive pattern portions 502b1 and 502b2 are part of a same continuous conductive pattern. In some embodiments, conductive pattern 502b is referred to as a 2D conductive pattern. In some embodiments, conductive pattern portions 502b1 and 502b2 and conductive pattern 505a are part of a same continuous conductive pattern.

In some embodiments, at least conductive pattern portion 502b2 has a length L1a in the first direction X and a length L2a in the second direction Y.

In some embodiments, relative to a plane corresponding to the X-axis and the Y-axis, at least conductive pattern portion 502b2 has a rectangular shape. In some embodiments, the length L1a ranges from about 0.5 center poly pitch (CPP) to 2.0 CPP. In some embodiments, the length L1b ranges from about W6a to about 2.0*W6a. In some embodiments, the length L1b ranges from about W5a to about 2.0*W5a. In some embodiments, the CPP ranges from about 20 nm to about 100 nm. In some embodiments, a length L1b of conductive pattern portion 502b2 ranges from about 12 nm to about 25 nm. In some embodiments, if the length L1b of conductive pattern portion 502b2 is less than 12 nm, then an area of via landing spots on conductive pattern portion 502b2 is too small resulting in increased resistance and low manufacturing yield. In some embodiments, if the length L1b of conductive pattern portion 502b2 is greater than 25 nm, an occupied area of the IC or chip is increased, thereby resulting in a lower production yield.

Other lengths, widths and shapes of conductive pattern portion 502b2 are in the scope of the present disclosure.

In some embodiments, by including at least conductive pattern portion 502b1 or 502b2 in the set of conductive patterns 502, layout design 500 offers more routing flexibility and more via landing spots and increases routing resources compared to other approaches.

In some embodiments, by overlapping active region pattern 210b, at least conductive pattern portion 502b1 or 502b2 in the set of conductive patterns 502 offers more routing flexibility, more via landing spots to active region pattern 210b and increases routing resources compared to other approaches.

In comparison with set of conductive patterns 304 of FIGS. 3A-3B, set of conductive patterns 504 includes one or more conductive patterns 304a or 304c, and similar detailed description is therefore omitted.

The set of conductive patterns 504 is usable to manufacture a corresponding set of conductors 604 of integrated circuit 600 (FIGS. 6A-6C). In some embodiments, conductive pattern 304a or 304c is usable to manufacture corresponding conductor 404a or 404c of the set of conductors 604 (FIGS. 6A-6C) of integrated circuit 600.

In comparison with set of conductive patterns 305 of FIGS. 3A-3B, set of conductive patterns 505 includes one or more of conductive patterns 505a, and similar detailed description is therefore omitted. Conductive pattern 505a is similar to conductive pattern 305a or 305b, but at a different position, and similar detailed description is therefore omitted. For example, in some embodiments, conductive pattern 505a is shifted by pitch P1a in the first direction X from conductive pattern 305a. Stated differently, conductive pattern 505a is where conductive pattern 302b of FIG. 3B overlapped active region pattern 210b.

The set of conductive patterns 505 is usable to manufacture a corresponding set of conductors 605 of integrated circuit 600 (FIGS. 6A-6C). In some embodiments, conductive pattern 505a is usable to manufacture corresponding conductor 605a of the set of conductors 605 (FIGS. 6A-6C) of integrated circuit 600.

In comparison with set of via patterns 112 of FIGS. 3A-3B, set of via patterns 512 includes one or more of via patterns 112a, 112c or 112e, and similar detailed description is therefore omitted.

The set of via patterns 512 is usable to manufacture a corresponding set of vias 612 (FIGS. 6A-6C).

In comparison with set of via patterns 114 of FIGS. 3A-3B, set of via patterns 514 includes one or more of via patterns 114a, 114c or 114e, and similar detailed description is therefore omitted.

The set of via patterns 514 is usable to manufacture a corresponding set of vias 614 (FIGS. 6A-6C).

In comparison with set of via patterns 116 of FIGS. 3A-3B, set of via patterns 516 includes one or more of via patterns 516a or 516b, and similar detailed description is therefore omitted. Via pattern 516a is similar to via pattern 116a, but at a different position, and similar detailed description is therefore omitted. For example, in some embodiments, via pattern 516a is shifted by pitch P1a in the first direction X from via pattern 116a. Stated differently, via pattern 516a is where conductive pattern 505a overlaps active region pattern 210b.

Via pattern 516b is similar to via pattern 116b, but at a different position, and similar detailed description is therefore omitted. For example, in some embodiments, via pattern 516b is shifted by pitch P1a in the first direction X from via pattern 116b. Stated differently, via pattern 516b is where conductive pattern portion 502b2 overlaps active region pattern 210b.

The set of via patterns 516 is usable to manufacture a corresponding set of vias 616 (FIGS. 6A-6C). In some embodiments, via patterns 516a or 516b of the set of via patterns 516 are usable to manufacture corresponding vias 616a or 616b of the set of vias 616 (FIGS. 6A-6C) of integrated circuit 600.

Other configurations, arrangements on other layout levels or quantities of patterns in the set of conductive patterns 502, 504, 505 or 306 are within the scope of the present disclosure.

In comparison with set of via patterns 330 of FIGS. 3A-3B, set of via patterns 530 includes one or more of via patterns 330a, 330b, 330d, 330f, 330g, 530c or 530c, and similar detailed description is therefore omitted. The set of via patterns 530 is usable to manufacture a corresponding set of vias 630 (FIGS. 6A-6C).

Via pattern 530c is similar to via pattern 330c, but at a different position, and similar detailed description is therefore omitted. For example, in some embodiments, via pattern 530c is shifted by pitch P1a in the first direction X from via pattern 330c. Stated differently, via pattern 530c is where conductive pattern 306b overlaps conductive pattern 505a.

Via pattern 530e is similar to via pattern 330e, but at a different position, and similar detailed description is therefore omitted. For example, in some embodiments, via pattern 530e is shifted by pitch P1a in the first direction X from via pattern 330e. Stated differently, via pattern 530e is where conductive pattern 306b overlaps conductive pattern portion 502b2.

Other configurations, arrangements on other layout levels or quantities of patterns in the set of via patterns 512, 514, 516, 530 are within the scope of the present disclosure.

Other configurations, arrangements on other layout levels or quantities of patterns for layout design 500 are within the scope of the present disclosure.

FIGS. 6A-6C are diagrams of an integrated circuit 600, in accordance with some embodiments.

FIG. 6A is a top view of integrated circuit 600, in accordance with some embodiments. FIG. 6B is a diagram of a corresponding portion 600B of integrated circuit 600 of FIG. 6A, simplified for case of illustration. FIG. 6A is a diagram of integrated circuit 600 and includes portion 600B, simplified for case of illustration.

FIG. 6C is a cross-sectional view of integrated circuit 600, in accordance with some embodiments. FIG. 6C is a cross-sectional view of integrated circuit 600 as intersected by plane C-C', in accordance with some embodiments.

Integrated circuit 600 is manufactured by layout design 500. Structural relationships including alignment, lengths and widths, as well as configurations and layers of integrated circuit 600 are similar to the structural relationships and configurations and layers of layout design 500 of FIGS. 5A-5B, and similar detailed description will not be described in at least FIGS. 6A-6C, for brevity. For example, in some embodiments, at least length L1a or L2a, pitch P1a, or height H1a of layout design 500 is similar to corresponding length L1b or L2b, pitch P1b, or height H1b of integrated circuit 600, and similar detailed description is omitted for brevity.

Integrated circuit 600 includes at least the set of conductors 602, the set of conductors 604, the set of conductors 605, the set of conductors 406, the set of active regions 210, the set of vias 612, the set of vias 614, the set of vias 616, the set of gates 218 and the set of vias 630.

In some embodiments, portion 600C of integrated circuit 600 is a variation of portion 200C of integrated circuit 200 of FIG. 2C or portion 400C of integrated circuit 400 of FIGS. 4A-4C, and similar detailed description is omitted for brevity.

In comparison with portion 400C of integrated circuit 400, via 216a of FIG. 4C is replaced with region 650, and similar detailed description is omitted for brevity. In some embodiments, region 650 is similar to region 250, and similar detailed description is omitted for brevity.

In comparison with portion 400C of integrated circuit 400, portion 600C of integrated circuit 600 does not include conductor 405a and via 430c, and similar detailed description is omitted for brevity. In some embodiments, in comparison with portion 400C of integrated circuit 400, conductor 405*a* is replaced with a hard mask similar to hard mask 222*a*, and similar detailed description is omitted for brevity.

In comparison with set of conductors 402 of FIGS. 4A-4B, set of conductors 602 includes one or more of conductors 402*a*, 602*b* or 402*e*, and similar detailed description is therefore omitted.

Conductor 602*b* is similar to conductor 402*b* or 402*d*, and similar detailed description is therefore omitted.

Conductor 602*b* includes conductor portions 602*b*1 and 602*b*2. Conductor portion 602*b*1 is similar to conductor 402*b*, but at a different position, and similar detailed description is therefore omitted. For example, in some embodiments, conductor portion 602*b*1 is shifted by pitch P1b in the first direction X from conductor 402*b*. Stated differently, conductor portion 602*b*1 is where conductor 405*b* of FIG. 3B overlapped active region 210*b*.

Conductor portion 602*b*1 overlaps via 212*c* and via 214*c*. Conductor portion 602*b*1 overlaps the set of active regions 210. In some embodiments, vias 212*c* and 214*c* electrically couple conductor portion 602*b*1 and corresponding active regions 210*a* and 210*c* to each other.

Conductor portion 602*b*2 overlaps via 616*b* and active region 210*b*. In some embodiments, via 616*b* electrically couples conductor portion 602*b*2 and active region 210*b* to each other.

In some embodiments, conductor 602*b* electrically couples active regions 610*a*1, 610*b*1 and 610*c*1 together by corresponding vias 212*c*, 216*b* and 214*c*, resulting in additional routing resources and more via landing spots compared to other approaches. In some embodiments, active region 610*a*1 is a drain or source of a first NMOS transistor, active region 610*b*1 is a drain or source of a first PMOS transistor and active region 610*c*1 is a drain or source of a second NMOS transistor, and conductor 602*b* and vias 212*c*, 216*b* and 214*c* electrically couples the drain or source regions of the first NMOS transistor, the second NMOS transistor and the first PMOS transistor together.

In some embodiments, conductor portions 602*b*1 and 602*b*2 are part of a same continuous conductor. In some embodiments, conductor 602*b* is referred to as a 2D conductor. In some embodiments, conductor portions 602*b*1 and 602*b*2 and conductor 605*a* are part of a same continuous conductor.

In some embodiments, at least conductor portion 602*b*2 has a length L1b in the first direction X and a length L2b in the second direction Y.

In some embodiments, relative to a plane corresponding to the X-axis and the Y-axis, at least conductor portion 602*b*2 has a rectangular shape. In some embodiments, the length L2a ranges from about 0.5 CPP to 2.0 CPP. In some embodiments, the length L2b ranges from about W6a to about 2.0*W6b. In some embodiments, the length L2b ranges from about W5a to about 2.0*W5b. In some embodiments, the CPP ranges from about 20 nm to about 100 nm. Other lengths, widths and shapes of conductor portion 602*b*2 are in the scope of the present disclosure.

In some embodiments, by including at least conductor portion 602*b*1 or 602*b*2 in the set of conductors 602, integrated circuit 600 offers more routing flexibility and more via landing spots and increases routing resources compared to other approaches.

In some embodiments, by overlapping active region 210*b*, at least conductor portion 602*b*1 or 602*b*2 in the set of conductors 602 offers more routing flexibility, more via landing spots to active region 210*b* and increases routing resources compared to other approaches.

In comparison with set of conductors 404 of FIGS. 4A-4B, set of conductors 604 includes one or more of conductors 404*a* or 404*c*, and similar detailed description is therefore omitted.

In comparison with set of conductors 405 of FIGS. 4A-4B, set of conductors 605 includes one or more of conductors 605*a*, and similar detailed description is therefore omitted. Conductor 605*a* is similar to conductor 405*a* or 405*b*, but at a different position, and similar detailed description is therefore omitted. For example, in some embodiments, conductor 605*a* is shifted by pitch P1b in the first direction X from conductor 405*a*. Stated differently, conductor 605*a* is where conductor 402*b* of FIG. 4B overlapped active region 210*b*.

In some embodiments, conductor 605*a* is electrically coupled to active region 210*b* by via 516*a*.

In comparison with set of vias 212 of FIGS. 4A-4B, set of vias 612 includes one or more of vias 212*a*, 212*c* or 212*e*, and similar detailed description is therefore omitted.

In comparison with set of vias 214 of FIGS. 4A-4B, set of vias 614 includes one or more of vias 214*a*, 214*c* or 214*c*, and similar detailed description is therefore omitted.

In comparison with set of vias 216 of FIGS. 4A-4B, set of vias 616 includes one or more of vias 616*a* or 616*b*, and similar detailed description is therefore omitted. Via 616*a* is similar to via 216*a*, but at a different position, and similar detailed description is therefore omitted. For example, in some embodiments, via 616*a* is shifted by pitch P1b in the first direction X from via 216*a*. Stated differently, via 616*a* is where conductor 605*a* overlaps active region 210*b*.

Via 616*b* is similar to via 216*b*, but at a different position, and similar detailed description is therefore omitted. For example, in some embodiments, via 616*b* is shifted by pitch P1b in the first direction X from via 216*b*. Stated differently, via 616*b* is where conductor portion 602*b*2 overlaps active region 210*b*. Via 616*b* is between conductor portion 602*b*2 and active region 210*b*.

In comparison with set of vias 430 FIGS. 4A-4C, set of vias 630 includes one or more of vias 430*a*, 430*b*, 430*d*, 430*f*, 430*g*, 630*c* or 630*e*, and similar detailed description is therefore omitted.

Via 630*c* is similar to via 430*c*, but at a different position, and similar detailed description is therefore omitted. For example, in some embodiments, via 630*c* is shifted by pitch P1a in the first direction X from via 430*c*. Stated differently, via 630*c* is where conductor 406*b* overlaps conductor 605*a*.

Via 630*e* is similar to via 430*e*, but at a different position, and similar detailed description is therefore omitted. For example, in some embodiments, via 630*e* is shifted by pitch P1a in the first direction X from via 430*c*. Stated differently, via 630*e* is where conductor 406*b* overlaps conductive portion 602*b*2.

Other configurations, arrangements on other layout levels or quantities of conductors in the set of conductors 602, 604, 605 or 306 are within the scope of the present disclosure.

Other configurations, arrangements on other layout levels or quantities of vias in the set of vias 612, 614, 616 are within the scope of the present disclosure.

Other configurations, arrangements on other layout levels or quantities of structures for integrated circuit 600 are within the scope of the present disclosure.

FIG. 7A is a functional flow chart of a method of manufacturing an IC device, in accordance with some embodiments. It is understood that additional operations may be performed before, during, and/or after the method 700A depicted in FIG. 7A, and that some other processes may only be briefly described herein.

In some embodiments, other order of operations of method 700A is within the scope of the present disclosure. Method 700A includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 700A, 700B, 900 or 1000 is not performed.

In some embodiments, method 700A is an embodiment of operation 904 of method 900. In some embodiments, the method 700A is usable to manufacture or fabricate at least integrated circuit 200, 400, 600 or 800 or an integrated circuit with similar features as at least layout design 100, 300 or 500. In some embodiments, other order of operations of method 700A is within the scope of the present disclosure. Method 700A includes exemplary operations, but the operations are not necessarily performed in the order shown. Operations may be added, replaced, changed order, and/or eliminated as appropriate, in accordance with the spirit and scope of disclosed embodiments.

In operation 702 of method 700A, a first set of transistors is fabricated in a semiconductor wafer or substrate. In some embodiments, the first set of transistors of method 700A includes one or more transistors in the set of active regions 210.

In some embodiments, operation 702 includes fabricating source and drain regions of the first set of transistors in a first well. In some embodiments, the first well comprises p-type dopants. In some embodiments, the p-type dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm$^3$ to $1\times10^{14}$ atoms/cm$^3$.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^2$ to about $1\times10^{14}$ atoms/cm$^2$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (cpi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (cpi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 702 further includes forming contacts (not shown) of the first set of transistors. In some embodiments, operation 702 further includes forming a gate region of the first set of transistors. In some embodiments, the gate region is between the drain region and the source region. In some embodiments, the gate region is over the first well and the substrate. In some embodiments, fabricating the gate regions of operation 702 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 704 of method 700A, thinning is performed on the back-side of the wafer or substrate. In some embodiments, operation 704 includes a thinning process performed on the back-side of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside of the semiconductor wafer or substrate.

In operation 706 of method 700A, a first set of conductive structures is deposited on a first level of the back-side of the wafer or substrate. In some embodiments, operation 706 includes at least depositing a first set of conductive regions over the back-side of the integrated circuit.

In some embodiments, the first set of conductive regions of method 700A includes at least portions of one or more of the set of conductors 204.

In operation 708 of method 700A, a first set of vias are fabricated in a back-side of the wafer or substrate opposite from the front-side. In some embodiments, operation 706 includes forming a first set of self-aligned contacts (SACs) in an insulating layer over the back-side of the wafer. In some embodiments, the first set of vias of method 700A includes at least portions of one or more of the set of vias 212, 214, 216, 612, 614 or 616.

In operation 710 of method 700A, a second set of conductive structures is deposited on a second level of the back-side of the wafer or substrate. In some embodiments, operation 710 further includes forming a set of power rails.

In some embodiments, the second set of conductive structures of method 700A includes at least portions of one or more of the set of conductors 202 of FIGS. 2A-2C.

In some embodiments, the set of conductive structures of method 700A includes at least portions of one or more of the set of conductors 402, 404, 405 of FIGS. 4A-4C or the set of conductors 602, 604, 605 of FIGS. 6A-6C. In some embodiments, operation 710 further includes at least electrically connecting the second set of conductive structures to the set of active regions by the first set of vias, or electrically connecting the second set of conductive structures to a set of gates by the first set of vias.

In operation 712 of method 700A, a second set of vias are fabricated in the back-side of the wafer or substrate.

In some embodiments, the second set of vias of method 700A includes at least portions of one or more of the set of vias 208. In some embodiments, the second set of vias of method 700A includes at least portions of one or more vias of the set of vias 430 or 630.

In some embodiments, operation 712 includes forming a second set of self-aligned contacts (SACs) in the insulating layer over the back-side of the wafer.

In operation 714 of method 700A, a third set of conductive structures is deposited on a third level of the back-side of the wafer.

In some embodiments, the third set of conductive structures of method 700A includes at least portions of one or more of the set of conductors 206. In some embodiments, operation 714 further includes electrically coupling the third set of conductive structures to the first set of conductive structures by the second set of vias.

In some embodiments, the third set of conductive structures of method 700A includes at least portions of one or more of the set of conductors 406.

In some embodiments, one or more of operations 706, 708, 710, 712 or 714 of method 700A include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 12:
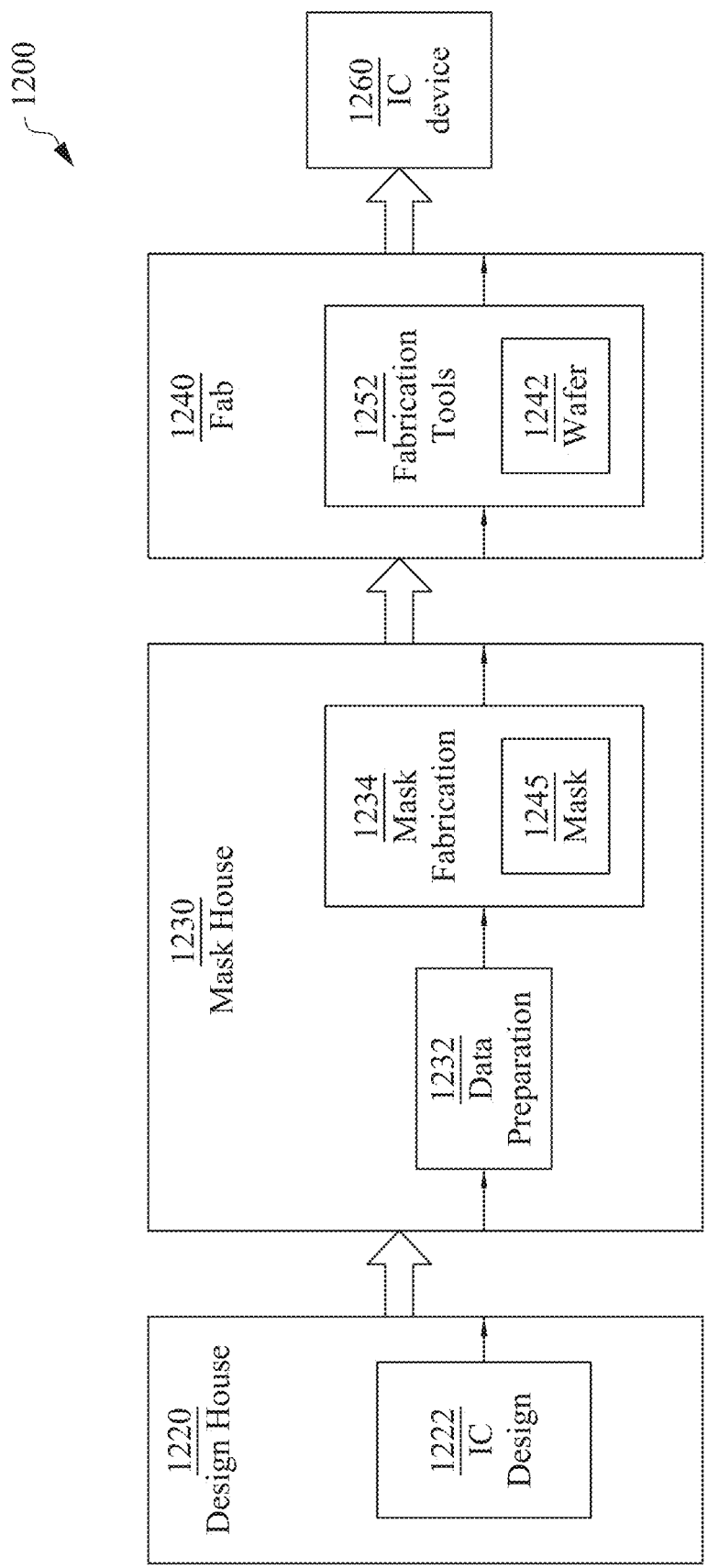
FIG. 12 is a block diagram of an IC manufacturing system, and an IC manufacturing flow associated therewith, in accordance with at least one embodiment of the present disclosure.

In some embodiments, at least one or more operations of method 700A is performed by system 1200 of FIG. 12. In some embodiments, at least one method(s), such as method 700A discussed above, is performed in whole or in part by at least one manufacturing system, including system 1200. One or more of the operations of method 700A is performed by IC fab 1240 (FIG. 12) to fabricate IC device 1260. In some embodiments, one or more of the operations of method 700A is performed by fabrication tools 1252 to fabricate wafer 1242.

In some embodiments, one or more of the operations of method 700A, 700B, 900 or 1000 is not performed.

One or more of the operations of methods 900-1000 is performed by a processing device configured to execute instructions for manufacturing an integrated circuit, such as integrated circuit 200, 400, 600 or 800. In some embodiments, one or more operations of methods 900-1000 is performed using a same processing device as that used in a different one or more operations of methods 900-1000. In some embodiments, a different processing device is used to perform one or more operations of methods 900-1000 from that used to perform a different one or more operations of methods 900-1000. In some embodiments, other order of operations of method 700A, 700B, 900 or 1000 is within the scope of the present disclosure. Method 700A, 700B, 900 or 1000 includes exemplary operations, but the operations are not necessarily performed in the order shown. Operations in method 700A, 700B, 900 or 1000 may be added, replaced, changed order, and/or eliminated as appropriate, in accordance with the spirit and scope of disclosed embodiments.

FIG. 7B is a flow chart showing a method 700B of fabricating the backside routing tracks and backside via connectors, in accordance with some embodiments.

In some embodiments, method 700B is an embodiment of operations 706 and 708 of method 700A. Examples of the backside routing tracks and backside via connectors fabricated with the process 700 include the set of conductors (e.g., 204) and the backside via connectors (e.g., set of vias 212, 214 and 216, VB) as shown in FIGS. 2A-2C. FIGS. 8A-8E are cross-sectional views of intermediate device structures obtained when fabricating the backside routing tracks and the backside via connector for connecting a backside routing track with a source/drain terminal of a transistor, in accordance with some embodiments. In some embodiments, FIGS. 8A-8E are cross-sectional views of intermediate device structures of integrated circuit 200.

The device structures in FIGS. 8A-8E correspond to intermediate versions of integrated circuit 200 along line A-A1 of FIGS. 2A-2B.

In FIG. 7B, at process 720, the device structure for backside connections is prepared. At process 720, for preparing backside connections, active regions of the transistors in an integrated circuit, such as the channel regions and the source/drain regions, are isolated from each other by depositing dielectric materials onto the device structures from the backside of the integrated circuit. In some embodiments, the device structures prepared at the process 720 includes the device structures of FIG. 8A.

Figure 8C:
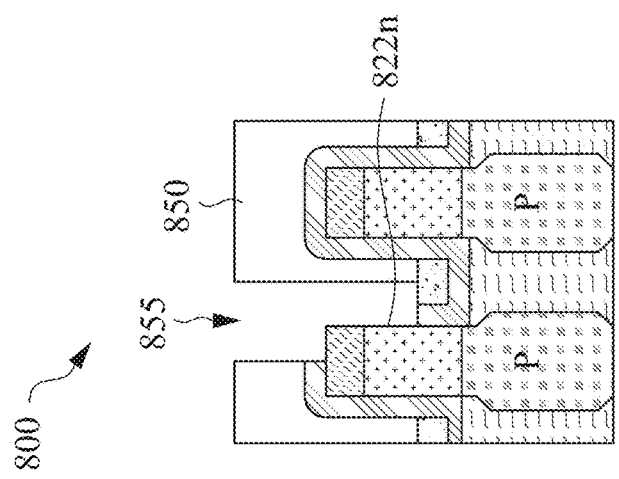
FIGS. 8A-8E are diagrams of intermediate versions of an integrated circuit, in accordance with some embodiments.
Figure 8B:
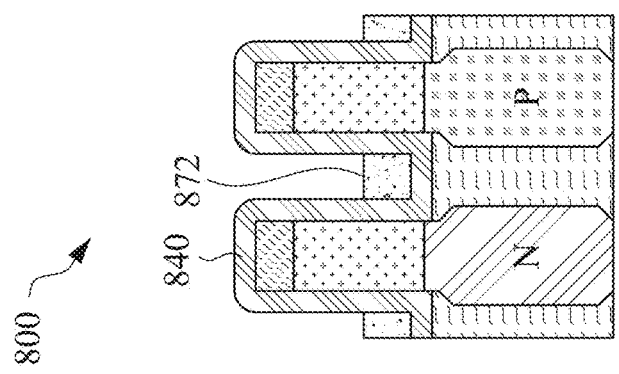
Figure 8A:
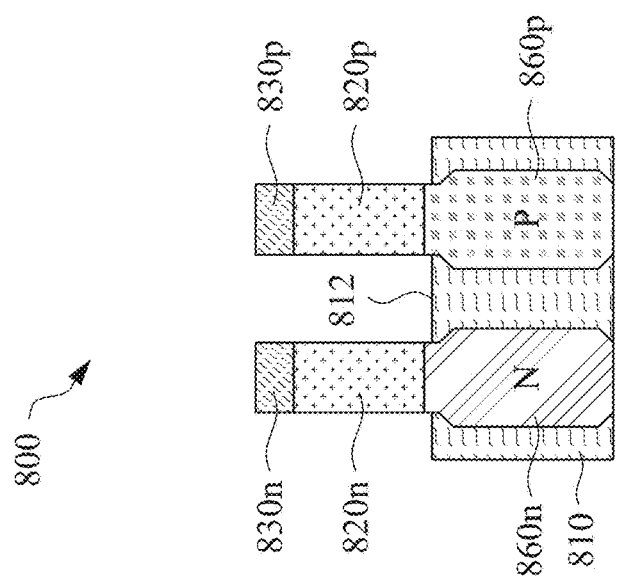

In the cross-sectional view of FIG. 8A, the source/drain region 860n of the n-type transistor is isolated from the source/drain region 860p of the p-type transistor by the isolation material 810. Dummy contact structures 820n and 820p contacting correspondingly the source/drain regions 860n and 860p are fabricated at the backside of the device structure. Dummy contact structures 820n and 820p are made of isolation materials. Hard masks 830n and 830p are fabricated covering correspondingly the dummy contact structures 820n and 820p. The isolation material 810 in areas between the dummy contact structures 820n and 820p are recessed to a level as indicated by the surface 812 of the isolation material 810.

In FIG. 7B, at process 722, conformal isolation material is deposited at the back of the device structure prepared at process 720. In FIG. 8B, the conformal isolation material 840 deposited at process 722 covers the exposed surfaces of the hard masks 830n and 830p, the sidewalls of the dummy contact structures 820n and 820p, and the recessed surface 812 of the isolation material 810.

After the process 722, a layer of isolation material is deposited at process 724 and covers the surfaces of the conformal isolation material. In FIG. 8B, the layer of isolation material 872 covers the conformal isolation material 840.

Then, at process 726, the conformal isolation material at selected locations is removed. The selected locations include portions of the sidewalls of the dummy contact structures. In FIG. 8C, the backside of the device structure is covered with a layer of photoresist (e.g., 850), and the photoresist in a window area (e.g., 855) as defined by a photomask is removed by photolithography techniques. In FIG. 8C, the window area 855 defines the location of a backside routing track for connecting with the source/drain region 860n of the n-type transistor through a backside via connector. During process 726, after the window areas in the photoresist layer for specifying the window area (e.g., 855) are generated, materials exposed within the window areas of the photoresist layer are removed with etching processes. In FIG. 8C, the conformal isolation material at the selected portion 822n of a sidewall on the dummy contact structure 820n is removed by the etching processes. In FIG. 8C, the layer of photoresist (e.g., 850) is striped off after the conformal isolation material at the selected portions of the sidewalls of the dummy contact structures is removed.

Figure 8E:
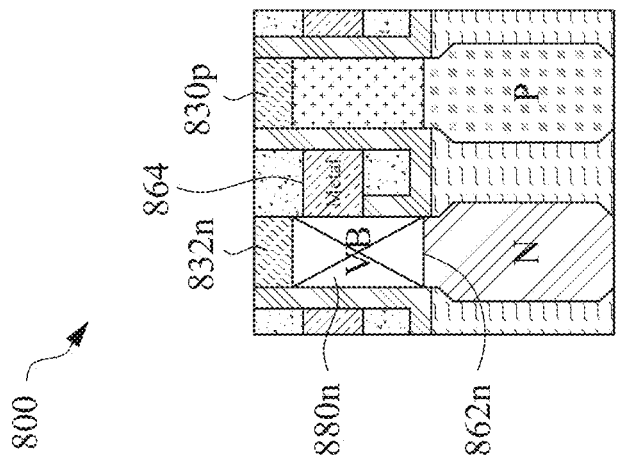
Figure 8D:
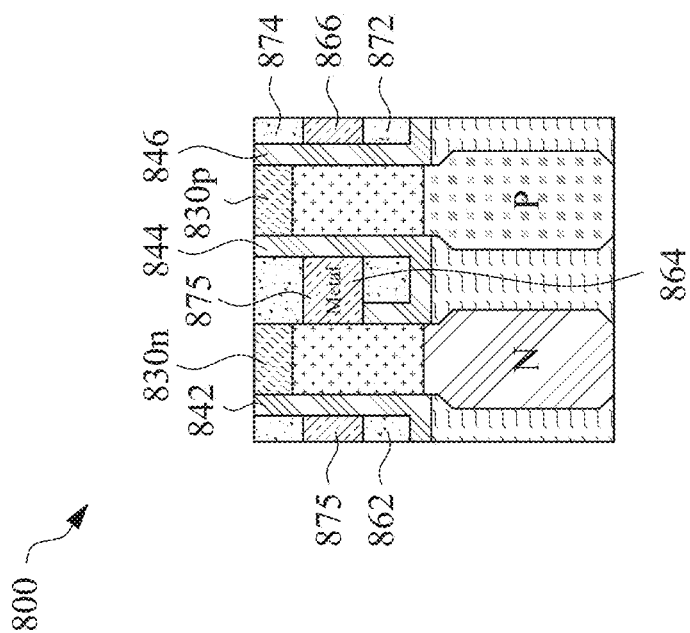

Next, at process 728, backside routing tracks are formed in a metal layer at the backside of the integrated circuit. In some embodiments, process 728 is an embodiment of operation 706 of method 700A. In some embodiments, process 728 includes depositing a first set of conductive structures on the back-side of the wafer on the first level. In FIG. 8D, the metal layer 875 is deposited overlying the isolation material 872, and the backside routing tracks (e.g., 862, 864, and 866) are formed. After the backside routing tracks are formed, another layer of isolation material 874 is deposited covering the backside routing tracks (e.g., 862, 864, and 866). In FIG. 8D, the conformal isolation material 840 includes isolation material 842, 844 and 846 after being processed.

Next, at process 730, backside via connectors are fabricated. In some embodiments, process 730 is an embodiment of operation 708 of method 700A. In some embodiments, process 730 includes fabricating a first set of vias on the back-side of the wafer. In FIG. 8E, the dummy structure 820n and the associated mask 830n are removed to expose a surface 862n of the source/drain region 860n of the n-type transistor. Then, conductive material such as metal is deposited to form the backside via connector 880n. The backside via connector 880n forms conductive contacts with both the backside routing track 864 and the source/drain region 860n of the n-type transistor. The backside via connector 880n is a backside via connector VBd for connecting a source/drain region of a transistor with a backside routing track.

In FIG. 8E, after the backside via connectors (e.g., 880n) are formed, protective covers (e.g., 832n) or hard masks are formed by depositing isolation materials over the backside via connectors.

In addition to the method 700B in FIG. 7B for fabricating the backside routing tracks and backside via connectors. There are also other embodiments of the method for fabricating the backside routing tracks and backside via connectors.

FIG. 9 is a flowchart of a method 900 of forming or manufacturing an integrated circuit in accordance with some embodiments. It is understood that additional operations may be performed before, during, and/or after the method 900 depicted in FIG. 9, and that some other operations may only be briefly described herein. In some embodiments, the method 900 is usable to form integrated circuits, such as 200, 400, 600 or 800. In some embodiments, the method 900 is usable to form integrated circuits having similar structural relationships as one or more of layout design 100, 300 or 500.

In operation 902 of method 900, a layout design of an integrated circuit is generated. Operation 902 is performed by a processing device (e.g., processor 1102 (FIG. 11)) configured to execute instructions for generating a layout design. In some embodiments, the layout design of method 900 includes one or more patterns of at least layout design 100, 300 or 500, or features similar to at least integrated circuit 200, 400, 600 or 800. In some embodiments, the layout design of the present application is in a graphic database system (GDSII) file format.

In operation 904 of method 900, the integrated circuit is manufactured based on the layout design. In some embodiments, operation 904 of method 900 comprises manufacturing at least one mask based on the layout design, and manufacturing the integrated circuit based on the at least one mask.

Figure 10:
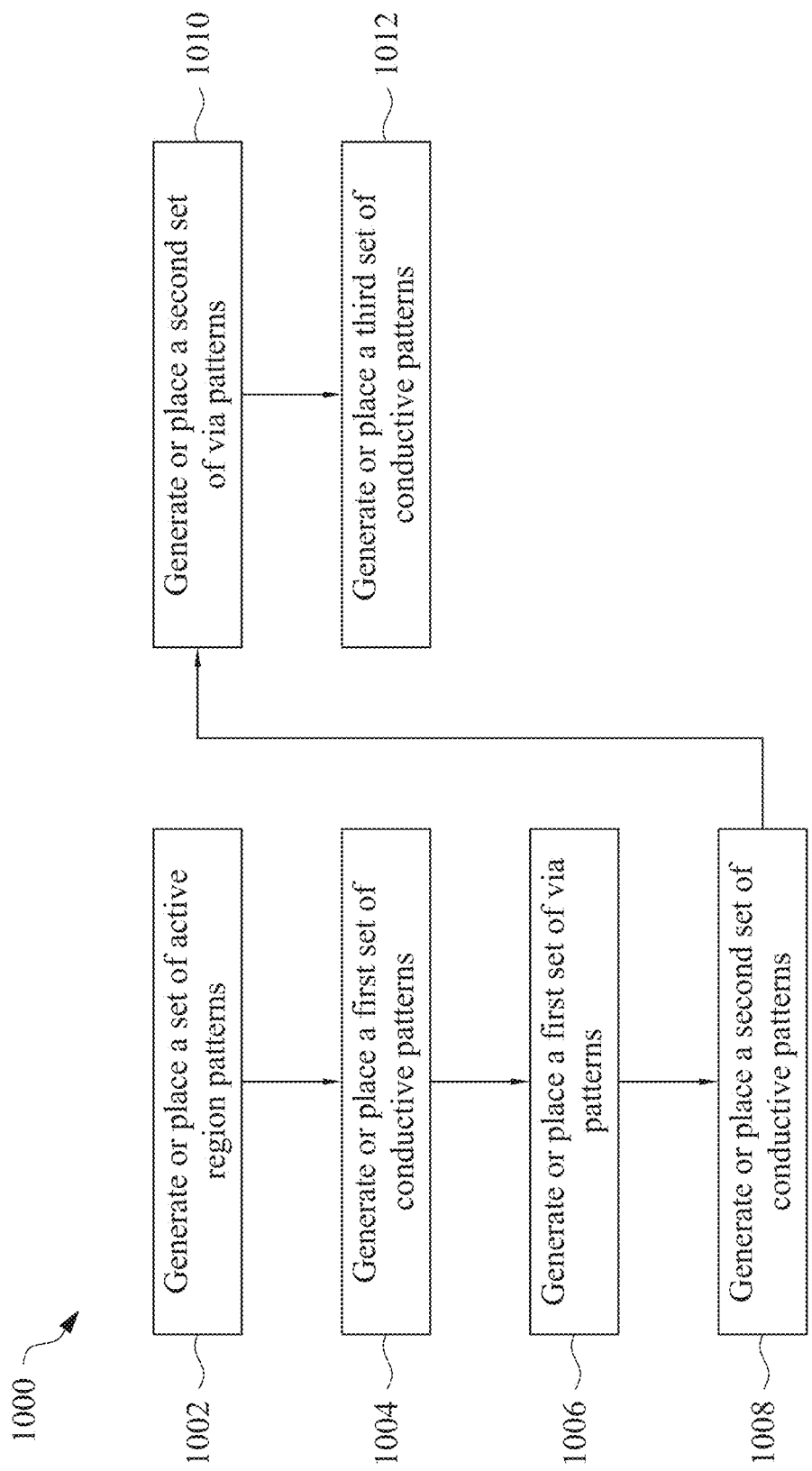
FIG. 10 is a flowchart of a method of generating a layout design of an integrated circuit in accordance with some embodiments.

FIG. 10 is a flowchart of a method 1000 of generating a layout design of an integrated circuit, in accordance with some embodiments. It is understood that additional operations may be performed before, during, and/or after the method 1000 depicted in FIG. 10, and that some other processes may only be briefly described herein. In some embodiments, method 1000 is an embodiment of operation 902 of method 900. In some embodiments, method 1000 is usable to generate one or more layout patterns of at least layout design 100, 300 or 500, or one or more patterns similar to at least integrated circuit 200, 400, 600 or 800.

In some embodiments, method 1000 is usable to generate one or more layout patterns having structural relationships including alignment, lengths and widths, as well as configurations and layers of at least layout design 100, 300 or 500, or one or more patterns similar to at least integrated circuit 200, 400, 600 or 800, and similar detailed description will not be described in FIG. 10, for brevity.

In operation 1002 of method 1000, a set of active region patterns 110 is generated or placed on the layout design.

In operation 1004 of method 1000, a first set of conductive patterns is generated or placed on the layout design.

In some embodiments, the first set of conductive patterns of method 1000 includes at least portions of one or more patterns of set of conductive patterns 104.

In operation 1006 of method 1000, a first set of via patterns is generated or placed on the layout design.

In some embodiments, the first set of via patterns of method 1000 includes at least portions of one or more patterns of set of via patterns 112, 114, 116, 512, 514 or 516.

In operation 1008 of method 1000, a second set of conductive patterns is generated or placed on the layout design.

In some embodiments, the second set of conductive patterns of method 1000 includes at least portions of one or more patterns of set of conductive patterns 102 of FIGS. 1A-1B.

In some embodiments, the second set of conductive patterns of method 1000 includes at least portions of one or more patterns of set of conductive patterns 302, 304, 305 of FIGS. 3A-3B or the set of conductive patterns 502, 504, 505 of FIGS. 5A-5B.

In operation 1010 of method 1000, a second set of via patterns is generated or placed on the layout design.

In some embodiments, the second set of via patterns of method 1000 includes at least portions of one or more patterns of set of via patterns 108. In some embodiments, the second set of via patterns of method 1000 includes at least portions of one or more patterns of set of via patterns 330 or 530.

In operation 1012 of method 1000, a third set of conductive patterns is generated or placed on the layout design.

In some embodiments, the third set of conductive patterns of method 1000 includes at least portions of one or more patterns of set of conductive patterns 106 of FIGS. 1A-1B.

In some embodiments, the third set of conductive patterns of method 1000 includes at least portions of one or more patterns of set of conductive patterns 306 of FIGS. 3A-3B and 5A-5B.

Figure 11:
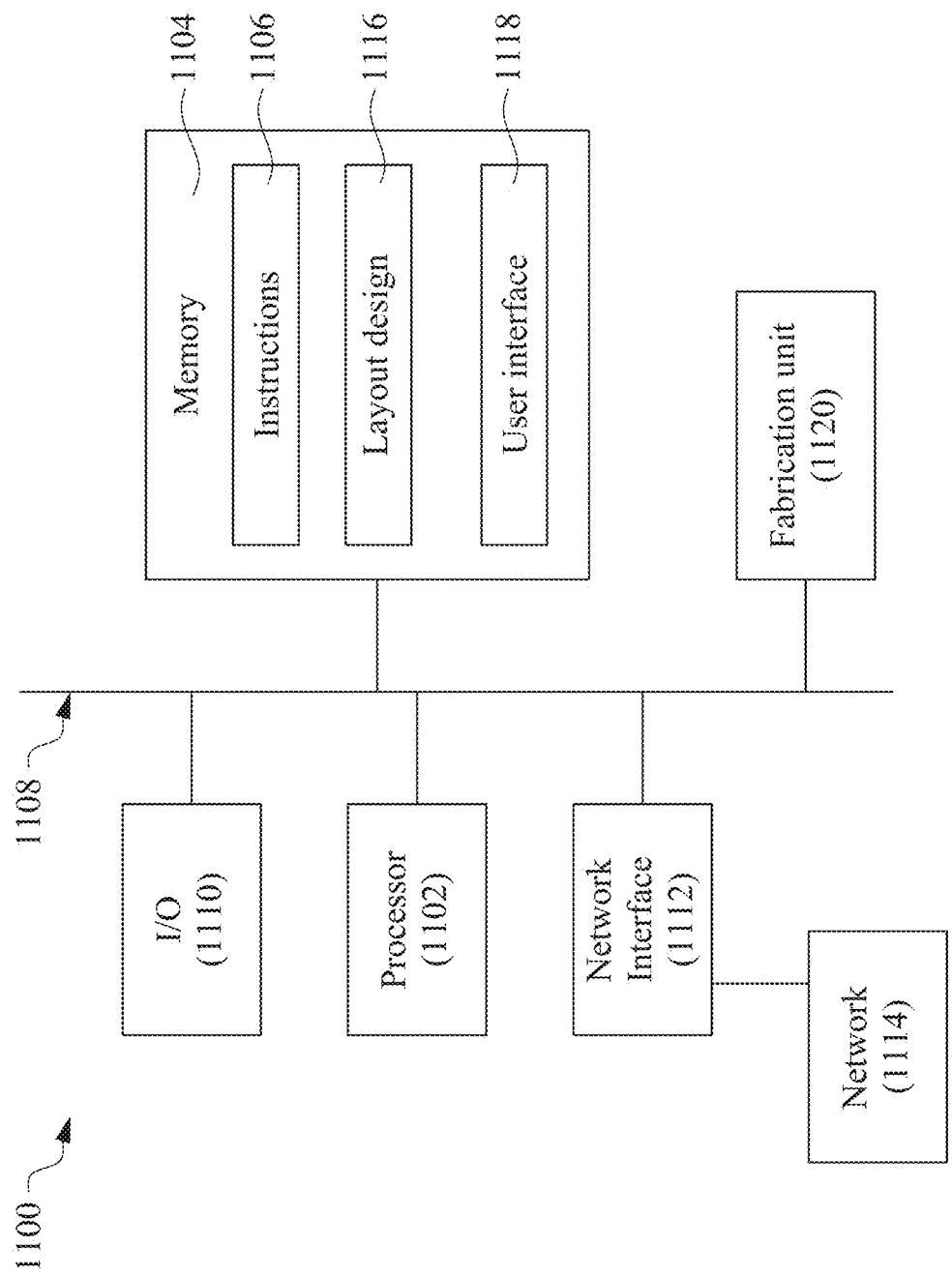
FIG. 11 is a schematic view of a system for designing an IC layout design and manufacturing an IC circuit in accordance with some embodiments.

FIG. 11 is a schematic view of a system 1100 for designing an IC layout design and manufacturing an IC circuit in accordance with some embodiments.

In some embodiments, system 1100 generates or places one or more IC layout designs described herein. System 1100 includes a hardware processor 1102 and a non-transitory, computer readable storage medium 1104 (e.g., memory 1104) encoded with, i.e., storing, the computer program code 1106, i.e., a set of executable instructions 1106. Computer readable storage medium 1104 is configured for interfacing with manufacturing machines for producing the integrated circuit. The processor 1102 is electrically coupled to the computer readable storage medium 1104 via a bus 1108. The processor 1102 is also electrically coupled to an I/O interface 1110 by bus 1108. A network interface 1112 is also electrically connected to the processor 1102 via bus 1108. Network interface 1112 is connected to a network 1114, so that processor 1102 and computer readable storage medium 1104 are capable of connecting to external elements via network 1114. The processor 1102 is configured to execute the computer program code 1106 encoded in the computer readable storage medium 1104 in order to cause system 1100 to be usable for performing a portion or all of the operations as described in method 1000.

In some embodiments, the processor 1102 is a central processing unit (CPU), a multi-processor, a distributed processing system, an application specific integrated circuit (ASIC), and/or a suitable processing unit.

In some embodiments, the computer readable storage medium 1104 is an electronic, magnetic, optical, electromagnetic, infrared, and/or a semiconductor system (or apparatus or device). For example, the computer readable storage medium 1104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1104 includes a compact disk-read only memory (CD-ROM), a compact disk-read/write (CD-R/W), and/or a digital video disc (DVD).

In some embodiments, the storage medium 1104 stores the computer program code 1106 configured to cause system 1100 to perform method 1000. In some embodiments, the storage medium 1104 also stores information needed for performing method 1000 as well as information generated during performing method 1000, such as layout design 1116, user interface 1118 and fabrication unit 1120, and/or a set of executable instructions to perform the operation of method 1000. In some embodiments, layout design 1116 comprises one or more of layout patterns of at least layout design 100, 300 or 500, or features similar to at least integrated circuit 200, 400, 600 or 800.

In some embodiments, the storage medium 1104 stores instructions (e.g., computer program code 1106) for interfacing with manufacturing machines. The instructions (e.g., computer program code 1106) enable processor 1102 to generate manufacturing instructions readable by the manufacturing machines to effectively implement method 1000 during a manufacturing process.

System 1100 includes I/O interface 1110. I/O interface 1110 is coupled to external circuitry. In some embodiments, I/O interface 1110 includes a keyboard, keypad, mouse, trackball, trackpad, and/or cursor direction keys for communicating information and commands to processor 1102.

System 1100 also includes network interface 1112 coupled to the processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interface such as ETHERNET, USB, or IEEE-2094. In some embodiments, method 1000 is implemented in two or more systems 1100, and information such as layout design, and user interface are exchanged between different systems 1100 by network 1114.

System 1100 is configured to receive information related to a layout design through I/O interface 1110 or network interface 1112. The information is transferred to processor 1102 by bus 1108 to determine a layout design for producing at least integrated circuit 200, 400, 600 or 800. The layout design is then stored in computer readable medium 1104 as layout design 1116. System 1100 is configured to receive information related to a user interface through I/O interface 1110 or network interface 1112. The information is stored in computer readable medium 1104 as user interface 1118. System 1100 is configured to receive information related to a fabrication unit 1120 through I/O interface 1110 or network interface 1112. The information is stored in computer readable medium 1104 as fabrication unit 1120. In some embodiments, the fabrication unit 1120 includes fabrication information utilized by system 1100. In some embodiments, the fabrication unit 1120 corresponds to mask fabrication 1234 of FIG. 12.

In some embodiments, method 1000 is implemented as a standalone software application for execution by a processor. In some embodiments, method 1000 is implemented as a software application that is a part of an additional software application. In some embodiments, method 1000 is implemented as a plug-in to a software application. In some embodiments, method 1000 is implemented as a software application that is a portion of an EDA tool. In some embodiments, method 1000 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1000 is implemented by a manufacturing device to manufacture an integrated circuit using a set of masks manufactured based on one or more layout designs generated by system 1100. In some embodiments, system 1100 is a manufacturing device configured to manufacture an integrated circuit using a set of masks manufactured based on one or more layout designs of the present disclosure. In some embodiments, system 1100 of FIG. 11 generates layout designs of an integrated circuit that are smaller than other approaches. In some embodiments, system 1100 of FIG. 11 generates layout designs of integrated circuit structure that occupy less area and provide better routing resources than other approaches.

FIG. 12 is a block diagram of an integrated circuit (IC) manufacturing system 1200, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 (hereinafter "system 1200") includes entities, such as a design house 1220, a mask house 1230, and an IC manufacturer/fabricator ("fab") 1240, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1220, mask house 1230, and IC fab 1240 is owned by a single larger company. In some embodiments, one or more of design house 1220, mask house 1230, and IC fab 1240 coexist in a common facility and use common resources.

Design house (or design team) 1220 generates an IC design layout 1222. IC design layout 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout 1222 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout 1222. The design procedure includes one or more of logic design, physical design or place and route. IC design layout 1222 is presented in one or more data files having information of the geometrical patterns. For example, IC design layout 1222 can be expressed in a GDSII file format or DFII file format.

Mask house 1230 includes data preparation 1232 and mask fabrication 1234. Mask house 1230 uses IC design layout 1222 to manufacture one or more masks 1245 to be used for fabricating the various layers of IC device 1260 according to IC design layout 1222. Mask house 1230 performs mask data preparation 1232, where IC design layout 1222 is translated into a representative data file (RDF). Mask data preparation 1232 provides the RDF to mask fabrication 1234. Mask fabrication 1234 includes a mask writer. A mask writer converts the RDF to an image on a substrate, such as a mask (reticle) 1245 or a semiconductor wafer 1242. The design layout 1222 is manipulated by mask data preparation 1232 to comply with particular characteristics of the mask writer and/or requirements of IC fab 1240. In FIG. 12, mask data preparation 1232 and mask fabrication 1234 are illustrated as separate elements. In some embodiments, mask data preparation 1232 and mask fabrication 1234 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1234, which may undo part of the modifications performed by OPC in order to meet mask creation rules.

In some embodiments, mask data preparation 1232 includes lithography process checking (LPC) that simulates processing that will be implemented by IC fab 1240 to fabricate IC device 1260. LPC simulates this processing based on IC design layout 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1222.

It should be understood that the above description of mask data preparation 1232 has been simplified for the purposes of clarity. In some embodiments, data preparation 1232 includes additional features such as a logic operation (LOP) to modify the IC design layout according to manufacturing rules. Additionally, the processes applied to IC design layout 1222 during data preparation 1232 may be executed in a variety of different orders.

After mask data preparation 1232 and during mask fabrication 1234, a mask 1245 or a group of masks 1245 are fabricated based on the modified IC design layout 1222. In some embodiments, mask fabrication 1234 includes performing one or more lithographic exposures based on IC design layout 1222. In some embodiments, an electron-beam (e-beam) or a mechanism of multiple e-beams is used to form a pattern on a mask (photomask or reticle) 1245 based on the modified IC design layout 1222. The mask 1245 can be formed in various technologies. In some embodiments, the mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1245 includes a transparent substrate (e.g., fused quartz) and an opaque material (e.g., chromium) coated in the opaque regions of the binary mask. In another example, the mask 1245 is formed using a phase shift technology. In the phase shift mask (PSM) version of mask 1245, various features in the pattern formed on the mask are configured to have proper phase difference to enhance the resolution and imaging quality. In various examples, the phase shift mask can be attenuated PSM or alternating PSM. The mask(s) generated by mask fabrication 1234 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1240 is an IC fabrication entity that includes one or more manufacturing facilities for the fabrication of a variety of different IC products. In some embodiments, IC Fab 1240 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1240 includes wafer fabrication tools 1252 (hereinafter "fabrication tools 1252") configured to execute various manufacturing operations on semiconductor wafer 1242 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1240 uses mask(s) 1245 fabricated by mask house 1230 to fabricate IC device 1260. Thus, IC fab 1240 at least indirectly uses IC design layout 1222 to fabricate IC device 1260. In some embodiments, a semiconductor wafer 1242 is fabricated by IC fab 1240 using mask(s) 1245 to form IC device 1260. In some embodiments, the IC fabrication includes performing one or more lithographic exposures based at least indirectly on IC design layout 1222. Semiconductor wafer 1242 includes a silicon substrate or other proper substrate having material layers formed thereon. Semiconductor wafer 1242 further includes one or more of various doped regions, dielectric features, multilevel interconnects, and the like (formed at subsequent manufacturing steps).

System 1200 is shown as having design house 1220, mask house 1230 or IC fab 1240 as separate components or entities. However, it is understood that one or more of design house 1220, mask house 1230 or IC fab 1240 are part of the same component or entity.

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to a method of fabricating an integrated circuit. In some embodiments, the method includes fabricating a set of transistors in a front-side of a substrate, fabricating a first set of vias in a back-side of the substrate opposite from the front-side, depositing a first set of conductive structures on the back-side of the substrate on a first level, depositing a second set of conductive structures on the back-side of the substrate on a second level thereby forming a set of power rails, fabricating a second set of vias in the back-side of the substrate, and depositing a third set of conductive structures on the back-side of the substrate on a third level different from the first level and the second level. In some embodiments, the second level is different from the first level. In some embodiments, the first set of vias is electrically coupled to the set of transistors. In some embodiments, at least a first structure of the first set of conductive structures is electrically coupled to a first via of the first set of vias. In some embodiments, the second set of vias is electrically coupled to the third set of conductive structures and the first set of conductive structures.

Another aspect of this description relates to a method of fabricating an integrated circuit. In some embodiments, the method includes fabricating a set of transistors in a front-side of a substrate, the set of transistors including a first set of active regions and a second set of active regions; depositing a first conductive material on a back-side of the substrate on a first level thereby forming a first set of conductive structures on a first inner metal level, the back-side of the substrate being opposite from the front-side; fabricating a first set of vias in the back-side of the substrate, the first set of vias electrically coupling the set of transistors and the first set of conductive structures together; depositing a first hard mask over a first via of the first set of vias, the first via being electrically isolated from the first via; depositing a second conductive material on the back-side of the substrate on a second level thereby forming a second set of conductive structures, the second set of conductive structures including a first power rail, a second power rail and a third power rail, the second level being different from the first level, and being on the first hard mask; fabricating a second set of vias in the back-side of the substrate on the first set of conductive structures; and depositing a third conductive material on the back-side of the substrate on a third level thereby forming a third set of conductive structures, the third level being different from the first level and the second level, the second set of vias electrically coupling the third set of conductive structures and the first set of conductive structures together.

Still another aspect of this description relates to a method of fabricating an integrated circuit. In some embodiments, the method includes fabricating a set of transistors on a first level of a front-side of a substrate, the set of transistors including a first active region, a second active region and a third active region, depositing a first conductive material on a back-side of the substrate on a second level thereby forming a first set of conductive structures on a first metal layer, the back-side of the substrate being opposite from the front-side, the first set of conductive structures including a first conductor overlapping the first active region, the second active region and the third active region, fabricating a first set of vias in the back-side of the substrate, the first set of vias electrically coupled to the set of transistors, a first via of the first set of vias coupling the first conductive structure and the first active region together, fabricating a second set of vias in the back-side of the substrate on the first set of conductive structures, and depositing a second conductive material on the back-side of the substrate on a third level thereby forming a first power rail, a second power rail and a second conductor, the third level being different from the first level, the first power rail overlapping the first active region, the second power rail overlapping the second active region, and the second conductor overlapping the second active region, the second set of vias electrically coupling the first power rail, the second power rail, and the second conductor to the first set of conductive structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit, the method comprising:
   fabricating a set of transistors in a front-side of a substrate;
   fabricating a first set of vias in a back-side of the substrate opposite from the front-side, the first set of vias being electrically coupled to the set of transistors;
   depositing a first set of conductive structures on the back-side of the substrate on a first level, at least a first structure of the first set of conductive structures being electrically coupled to a first via of the first set of vias;
   depositing a second set of conductive structures on the back-side of the substrate on a second level thereby forming a set of power rails, the second level being different from the first level;
   fabricating a second set of vias in the back-side of the substrate; and
   depositing a third set of conductive structures on the back-side of the substrate on a third level different from the first level and the second level, the second set of vias being electrically coupled to the third set of conductive structures and the first set of conductive structures.

2. The method of claim 1, wherein depositing the third set of conductive structures on the back-side of the substrate comprises:
   electrically coupling the third set of conductive structures to the first set of conductive structures by the second set of vias.

3. The method of claim 1, further comprising:
   performing thinning on the back-side of the substrate opposite from the front-side.

4. The method of claim 1, wherein the depositing the first set of conductive structures on the back-side of the substrate on the first level comprises:
   electrically isolating a first active region and a second active region of the set of transistors by depositing dielectric materials on the first set of transistors from the back-side of the substrate.

5. The method of claim 4, wherein the depositing the first set of conductive structures on the back-side of the substrate on the first level further comprises:
   forming dummy contact structures at the back-side of the substrate, the dummy contact structures contacting source/drain regions of the first and second active regions; and
   forming hard masks to thereby cover the dummy contact structures.

6. The method of claim 5, wherein the depositing the first set of conductive structures on the back-side of the substrate on the first level further comprises:
   depositing a conformal isolation material at the back-side of the substrate on exposed surfaces of the hard masks and sidewalls of the dummy contact structures.

7. The method of claim 6, wherein the depositing the first set of conductive structures on the back-side of the substrate on the first level further comprises:
   depositing isolation material on the conformal isolation material.

8. The method of claim 7, wherein the depositing the isolation material on the conformal isolation material comprises:
   forming the isolation material in areas between the dummy contact structures, the isolation material being recessed from a top surface of the dummy contact structures.

9. The method of claim 8, wherein the depositing the first set of conductive structures on the back-side of the substrate on the first level further comprises:
   removing a first portion of the conformal isolation material at a first portion of the sidewalls of the dummy contact structures.

10. The method of claim 9, wherein the depositing the first set of conductive structures on the back-side of the substrate on the first level further comprises:
    depositing the first set of conductive structures on a first metal layer overlying the isolation material.

11. The method of claim 10, wherein the fabricating the first set of vias in the back-side of the substrate comprises:
    removing the hard masks and the dummy contact structures to thereby expose a top surface of a first source/drain region of the first active region;
    depositing a conductive material over the top surface of the first source/drain region to thereby form a second via of the first set of vias, the second via electrically connects a first conductor in a backside routing track and the first source/drain region; and
    depositing a set of hard masks over the second via.

12. A method of fabricating an integrated circuit, the method comprising:
    fabricating a set of transistors in a front-side of a substrate, the set of transistors including a first set of active regions and a second set of active regions;

depositing a first conductive material on a back-side of the substrate on a first level thereby forming a first set of conductive structures on a first inner metal level, the back-side of the substrate being opposite from the front-side;

fabricating a first set of vias in the back-side of the substrate, the first set of vias electrically coupling the set of transistors and the first set of conductive structures together;

depositing a first hard mask over a first via of the first set of vias, the first via being electrically isolated from the first via;

depositing a second conductive material on the back-side of the substrate on a second level thereby forming a second set of conductive structures, the second set of conductive structures including a first power rail, a second power rail and a third power rail, the second level being different from the first level, and being on the first hard mask;

fabricating a second set of vias in the back-side of the substrate on the first set of conductive structures; and depositing a third conductive material on the back-side of the substrate on a third level thereby forming a third set of conductive structures, the third level being different from the first level and the second level, the second set of vias electrically coupling the third set of conductive structures and the first set of conductive structures together.

13. The method of claim 12, wherein depositing the third conductive material on the back-side of the substrate comprises:

electrically coupling the third set of conductive structures to the first set of conductive structures by the second set of vias.

14. The method of claim 12, further comprising:

performing thinning on the back-side of the substrate opposite from the front-side.

15. The method of claim 12, wherein the second set of vias includes a second via.

16. The method of claim 12, wherein the first via has a first height in a first direction; and
the second via has a second height in the first direction, the second height being less than the first height.

17. The method of claim 12, wherein the first power rail extends in a first direction and has a first width in a second direction different from the first direction;

the second power rail extends in the first direction, and has a second width in the second direction; and the third power rail extends in the first direction, and has a third width in the second direction.

18. The method of claim 17, wherein the second width is greater than at least the first width or the third width.

19. A method of fabricating an integrated circuit, the method comprising:

fabricating a set of transistors on a first level of a front-side of a substrate, the set of transistors including a first active region, a second active region and a third active region;

depositing a first conductive material on a back-side of the substrate on a second level thereby forming a first set of conductive structures on a first metal layer, the back-side of the substrate being opposite from the front-side, the first set of conductive structures including a first conductor overlapping the first active region, the second active region and the third active region;

fabricating a first set of vias in the back-side of the substrate, the first set of vias electrically coupled to the set of transistors, a first via of the first set of vias coupling the first conductor and the first active region together;

fabricating a second set of vias in the back-side of the substrate on the first set of conductive structures; and depositing a second conductive material on the back-side of the substrate on a third level thereby forming a first power rail, a second power rail and a second conductor, the third level being different from the first level, the first power rail overlapping the first active region, the second power rail overlapping the second active region, and the second conductor overlapping the second active region, the second set of vias electrically coupling the first power rail, the second power rail, and the second conductor to the first set of conductive structures.

20. The method of claim 19, further comprising:

performing thinning on the back-side of the substrate opposite from the front-side.

* * * * *